United States Patent
Ohashi et al.

(10) Patent No.: US 6,694,606 B1
(45) Date of Patent: Feb. 24, 2004

(54) ELECTRIC-COMPONENT SUPPLYING APPARATUS AND CIRCUIT-BOARD ASSEMBLING METHOD FOR FEEDING A PLURALITY OF ELECTRIC-COMPONENT TAPES

(75) Inventors: Hiroyasu Ohashi, Toyota (JP); Yasuo Muto, Chiryu (JP); Koichi Asai, Nagoya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/334,931

(22) Filed: Jun. 17, 1999

(30) Foreign Application Priority Data

Jun. 24, 1998 (JP) .......................... 10-177896

(51) Int. Cl.[7] .............................. H05K 3/30
(52) U.S. Cl. ..................... 29/740; 29/739; 29/741; 29/832; 226/128; 242/558; 242/566; 242/564.4
(58) Field of Search ...................... 29/832, 739, 740, 29/741; 226/128; 242/558, 566, 564.4

(56) References Cited

U.S. PATENT DOCUMENTS

| 4,610,083 A | 9/1986 | Campisi et al. |
|---|---|---|
| 5,167,161 A | 12/1992 | Okamoto et al. |
| 5,680,936 A | * 10/1997 | Beers .......................... 209/564 |
| 5,832,595 A | * 11/1998 | Maruyama et al. ........... 29/829 |
| 6,157,870 A | 12/2000 | Gfeller et al. |

FOREIGN PATENT DOCUMENTS

| EP | 0 613 339 A1 | 8/1994 |
|---|---|---|
| EP | 0 859 543 A2 | 8/1998 |
| EP | 0 893 948 A2 | 1/1999 |

OTHER PUBLICATIONS

Patent Abstracts of Japan; Publication No. 01–104551, Published Apr. 21, 1989.

Lexikon Sensoren in Fertigung and Betrieb v. Stefan Hesse, 1996 (4 pages including pp. 262–263).

* cited by examiner

*Primary Examiner*—Richard Chang
(74) *Attorney, Agent, or Firm*—Oliff & Berridge PLC

(57) ABSTRACT

An apparatus for feeding a plurality of electric-component tapes each of which includes a carrier tape and holds a plurality of electric components in a lengthwise direction of the carrier tape, and supplying, from the each electric-component tape, the electric components, one by one, to an object device, the apparatus including a feeding device which feeds a first electric-component tape in a lengthwise direction thereof, and a connection-portion detecting device which detects a connection portion where a terminal end portion of the first electric-component tape being fed by the feeding device is connected to an initial end portion of a second electric-component tape.

26 Claims, 29 Drawing Sheets

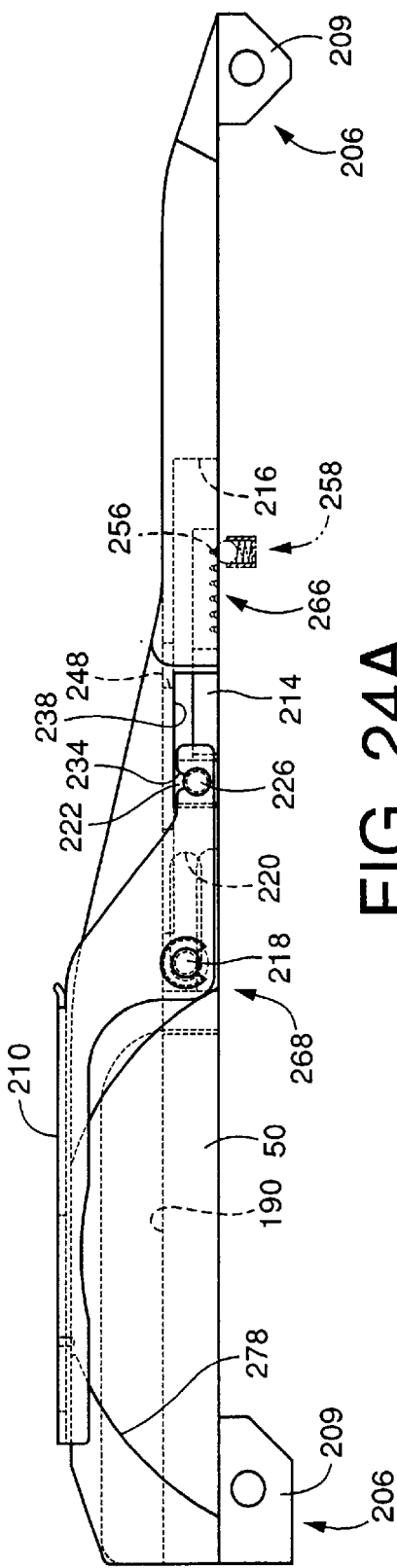
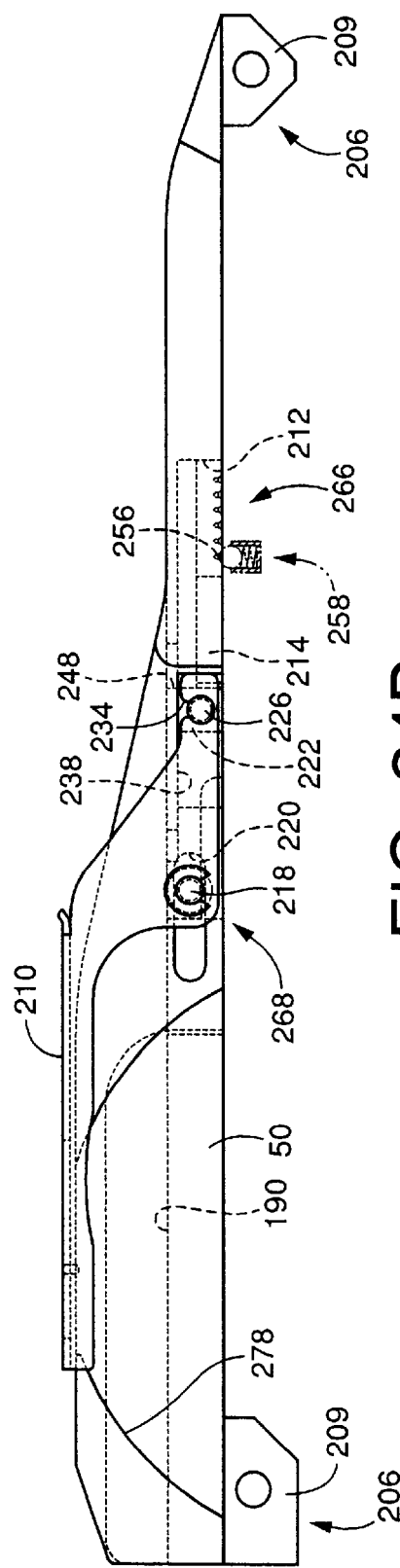
FIG. 24A
FIG. 24B

ELECTRIC-COMPONENT SUPPLYING APPARATUS AND CIRCUIT-BOARD ASSEMBLING METHOD FOR FEEDING A PLURALITY OF ELECTRIC-COMPONENT TAPES

BACKGROUND OF THE INVENTION

1. Field of the Invention

The present invention relates to an apparatus for supplying electric components (i.e., circuit components used for providing electric circuits (e.g., electronic circuits)), and a method of assembling an electric circuit on a print-wired board, i.e., a circuit board, and in particular to the art of improving the supplying of electric components from an electric-component tape holding the electric components.

2. Related Art Statement

There is known an electric-component ("EC") tape which includes a carrier tape and which holds a plurality of electric components ("ECs") at a predetermined pitch in a lengthwise direction of the carrier tape, and there is known an EC supplying device which supplies ECs from an EC tape holding the ECs. The EC supplying device includes a feeding device which feeds the EC tape in its lengthwise direction so that the ECs are supplied, one by one, to an object device. If the ECs are supplied one after another and the EC tape is consumed near to the end, an operator connects an initial end portion of another EC tape to a terminal end portion of the current EC tape now supplying the ECs, before the ECs of the current tape are completely consumed. Thus, the ECs of the new tape are successively supplied after the ECs of the preceding tape, without interruption, as if the ECs were supplied limitlessly.

SUMMARY OF THE INVENTION

It is therefore an object of the present invention to provide an electric-component supplying apparatus, an electric-component supplying system, and a circuit-board assembling method each of which detects a connection portion where two electric-component tapes are connected to each other and which can utilize the detected connection portion.

The present invention provides an electric-component supplying apparatus, an electric-component supplying system, and a circuit-board assembling method which have one or more of the technical features that are described below in respective paragraphs given parenthesized sequential numbers (1) to (27). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided an apparatus for feeding a plurality of electric-component tapes each of which includes a carrier tape and holds a plurality of electric components in a lengthwise direction of the carrier tape, and supplying, from the each electric-component tape, the electric components, one by one, to an object device, the apparatus comprising: a feeding device which feeds a first electric-component tape in a lengthwise direction thereof; and a connection-portion detecting device which detects a connection portion where a terminal end portion of the first electric-component tape being fed by the feeding device is connected to an initial end portion of a second electric-component tape. The EC tape may be an embossed-carrier-type one, a punched-carrier-tape one, or a lead-wire-terminal-taped-type one. The embossed-carrier-type EC tape includes (a) a carrier tape which includes a pair of widthwise opposite end portions each extending in a lengthwise direction thereof, and a plurality of embossed portions each projecting downward from between the two end portions and each accommodating one EC, and (b) a top cover tape which is adhered to the carrier tape to close respective upper openings of the embossed portions. The punched-carrier-tape EC tape includes (c) a carrier tape which includes (c1) a base tape which is formed of, e.g., paper or synthetic resin and which has a plurality of through-holes formed through the thickness thereof and (c2) a bottom cover tape which closes respective lower openings of the through-holes to provide a plurality of EC accommodating pockets each accommodating one EC, and (d) a top cover tape which is adhered to the carrier tape to close respective upper openings of the through-holes or the EC accommodating pockets. The lead-wire-terminal-taped-type EC tape may be one which includes a carrier tape which is provided by a tacky tape and which holds a plurality of electric components whose respective lead-wire terminals are adhered thereto, or one which includes a carrier tape which includes a tacky tape and a support sheet and which holds a plurality of electric components whose respective lead-wire terminals are adhered thereto. The second EC tape may be a new one from which no ECs have not been taken, or a used one from which one or more ECs have been taken. The first and second EC tapes to be connected to each other must at least be of a same type, e.g., both of the embossed-carrier type, the punched-carrier tape, or the lead-wire-terminal-taped type, and must hold a same sort of ECs. The object device to which the present EC supplying apparatus supplies the ECs may be an EC mounting system as an element of a circuit-board ("CB") assembling system, or an EC transferring device which transfers ECs from the EC supplying apparatus to a third device. However, the EC mounting system can be said as a sort of EC transferring device, because it transfers ECs from the EC supplying apparatus to respective EC-mount places on a print-wired board ("PWB"). The present EC supplying apparatus detects the connection portion of the two EC tapes connected to each other. Accordingly, for example, the present apparatus can judge whether the second EC tape actually connected to the first EC tape is a correct sort of EC tape to be connected to the first tape, and can monitor the amount of ECs remaining on the first EC tape, or the first and second EC tapes connected to each other.

(2) According to a second feature of the present invention that includes the first feature (1), the supplying apparatus further comprises a frame including a guide which guides the movement of each of the first and second electric-component tapes in the lengthwise direction thereof, and the connection-portion detecting device is supported by the frame in vicinity of a path of movement of the each electric-component tape. The connection-portion detecting device may be provided on the path of movement of each EC tape, or at a location somewhat distant from the path. In the case where the connection-portion detecting device is provided at a location largely distant from the path defined by the guide, each EC tape must take a circuitous route for the connection portion to be detected by the detecting device. In contrast, in the case where the connection-portion detecting device is provided in the vicinity of the path, the detecting device can directly detect the connection portion while each EC tape is moved on the path defined by the guide. In the latter case, a smaller space is needed for the movement of the EC tape, which contributes to reducing the overall size of the present EC supplying apparatus.

(3) According to a third feature of the present invention that includes the first or second feature (1) or (2), the connection-portion detecting device comprises a metal detector which detects a metallic connection member which connects the terminal end portion of the first electric-component tape and the initial end portion of the second electric-component tape to each other. The metallic connection member is formed of, e.g., steel, copper, brass, SUS, or aluminum. The connection member cooperates with the the terminal and initial end portions of the two EC tapes to provide the connection portion. The metal detector detects the connection member and thereby detects the connection portion.

(4) According to a fourth feature of the present invention that includes the third feature (3), the metal detector comprises a pair of electrodes which are distant from each other on a locus of movement of the metallic connection member when the two electric-component tapes connected to each other are fed in the lengthwise direction thereof, and which are electrically connected to each other by the metallic connection member; and a connection detecting circuit which electrically detects that the two electrodes are connected to each other by the metallic connection member. If the supplying of the ECs progresses after the connection of the two EC tapes, the metallic connection member eventually reaches the pair of electrodes, moves along the same, and contacts both of the same, thereby electrically connecting the same to each other. The connection detecting circuit produces a first signal when the two electrodes are electrically connected, and a second signal different from the first signal, when the two electrodes are not connected. Thus, the production of the first signal from the connection detecting circuit indicates that the metallic connection member is moving on the electrodes. In this way, the connection portion can be detected.

(5) According to a fifth feature of the present invention that includes the fourth feature (4), the connection-portion detecting device further comprises a pressing member which presses the metallic connection member against the two electrodes. Since the metallic connection member is positively pressed against the pair of electrodes by the pressing member, the two electrodes can be more reliably connected to each other by the metallic connection member. Thus, the metallic connection member or the connection portion can be more reliably detected.

(6) According to a sixth feature of the present invention that includes the fifth feature (5), the pressing member comprises a pressing roller which is movable toward, and away from, the metallic connection member, and which is rotatable about an axis line intersecting a direction of feeding of the two electric-component tapes connected to each other. Since the pressing roller presses the metallic connection member against the pair of electrodes while being rotated by the movement of the EC tape, the EC tape is subjected to only a low resistance to its movement.

(7) According to a seventh feature of the present invention that includes the fifth or sixth feature (5) or (6), the connection-portion detecting device further comprises a biasing device which biases the pressing member in a direction in which the pressing member is moved toward the two electrodes. The biasing device may be the self weight of the pressing member, or the sum of the self weight of the pressing member and that of a support member which supports the pressing member. Alternatively, the biasing device may be provided by a spring member as a sort of elastic member. The employment of the biasing device further improves the reliability with which the pair of electrodes are connected to each other.

(8) According to an eighth feature of the present invention that includes the third feature (3), the metal detector comprises a non-contact sensor which detects the metallic connection member, without contacting the connection member. Since the non-contact sensor does not contact the connection member, the sensor is prevented from wearing and accordingly enjoys a long life expectancy.

(9) According to a ninth feature of the present invention that includes the eighth feature (8), the non-contact sensor comprises an induction proximity sensor. The induction proximity sensor may be a high-frequency proximity sensor. However, it is possible to use a different sort of non-contact sensor, such as a capacitance proximity sensor.

(10) According to a tenth feature of the present invention that includes the first or second feature (1) or (2), the connection-portion detecting device comprises an optical detector which detects the connection portion of the two electric-component tapes, based on a difference between an optical characteristic of the connection portion and an optical characteristic of respective remaining portions of the two tapes. The optical characteristic may be a color, a reflection factor, or a transparency. If there is a detectable difference between the optical characteristic of the connection portion and that of the respective remaining portions of the two EC tapes, the connection portion can be detected by the optical detector which can detect the difference.

(11) According to an eleventh feature of the present invention that includes the tenth feature (10), the optical detector comprises a light emitter which emits a light toward a portion of the connected electric-component tapes; a light receiver which receives the light which has been emitted by the light emitter and optically affected by the portion of the connected electric-component tapes; and a judging device which judges, based on a change of the light received by the light receiver from the light emitted by the light emitter, whether the portion of the connected electric-component tapes is the connection portion thereof. The light receiver may be one which receives the light which has been reflected by each EC tape, or one which receives the light which has been transmitted by each EC tape. The affection to the light by each EC tape may be the change of amount of the reflected or transmitted light, or the change of frequency component of the reflected or transmitted light. The latter optical affection may be detected by, e.g., a color sensor. In the case where the light receiver is one which receives the light reflected by each EC tape, the respective colors or reflection factors of each carrier tape and the connection member are so predetermined as to produce a distinguishable difference between the respective amounts or frequency components of the respective lights reflected from the each carrier tape and the connection member. Each carrier tape, each top cover tape, and the connection member may be formed of any material, and the connection member may be formed of metal, or may be provided by a connection tape formed of a synthetic resin. The connection tape has a tacky material or an adhesive material on one major surface thereof, and may be adhered to the respective carrier tapes of the two EC tapes. In the case where each carrier tape is formed of a transparent synthetic resin, the connection member may be provided by a connection tape formed of an opaque synthetic resin, or a metallic connection member. In this case, the connection member significantly changes the amount of the light transmitted by the two EC tapes connected to each other. Therefore, a transmission-type photoelectric sensor can detect the connection portion of the connected EC tapes. In the case where each carrier tape and the connection tape have different colors, the connection portion can be detected based on a difference between the respective frequency components of the respective lights transmitted by the each carrier tape and the connection tape. All of the above explanation is true with each of the embossed-carrier-type EC tape, the punched-carrier-type EC tape, and the lead-wire-terminal-taped-type EC tape. However, it is preferred that how to combine the connection member or tape and the light emitter and receivers and where the connection member or tape is placed relative to the carrier tapes to be connected be so predetermined as not to be affected by the ECs held by the carrier tapes. Even if the light received by the light receiver may have been affected by the EC or ECs, it is possible to remove that affection because the ECs are regularly held at the predetermined pitch by the carrier tapes. However, to remove the affection is cumbersome, which may lead to lowering the reliability of detection of the connection portion.

(12) According to a twelfth feature of the present invention that includes any one of the first to eleventh features (1) to (11), the supplying apparatus further comprises a tape-connection-relating-information producing device which produces first information when the second electric-component tape is appropriate, and second information when the second tape is not appropriate. The second EC tape is not appropriate, e.g., when the sort of the ECs held by the second EC tape is different from that of the ECs held by the first EC tape being fed by the feeding device, or when the type (the embossed-carrier type, the punched-carrier type, or the lead-wire-terminal-taped type) the second tape is different from that of the first tape. The first or second information may be utilized in various manners. For example, in the case where the second information is produced, it may be informed to an operator so that the operator can avoid the supplying of the ECs held by the inappropriate EC tape.

(13) According to a thirteenth feature of the present invention that includes the twelfth feature (12), the tape-connection-relating-information producing device comprises an input device which inputs identification information identifying the second electric-component tape; and an inappropriate-tape-connection-information producing device which is connected to the input device and which compares, in response to the detection of the connection portion by the connection-portion detecting device, the identification information input by the input device, with reference identification information and, when the input identification information is not identical with the reference identification information, producing, as the second information, inappropriate-tape-connection information indicating that the input identification information is not identical with the reference identification information. Identification information identifying an EC tape may include the identification number of the ECs held by the EC tape; the dimensions of each EC; the total number of the ECs; the production date of the ECs; the electric characteristic values of the ECs; the width of each EC; the pitch at which the ECs are held by the EC tape; the type of the EC tape; and the width of the EC tape. The Identification information may be represented by a bar code. The input device may be one which automatically inputs the identification information; or one which is operable by an operator for inputting the identification information. The former input device may be provided by a bar-code reader which automatically reads in a bar code representing the identification information; and the latter input device may be provided by a bar-code reader which is manually operable by the operator for reading in the bar code. Alternatively, the latter input device may be provided by, e.g., a keyboard which is manually operable by the operator for inputting the identification information. The input identification information identifies the second EC tape actually connected to the first EC tape being fed by the feeding device for supplying the ECs. The reference identification information identifies another EC tape which should be connected to the first EC tape being fed by the feeding device for supplying the ECs. The reference identification information may be input by an operator through an appropriate input device such as a keyboard, or otherwise may be given to the EC supplying apparatus from a controller or a computer different from a controller of the supplying apparatus. If the two pieces of identification information are compared with each other and judged as being identical with each other means, then it is judged that the second EC tape is an EC tape which should be connected to the first EC tape. However, if not, the second tape is not an appropriate tape. In the latter case, the inappropriate-tape-connection information is produced, and is utilized to treat the inappropriate tape connection, e.g., stop the operation of the CB assembling system. That is, the present EC supplying apparatus can treat, based on the detection of the connection portion, the inappropriate tape connection.

(14) According to a fourteenth feature of the present invention that includes the thirteenth feature (13), the tape-connection-relating-information producing device further comprises an inappropriate-tape-connection informing device which informs, based the inappropriate-tape-connection information, an operator of at least a fact that the second electric-component tape is not appropriate. The informing device may inform the operator of the fact, in various manners, e.g., by generating an alarm sound, lighting or flashing a lamp, or displaying an alarm message on an image screen.

(15) According to a fifteenth feature of the present invention that includes any one of the first to fourteenth features (1) to (14), the supply apparatus further comprises an input device which inputs identification information identifying the second electric-component tape; and an input judging device which is connected to the input device and which judges, in response to the detection of the connection portion by the connection-portion detecting device, whether the identification information has been input by the input device. In the case where the input device is adapted to automatically input identification information when the second EC tape is connected to the first EC tape, there is little possibility that the input device should fail to input the identification information. However, in the case where an operator inputs identification information through the input device such as a bar-code reader or a keyboard, the operator may fail to input the identification information. In the latter case, even if an inappropriate EC tape may be connected to the first tape, no inappropriate-tape-connection information is produced, so that ECs may be supplied from the inappropriate EC tape. In contrast, in the present EC supplying apparatus, the input judging device judges, in response to the detection of the connection portion, whether the identification information has been input by the input device. In this case, the present EC supplying apparatus may inform the operator of the negative judgment that no identification information has been input, so that the operator can stop the feeding of the inappropriate EC tape or the supplying of inappropriate sort of ECs from that EC tape.

(16) According to a sixteenth feature of the present invention that includes the fifteenth feature (15), the supplying apparatus further comprises a non-input informing device which informs, when the input judging device judges that the identification information has not been input by the input device, an operator of a fact that the identification information has not been input by the input device. The non-input informing device may inform the operator of the fact, in various manners, e.g., by generating an alarm sound, lighting or flashing a lamp, or displaying an alarm message on an image screen.

(17) According to a seventeenth feature of the present invention that includes any one of the first to sixteenth features (1) to (16), the supplying apparatus further comprises an input device which inputs identification information identifying the second electric-component tape; and a connection-relating-input judging device which is connected to the input device and which judges whether the identification information has been input by the input device in relation with the connection of the first and second electric-component tapes to each other. For example, the identification information on which the input judging device according to the fifteenth feature (15) makes a judgment needs to be the identification information input in relation with the connection of the second EC tape to the first EC tape currently supplying the ECs. If, after the mounting of ECs on a PWB is started, identification information is input at a time different than when two EC tapes are connected to each other, or if the identification information input at the time of the prior connection of two tapes remains, the identification information should not be used for the judgment of the above input judging device. Hence, the present EC supplying apparatus employs the connection-relating-input judging device which judges whether the identification information has been input in relation with the connection of the second EC tape to the first EC tape currently supplying the ECs. The connection-relating-input judging device may be one which judges whether the identification information has been input within a reference time period. The reference time period may be somewhat longer than an average time period between the connection of two EC tapes and the detection of the connection portion of the two EC tapes. If the connection portion is detected within the reference time period after the inputting of identification information, a positive judgment is made. The reference time period may be determined based on a time needed for the connection portion to be fed from a tape-connect position where two tapes are connected to each other, to a connection-portion-detect position where the connection portion of the two tapes is detected. This time depends on the distance between the tape-connect position and the connection-portion-detect position (i.e, the length of the first EC tape between the connection portion and the connection-portion detecting device when the two tapes are connected to each other); the pitch at which the ECs are held by each EC tape; and the rate at which the EC supplying apparatus supplies the ECs (e.g., whether the supplying apparatus continuously or continually supplies the ECs). A plurality of reference time periods may be determined exclusively for a plurality of sorts of EC tapes, respectively, or a single reference time period may be determined commonly for a plurality of sorts of EC tapes. In the latter case, the single reference time period may be determined based on the longest one of the respective times needed for the respective connection portions of the different sorts of EC tapes to be fed from the tape-connect position to the connection-portion-detect position. The connection-relating-input judging device may be one which judges whether the identification information has been input within a time period needed for supplying a reference number of ECs. The reference number may be somewhat more than an average number of the ECs which are supplied between the connection of two EC tapes and the detection of the connection portion of the two tapes. In the latter case, the judging device makes a positive judgment if the number of the ECs supplied after the inputting of the identification information and before the detection of the connection portion of two tapes is smaller than the reference number. The reference number may be determined based on the distance between the tape-connect position and the connection-portion-detect position and the pitch at which the ECs are held by each EC tape. The connection-relating-input judging device may be omitted, e.g., in the case where no identification information is input except when two EC tapes are connected to each other, or in the case where even if identification information may be input at a time other than when two EC tapes are connected to each other, the input identification information is deleted without fail after being utilized. The connection-relating-input judging device may be employed in the EC supplying apparatus according to the thirteenth feature (13). In the last case, the inappropriate-tape-connection-information producing device is prevented from comparing the reference identification information with the identification information which has not been input in relation with the connection of two EC tapes, and producing the inappropriate-tape-connection information though the tape connection is appropriate, or vice versa.

(18) According to an eighteenth feature of the present invention that includes any one of the thirteenth to seventeenth features (13) to (17), the input device comprises a bar-code reader which reads in a bar code as the identification information identifying the second electric-component tape. Information relating to the second EC tape can be easily and quickly input by utilizing the bar code and the bar-code reader. The more the identification information is, the more advantageous the bar code and the bar-code reader are. The bar code may be automatically read in by the bar-code reader, or may be read in by an operator through the bar-code reader operated by the operator.

(19) According to a nineteenth feature of the present invention that includes any one of the first to eighteenth features (1) to (18), the supplying apparatus further comprises an electric-component counter which counts a number of electric components supplied by the apparatus after the connection-portion detecting device detects the connection portion. The EC counter can be used to control the supplying of the ECs. For example, in the case where the present EC supplying apparatus includes an initial-amount obtaining device which obtains, as an initial amount, an initial number of ECs which are initially present on the second EC tape newly connected to the first EC tape; and a subtracting device which subtracts the number counted by the EC counter, from the initial number obtained by the initial-amount obtaining device, the supplying apparatus can obtain the amount of the ECs which currently remain on the second EC tape. In the case where the second EC tape is a new one, the initial-amount obtaining device may obtain the initial amount of the ECs held by the new tape, from the identification information (e.g., bar code) input by the input device (e.g., bar-code reader). In the case where the second EC tape is a used one, the initial-amount obtaining device may obtain the initial amount of the ECs held by the used tape, from information other than the identification information identifying the used tape, for example, from the information that is input by the operator through a keyboard including numeric keys. The EC counter may be set at an initial number based on the initial amount obtained by the initial-amount obtaining device, and the initial number may be decreased by one by a subtracting device each time one EC is supplied. In the latter case, the current count number of the EC counter indicates the current amount of the ECs remaining on the second EC tape. Thus, the EC counter is used as a decreasing counter (or a remaining-amount counter). In the case where the EC supplying apparatus further includes a subtracting device which subtracts the remaining amount from the initial amount, the supplying apparatus can obtain the number of the ECs which have been supplied from the second EC tape. In the last case, the subtracting device also functions as a device which obtains the number of the supplied ECs.

(20) According to a twentieth feature of the present invention that includes any one of the first to eighteenth features (1) to (18), the supplying apparatus further comprises a counter which changes a count number by one each time one of the electric components is supplied by the apparatus; an initial-amount obtaining device which obtains, as an initial amount, an initial number of the electric components which are initially present on the second electric-component tape connected to the first electric-component tape; and a remaining-amount obtaining device which cooperates with the counter, the initial-amount obtaining device, and the connection-portion detecting device to obtain, as a remaining amount, a current number of the electric components which are currently present on the second electric-component tape. The counter may be an increasing counter which increases its count number, or a decreasing counter which decreases its count number. In the case where the counter is the increasing counter, the remaining-amount obtaining device sets the increasing counter to its initial count number, in response to the detection of the connection portion by the connection-portion detecting device, and obtains the remaining amount, as needed, by subtracting the current count number of the increasing counter, from the initial amount. The initial count number of the increasing counter may be zero in the case where the required accuracy of the remaining amount obtained by the remaining-amount obtaining device is low. However, in the case where the required accuracy is high, the increasing counter must be set to an initial count number equal to a number obtained by subtracting, from zero, the number of the ECs remaining between an EC-supply position of the EC supplying apparatus and the connection portion at the time of detection of the connection portion. Since, usually, the EC-supply position is distant from the connection-portion-detect position, the first EC tape being fed by the feeding device for supplying the ECs still has some remaining ECs between the two positions at the time of detection of the connection portion. Hence, in the case where there is the need to control accurately the amount of the ECs remaining on the second EC tape, the number of the ECs present on the first EC tape between the above two positions should be taken into account. The latter number can be estimated based on the length of the first EC tape between the above two positions and the pitch at which the ECs are held by the first tape. Meanwhile, in the case where the counter is the decreasing counter, the remaining-amount obtaining device sets, in response to the detection of the connection portion, the decreasing counter to an initial counter number based on the initial amount obtained by the initial-amount obtaining device, and reads out the current count number of the decreasing counter, as needed. The initial count number of the decreasing counter may be the initial amount or number itself in the case where the required accuracy of the remaining amount obtained by the remaining-amount obtaining device is low. However, in the case where the required accuracy is high, the decreasing counter must be set to an initial count number equal to a number obtained by adding, to the initial amount or number, the number of the ECs remaining between the EC-supply position and the connection portion at the time of detection of the connection portion. In either case, the present EC supplying apparatus can obtain the amount of the ECs remaining on the second EC tape. Otherwise, the remaining amount of the ECs on the second EC tape may be obtained by setting the counter to an initial count number when the remaining amount of the ECs on the first EC tape decreases to zero. However, since the present EC supplying apparatus sets the counter to an initial count number in response to the detection of each connection portion, the supplying apparatus can avoid the accumulation of errors and can obtain accurate remaining EC amounts. When a remaining EC amount decreases to a predetermined small amount, the supplying apparatus may inform an operator of the fact.

(21) According to a twenty-first feature of the present invention that includes the twentieth feature (20), the initial-amount obtaining device comprises an initial-amount input device for inputting the initial amount. The initial-amount input device may be a bar-code reader which is operated by an operator to read in a bar code representing the initial amount, or a keyboard which includes numeric keys and which is operated by an operator to input the initial amount. Thus, the initial-amount obtaining device obtains the initial amount. Otherwise, the initial-amount obtaining device may be one which reads out an initial amount corresponding to the particular sort of the second EC tape, from a memory of a computer which controls the EC supplying apparatus, or one which receives an initial amount from a computer different from the above computer.

(22) According to a twenty-second feature of the present invention, there is provided an electric-component supplying system comprising a plurality of electric-component supplying units each of which comprises an apparatus according to any one of the second to twenty-first feature (2) to (21); and a table which supports the respective frames of the electric-component supplying units, such that each of the respective frames attached to the table is detachable from the table, and such that respective electric-component-supply positions of the supplying units are arranged along a reference line on the table. The reference line may be a straight line, a full circle, an arc, or a curve, or a combination of two or more of them. Each of the first and second EC tapes may be stored in various manners, for example, wound on a supply reel, or stored in a storing container. Each of the EC supplying units may comprise a main frame which includes an EC storing portion, such as a supply-reel holding portion or a storing-container holding portion. Alternatively, each EC supplying unit may comprise an EC storing device separate from its main frame. The respective separate EC storing devices of the EC supplying units may be provided on the table with the respective main frames thereof, or may be provided away from the table.

(23) According to a twenty-third feature of the present invention, there is provided a method of feeding a plurality of electric-component tapes each of which includes a carrier tape and holds a plurality of electric components in a lengthwise direction of the carrier tape, supplying, from the each electric-component tape, the electric components, one by one, to an electric-component mounting system, and operating the electric-component mounting system to sequentially mount the electric components at respective positions on a print-wired board, thereby assembling an electric circuit on the print-wired board, the method comprising the steps of feeding the plurality of electric-component tapes including two electric-component tapes one of which holds a first sort of electric components and the other of which holds a second sort of electric components different from the first sort of electric components, supplying, from each of the two electric-component tapes, the electric components of a corresponding one of the first and second sorts, one by one, to the electric-component mounting system, connecting, to a terminal end portion of a first one of the plurality of electric-component tapes that currently supplies the electric components to the electric-component mounting system, an initial end portion of a second one of the plurality of electric-component tapes that holds the electric components of a same sort as the electric components held by the first electric-component tape, inputting, at a timing around a timing at which the first and second electric-component tapes are connected to each other, identification information identifying the second tape, into the electric-component mounting system, detecting a connection portion where the terminal end portion of the first electric-component tape and the initial end portion of the second electric-component tape are connected to each other, comparing, in response to the detection of the connection portion, the input identification information, with reference identification information pre-stored in the electric-component mounting system and, when the input identification information is not identical with the reference identification information, stopping the operation of the electric-component mounting system. According to this method, the EC mounting system is stopped when an incorrect sort of EC tape is connected to the first EC tape. Thus, the EC mounting system is prevented from mounting an incorrect sort of ECs on a PWB.

(24) According to a twenty-fourth feature of the present invention that includes the twenty-third feature (23), the step of inputting the identification information comprises reading in, with a bar-code reader, a bar code as the identification information identifying the second electric-component tape.

(25) According to a twenty-fifth feature of the present invention that includes the twenty-third or twenty-fourth feature (23) or (24), the assembling method further comprises a step of obtaining a remaining amount of the electric components which currently remain on the second electric-component tape, based on the number of the electric components supplied from the second tape after the detection of the connection portion and an initial number of the electric components which are initially present on the second tape connected to the first tape. The remaining amount of the ECs on the second EC tape can be obtained in the same manner as that employed in the EC supplying apparatus according to the twentieth feature (20). In the case where the remaining amount is controlled with accuracy, the number of the ECs present on the first EC tape between the EC-supply position and the connection-portion-detect position should be taken into account. However, in the case where no accurate remaining amounts are needed, the above number may be neglected.

(26) According to a twenty-sixth feature of the present invention, there is provided a method of feeding a plurality of electric-component tapes each of which includes a carrier tape and holds a plurality of electric components in a lengthwise direction of the carrier tape, supplying, from the each electric-component tape, the electric components, one by one, to an electric-component mounting system, and operating the electric-component mounting system to sequentially mount the electric components at respective positions on a print-wired board, thereby assembling an electric circuit on the print-wired board, the method comprising the steps of feeding the plurality of electric-component tapes including two electric-component tapes one of which holds a first sort of electric components and the other of which holds a second sort of electric components different from the first sort of electric components, supplying, from each of the two electric-component tapes, the electric components of a corresponding one of the first and second sorts, one by one, to the electric-component mounting system, connecting, to a terminal end portion of a first one of the plurality of electric-component tapes that currently supplies the electric components to the electric-component mounting system, an initial end portion of a second one of the plurality of electric-component tapes that holds the electric components of a same sort as the electric components held by the first electric-component tape, detecting a connection portion where the terminal end portion of the first electric-component tape and the initial end portion of the second electric-component tape are connected to each other, and obtaining a remaining amount of the electric components which currently remain on the second electric-component tape, based on the number of the electric components supplied from the second tape after the detection of the connection portion and an initial number of the electric components which are initially present on the second tape connected to the first tape.

(27) According to a twenty-seventh feature of the present invention that includes the twenty-sixth feature (26), the assembling method further comprises a step of informing, when the obtained remaining amount is not more than a reference amount, an operator of a fact that the obtained remaining amount is not more than the reference amount. The operator has only to connect another EC tape to the current EC tape, when he or she is informed of the fact that the remaining amount is not more than the reference amount. That is, the operator need not always monitor the remaining amount of the current EC tape. Thus, the operator can easily control the remaining amount of each EC tape. An alarm device, a display device, or both of them may be employed to inform the operator of the fact. Each of the twenty-third to twenty-seventh features (23) to (27) relating to the CB assembling method may be combined with each of the first to twenty-second features (1) to (22) relating to the EC supplying apparatus or system, so as to enjoy the effects and advantages of the each feature (1) to (22).

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 24A is a front elevation view of a tape-guide member and a cover member of one of the EC-supply units, showing the state in which the cover member takes a first position relative to the tape-guide member;

FIG. 24B is a front elevation view of the tape-guide member and the cover member, showing the state in which the cover member takes a second position relative to the tape-guide member;

DETAILED DESCRIPTION OF THE PREFERRED EMBODIMENTS

Hereinafter, there will be described a circuit-board ("CB") assembling system 10 including an electric-component ("EC") supplying device to which the present invention is applied, by reference to the drawings. The CB assembling system 10 carries out a CB assembling method to which the present invention is also applied.

Figure 1:
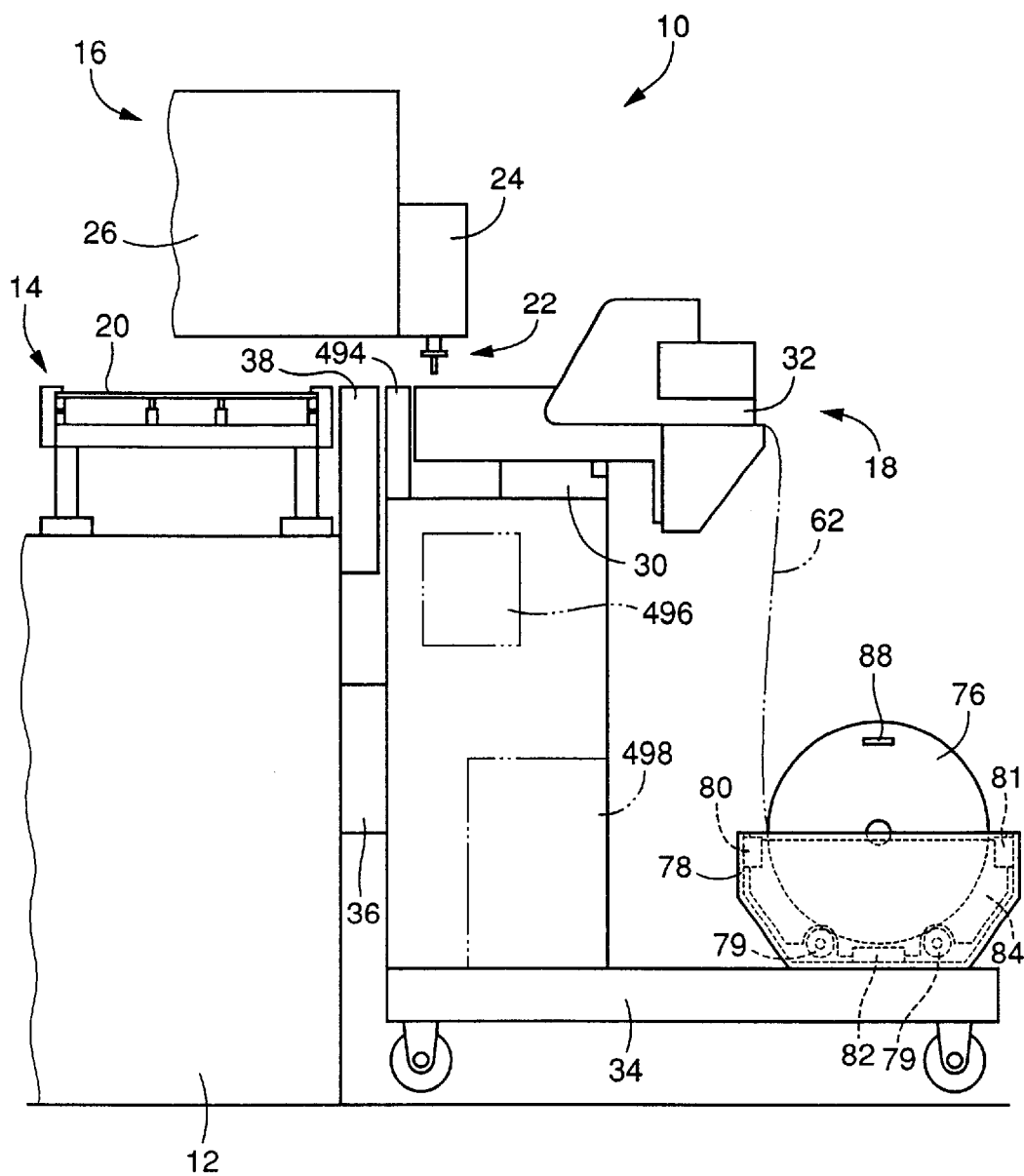
FIG. 1 is a schematic front elevation view of a circuit-board ("CB") assembling system including an electric-component ("EC") supplying system to which the present invention is applied.

As shown in FIG. 1, the CB assembling system 10 includes a base 12, a print-wired-board ("PWB") conveying device 14 and an EC mounting system 16 which are provided on the base 12, and an EC supplying system 18 which can be connected to the EC mounting system 16. The EC mounting system 16 takes ECs from the EC supplying system 18, and mounts the ECs on a PWB 20 which is conveyed, and is positioned at a predetermined position, by the PWB conveying device 14. Thus, the CB assembling system 10 assembles an electric circuit on the PWB 20, i.e., a CB (circuit board). The EC mounting system 16 includes an EC sucker 22 as an EC holder that sucks each EC by applying a negative air pressure thereto; a Z-direction moving and rotating device 24 which supports the EC sucker 22 such that an axis line of the EC sucker 22 extends in a vertical direction (hereinafter, referred to as the Z direction), moves the EC sucker 22 in the Z direction, and rotates the EC sucker 22 about its axis line extending in the Z direction; and an X- Y-direction moving device 26 which supports the Z-direction moving and rotating device 24, and moves the same 24 in each of two directions perpendicular to each other in a horizontal plane (hereinafter, referred to as the X and Y directions). One of the X and Y directions that is parallel to the direction in which the PWB 20 is conveyed will be referred to as the X direction. Strictly, the PWB 20 should be called as a CB after the ECs are mounted thereon by the EC mounting system 16. However, in the present embodiment, the PWB 20 is called as the PWB as before, even after the ECs are mounted thereon. Similarly, the PWB conveying device 14 is called as before even after the ECs are mounted on the PWB 20, although the device 14 should be called as a CB conveying device.

The EC supplying system 18 includes two tables 30 (only one table 30 is shown in FIG. 1), and a plurality of EC-supply units 32 which are detachably attached to each of the two tables 30. Each of the EC-supply units 32 provides an EC supplying device. Each of the two tables 30 is mounted on a car 34, and can be moved relative to the EC mounting system 16. When the EC supplying system 18 supplies the ECs to the EC mounting system 16, each of the two cars 34 is connected by a connecting device 36 to the base 12, so that the EC supplying system 18 is connected to the EC mounting system 16. The base 12 provides a frame of the EC mounting system 16, and each of the two tables 30 is connected to the frame of the system 16 via the corresponding car 34. Thus, the EC supplying system 18 supplies the ECs to the EC mounting system 16 in the state in which the position of the system 18 is fixed relative to that of the system 16. An image taking device 38 which takes an image of each EC held by the EC sucker 22, is provided between the PWB conveying device 14 and the EC supplying system 18.

Figure 2:
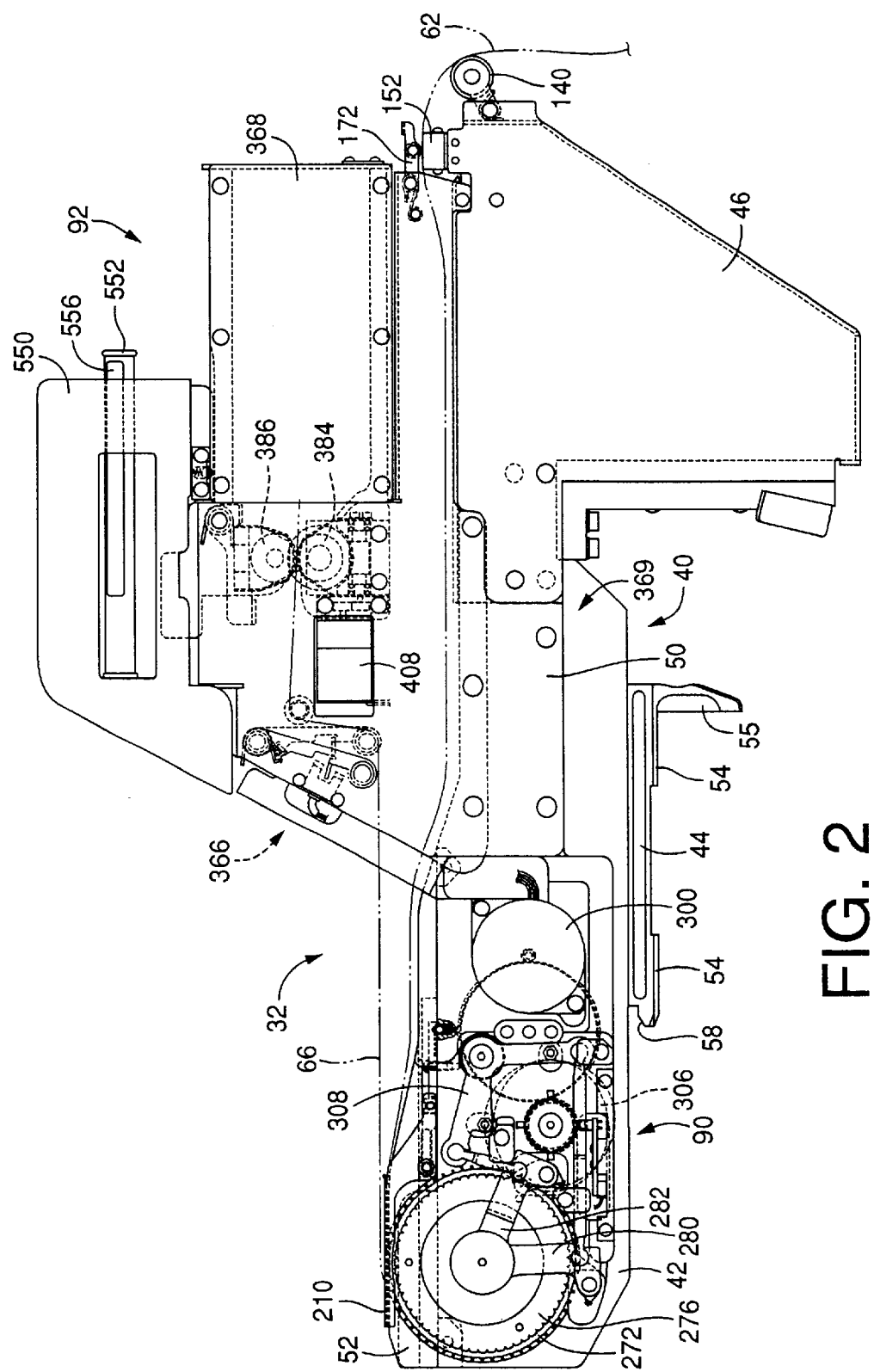
FIG. 2 is a front elevation view of one of the EC-supply units.
Figure 3:
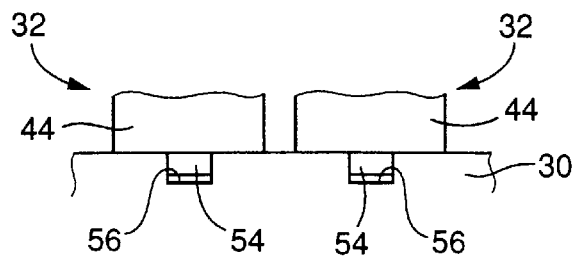
FIG. 3 is a side elevation view of respective portions of the EC-supply units that are positioned relative to a table.

As shown in FIG. 2, each of the EC-supply units 32 includes a frame 40 provided by a plurality of members which are integrally fixed thereto and which include a first member 42, a second member 44, a third member 46, a fourth member 48 (FIG. 17), a fifth member 50, and a sixth member 52. The first member 42 has a shape like a wide and long plate. The second member 44 has a shape like an elongate block, and is fixed to the first member 42 such that the second member 44 extends parallel to the lengthwise direction of the first member 42. The second member 44 includes a pair of first positioning projections 54 and a single second positioning projection 55. As shown in FIG. 3, each of the two tables 30 has a plurality of first positioning grooves 56 which are formed at a predetermined pitch in the X direction. Each of the EC-supply units 32 is attached to one of the two tables 30 such that the two first positioning projections 54 are fitted in one of the first positioning grooves 56 and the second positioning projection 55 is fitted in one of a plurality of second positioning grooves (not shown) of the one table 30. Thus, the each EC-supply unit 32 is positioned relative to the one table 30 in the widthwise direction of the each unit 32, i.e., in the X direction. In addition, an inclined surface 58 (FIG. 2) of a front one of the two first positioning projection 54 of the each EC-supply unit 32 engages an inclined surface (not shown) of the one table 30, so that the each unit 32 is positioned relative to the one table 30 in the lengthwise direction of the each unit 32, i.e., in the Y direction, and is prevented from moving up off the upper surface of the one table 30. Moreover, the each unit 32 is fixed to the one table 30 by a corresponding one of a plurality of unit fixing devices (not shown) which are provided corresponding to the plurality of second positioning grooves. Thus, a plurality of EC-supply units 32 are fixed to each table 30 such that respective EC-supply portions of the units 32 are arranged along a straight line parallel to the X direction, the widthwise direction of each unit 32 is parallel to the X direction, and the lengthwise direction of the each unit 32 is parallel to the Y direction. Each of the two cars 34 is supplied with electric power from the EC mounting system 16, and each of the EC-supply units 32 is supplied with electric power from a corresponding one of the two cars 34.

Figure 5:
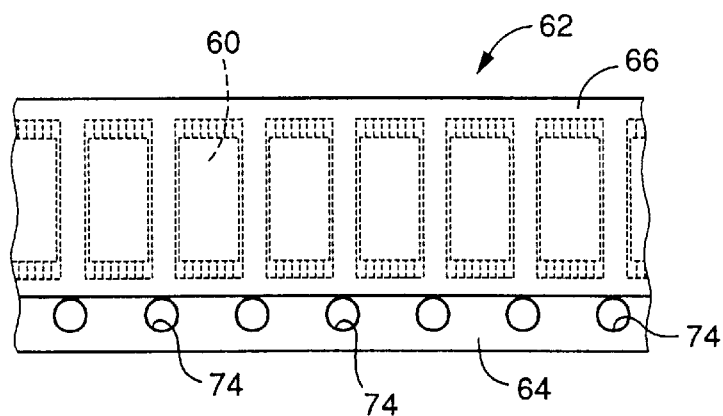
FIG. 5 is a plan view of a portion of an EC tape held by one of the EC-supply units.
Figure 6:
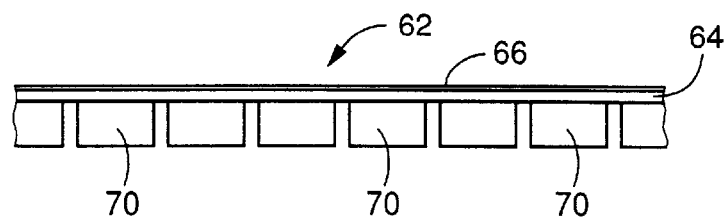
FIG. 6 is a front elevation view of the EC tape of FIG. 5.
Figure 7:
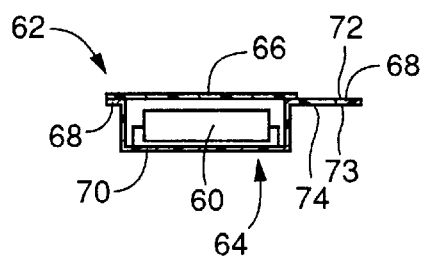
FIG. 7 is a cross-sectioned, side view of the EC tape.

As shown in FIGS. 5, 6, and 7, each EC-supply unit 32 supplies an EC tape 62 which holds a plurality of ECs 60. The EC tape 62 is of the embossed-carrier type, and includes a carrier tape 64 and a top-cover tape 66 which cooperate with each other to hold the ECs 60. The carrier tape 64 includes a pair of end portions 68 which are located on widthwise opposite sides of the tape 64, respectively, and which extend in the lengthwise direction of the same 64; and a number of embossed portions 70 which project downward from between the two end portions 68, at a predetermined pitch in the lengthwise direction of the tape 64. The ECs 60 are accommodated in the embossed portions 70, respectively, and respective upper openings of the portions 70 are closed by the top-cover tape 66 adhered to the carrier tape 64. Each of the embossed portions 70 provides an EC accommodating pocket. Thus, the ECs 60 are held by the carrier tape 64 at a predetermined pitch in the lengthwise direction of the tape 64. The width of the top-cover tape 66 is shorter than that of the carrier tape 64, and one of the two end portions 68 of the tape 64 that is not covered by the top-cover tape 66 has a number of feed holes 74 which are formed through the thickness of the tape 64, from a top surface 72 thereof to a back surface 73 thereof, and which are arranged in an array at a predetermined pitch in the lengthwise direction of the tape 64.

Figure 8:
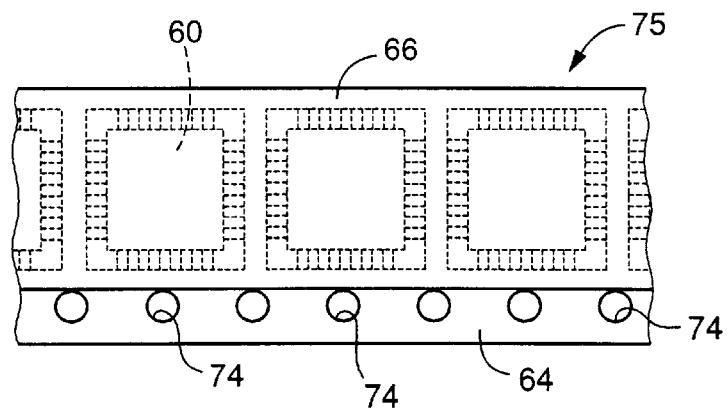
FIG. 8 is a plan view of another sort of EC tape which holds ECs at a different pitch.

The EC supplying system 18 can supply different sorts of EC tapes which have different widths and/or different pitches at which ECs are held by the EC tapes. For example, FIG. 8 shows a different sort of EC tape 75 which has the same width as that of the EC tape 62 but holds ECs 60 at a pitch different from that of the EC tape 62. In the present embodiment, it is assumed that the first EC tape 62 holds the ECs 60 at the smallest pitch and the second EC tape 75 holds the ECs 60 at a pitch two times longer than the smallest pitch. Other sorts of EC tapes than the first EC tape 62 have respective pitches "M" times longer than the smallest pitch. The number M is an integral number not smaller than two. The second EC tape 75 has dimensions different from those of the first EC tape 62, but has the same structure as that of the same 62. Accordingly, the same reference numerals as used for the first tape 62 are used to designate the corresponding parts of the second tape 75, in FIG. 8.

The EC tapes 62, 75 hold the ECs 60 whose respective widths correspond to the respective widths of the tapes 62, 75, and the EC-supply units 32 supply the EC tapes 62, 75 whose respective widths correspond to the respective widths of the units 32. That is, the wider EC tapes 62, 75 hold the wider ECs 60, and the wider EC-supply units 32 supply the wider tapes 62. 75. The predetermined pitch at which the first positioning grooves 56 are formed in the upper surface of each table 30 is somewhat greater than the smallest width of the respective widths of the EC-supply units 32. Therefore, some EC-supply units 32 whose widths are greater than the pitch of formation of the grooves 56 may be attached to the each table 30 such that the respective pairs of first positioning projections 54 of the units 32 are fitted in every second ones of the grooves 56. Thus, each table 30 can simultaneously support different sorts of EC-supply units 32 which supply different sorts of EC tapes having different widths. In the present embodiment, it is assumed that the first EC tape 62 has the smallest width of the respective widths of all the different sorts of EC tapes including the first and second EC tapes 62, 75. Thus, some EC-supply units 32 each of which supplies the first EC tape 62 holding the ECs 60 can be attached to the each table 30 at the smallest pitch equal to the pitch of formation of the grooves 56.

Figure 4:
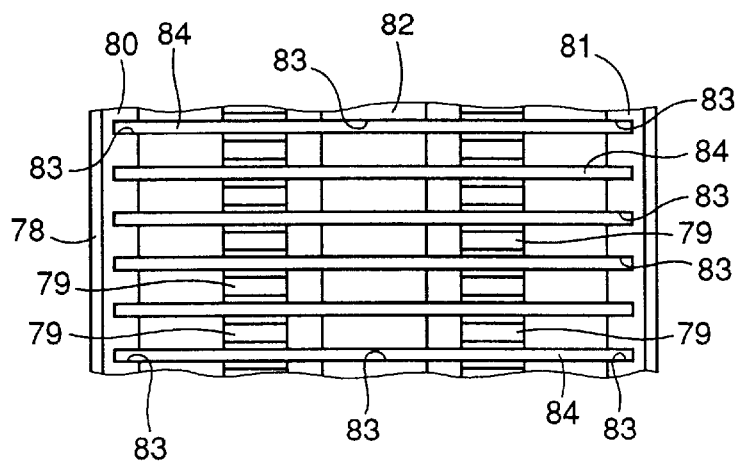
FIG. 4 is a plan view of a portion of a bucket which holds a plurality of EC-supply reels of the EC-supplying system of FIG. 1.

As shown in FIG. 1, each EC tape 62, 75 is wound around a supply reel 76. Each car 34 includes a container-like bucket 78 as an integral portion thereof. Each bucket 78 provides a reel-support member, and thereby provides an EC storing device. As shown in FIGS. 1 and 4, each bucket 78 has two arrays of rollers 79 each as a rotatable support member at two positions distant from each other in a front-rear direction parallel to the Y direction. The front array of rollers 79 are rotatable about a front common axis line parallel to the widthwise direction of each EC-supply unit 32, i.e., the X direction, and the rear array of rollers 79 are rotatable about a rear common axis line parallel to the X direction.

Each bucket 78 has three partition-plate holding members 80, 81, 82 each as a partition-member holding member. The three holding members 80, 81, 82 are supported by a front surface, a rear surface, and a bottom surface of the each bucket 78, respectively. Each of the three holding members 80, 81, 82 has a plurality of grooves 83 formed at the same pitch as that of formation of the first positioning grooves 56 of each table 30, in a direction parallel to the widthwise direction of each EC-supply unit 32, i.e., in the X direction, such that the grooves 83 are aligned with the grooves 56, respectively, with respect to the X direction. A partition plate 84 as a partition member can be fitted in each of the grooves 83 of the first one of the three holding members 80, 81, 82, a corresponding one of the grooves 83 of the second one of the three holding members 80, 81, 82, and a corresponding one of the grooves 83 of the third one of the three holding members 80, 81, 82. Each pair of partition plates 84 adjacent to each other cooperate with each other to define an inside space which can accommodate one supply reel 76. Each supply reel 76 is fitted in the inside space defined between one pair of partition plates 84, such that the reel 76 is rotatably supported on a corresponding pair of rollers 79 and is prevented from being moved in the widthwise direction thereof. Since each partition plate 84 has two recesses corresponding to the two arrays of rollers 79, the each plate 84 is prevented from being interfered with by the rollers 79.

Like the EC-supply units 32, the supply reels 76 supply EC tapes whose respective widths correspond to respective widths of the reels 76, and accordingly the wider reels 76 supply the wider tapes. Therefore, a plurality of partition plates 84 are attached to each bucket 78, corresponding to the respective widths of the EC tapes supplied from the supply reels 76. For example, the first EC tapes 62 each having the smallest width are supplied from the supply reels 76 each having the smallest width. In this case, the partition plates 84 are fitted in all the grooves 83 of each holding member 80, 81, 82, so as to define the smallest inside spaces for accommodating the reels 76 having the smallest width. In the case of wide supply reels 76 which cannot be accommodated in the smallest inside spaces, the partition plates 84 may be fitted in every second ones of the grooves 83 of each holding member 80, 81, 82, so as to define respective wide inside spaces which can accommodate the wide reels 76. Thus, each bucket 78 can simultaneously accommodate different sorts of supply reels 76 having different widths. The distance between the front and rear holding members 80, 81 is greater than the outer diameter of of the supply reels 76, and the intermediate holding member 82 is provided below a horizontal plane passing through the respective upper ends of the two arrays of rollers 79. Thus, the supply reels 76 are prevented from being interfered with by the three holding members 80, 81, 82. Accordingly, each supply reel 76, having either a small or large width, can be fitted in an inside space defined by two partition plates 84 and can be supported on the rollers 79, without being interfered with by any of the holding members 80, 81, 82.

A bar code 88 is printed on a side surface of each supply reel 76. In the present embodiment, the bar code 88 represents an identification number identifying a particular sort of ECs held by an EC tape supplied from the each reel 76; the dimensions of each EC; an initial number of the ECs held by the new EC tape from which no ECs have not been taken yet; the width of the EC tape; the pitch at which the ECs are held by the EC tape; and information indicating which one of the embossed-carrier type, the punched-carrier type, and the lead-wire-terminal-taped type the EC tape supplied from the each reel 76 is of.

As shown in FIG. 2, an EC tape 62 drawn from one supply reel 76 is fed by an EC-tape feeding device 90 of a corresponding EC-supply unit 32 at a predetermined pitch in the lengthwise direction of the tape 62, in a direction parallel to the lengthwise direction of the each unit 32. Thus, the ECs 60 are supplied one by one to a predetermined EC-supply position of the each unit 32, while the top-cover tape 66 is treated by a top-cover-tape ("TCT") treating device 92. The EC sucker 22 sucks an EC 60 from each embossed portion 70 of the carrier tape 64, at the EC-supply position of the each unit 32. The EC-supply position is predetermined in a front portion of the each unit 32 that is near to the PWB conveying device 14 in the front-rear direction of the each unit 32, i.e., in the lengthwise direction of the same 32. The EC-supply portion of the each unit 32 includes the EC-supply position and a portion around that position. The widthwise direction of the EC tape 62 is parallel to that of the each unit 32.

Figure 9:
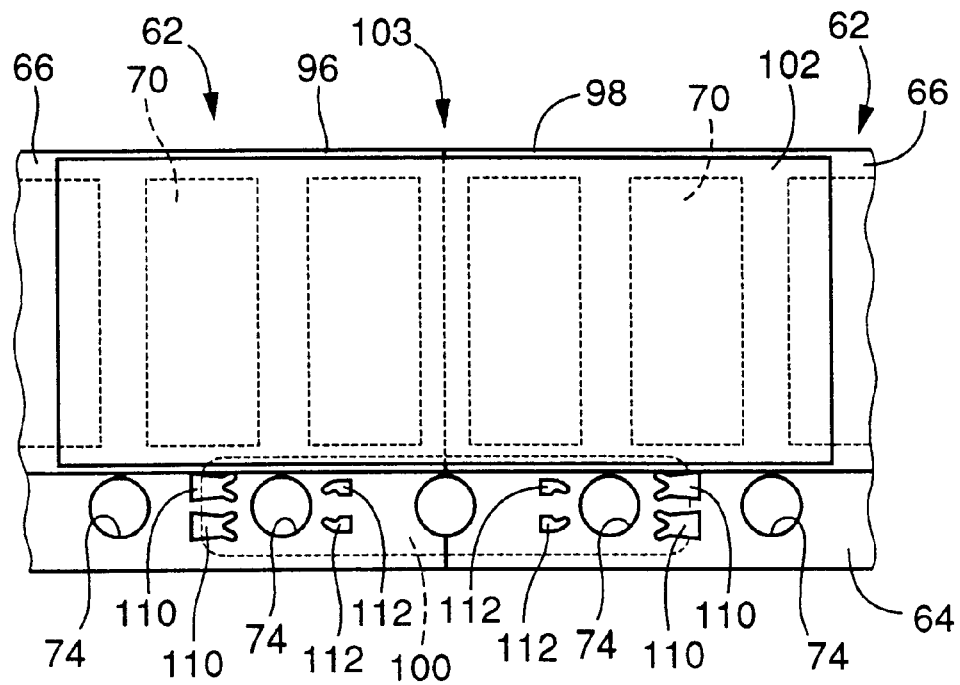
FIG. 9 is a plan view showing the state in which two EC tapes are connected to each other with a connection member and a connection tape.
Figure 10:
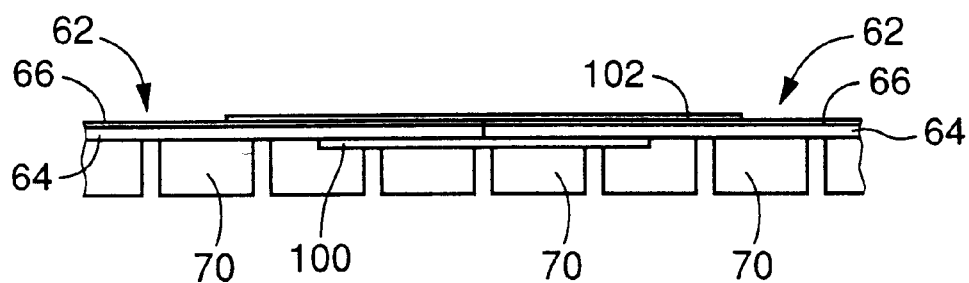
FIG. 10 is a front elevation view showing the state in which the two EC tapes are connected to each other with the connection member and the connection tape.

When the supplying of the ECs 60 from the EC tape 62 wound around the supply reel 76 advances and the consumption of the EC tape 62 comes near to the end, an operator replenishes a new EC tape 62. More specifically described, first, the operator removes the current supply reel 76 supplying the terminal end portion of the current EC tape 62, from the bucket 78, removes the terminal end portion of the current tape 62 from the current reel 76, sets a new supply reel 76 to supply the new EC tape 62, to the bucket 78, and draws the initial end portion of the new tape 62 from the new reel 76. Then, as shown in FIGS. 9 and 10, the operator manually connects, using a metallic connection member 100, and a connection tape 102 as another sort of connection member, the terminal end portion 96 of the current tape 62 supplying the ECs 60, to the initial end portion 98 of the new tape 62 to subsequently supply the ECs 60. The connection member 100 and the connection tape 102 cooperate with the terminal end portion 96 and the initial end portion 98 of the two EC tapes 62 to provide a connection portion 103. The operator connects the two EC tapes 62 to each other, at a position near the position where the current reel 76 supplying the current tape 62 is supported by the bucket 78. In FIG. 9, the ECs 60 are not illustrated.

Figure 11:
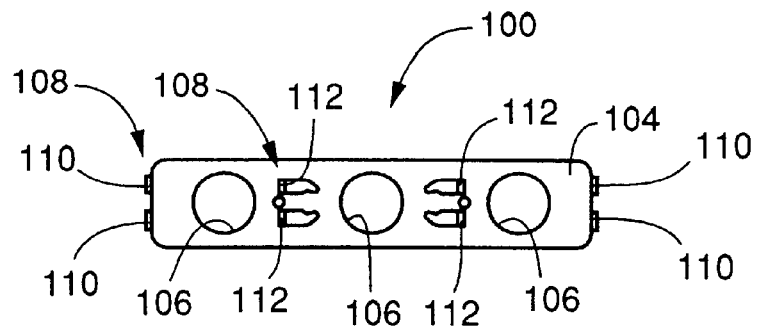
FIG. 11 is a plan view of the connection member.
Figure 12:
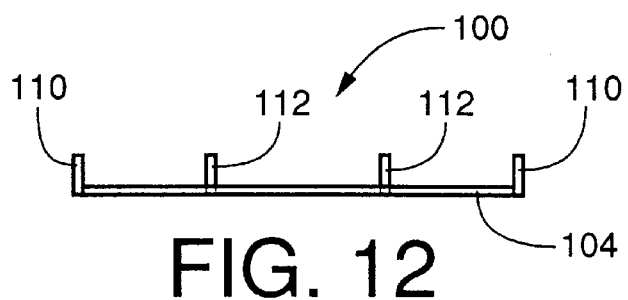
FIG. 12 is a front elevation view of the connection member.

As shown in FIGS. 11 and 12, the tape connection member 100 includes a flat main portion 104 which is formed of a generally rectangular metal (e.g., iron) plate; a plurality of feed holes 106 (three holes 106, in the present embodiment) which are formed through the thickness of the main portion 104, at the same pitch as the pitch at which the feed holes 74 are formed in the carrier tape 64; and a plurality of caulking projections 108 (eight projections 108, in the present embodiment) which project from the main portion 104 in a direction perpendicular thereto. The main portion 104 has a width not greater than twice the distance between the center of each of the feed holes 74 of each EC tape 62 and a side edge of one of the two end portions 68 that has the feed holes 74.

Each of the caulking projections 108 has a height greater than the thickness of the carrier tape 64. In the present embodiment, the eight caulking projections 108 include two sorts of projections, i.e., four Y-shaped projections 110 two of which project from one of lengthwise opposite end portions of the main portion 104 and the other two of which project from the other end portion of the same 104; and four inverted-J-shaped projections 112 two of which project from a first intermediate portion of the main portion 104 between one pair of adjacent feed holes 106 of the three feed holes 106 and the other two of which project from a second intermediate portion of the same 104 between the other pair of adjacent feed holes 106 of the three feed holes 106. Thus, the two pairs of Y-shaped projections 110 are provided at two locations, respectively, which are distant from each other in the lengthwise direction of the main portion 104, and similarly the two pairs of inverted-J-shaped projections 112 are provided at two locations, respectively, which are distant from each other in the lengthwise direction of the main portion 104. The distance between the center of each of the opposite end feed holes 106 of the three feed holes 106 and a corresponding pair of Y-shaped projections 110 is equal to the distance between that center and a corresponding pair of inverted-J-shaped projections 112.

Figure 13:
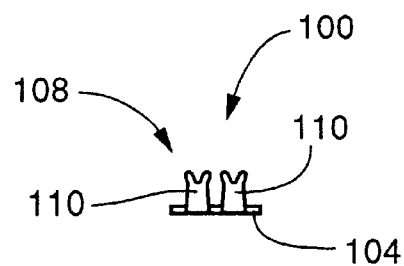
FIG. 13 is a side elevation view of the connection member.
Figure 14:
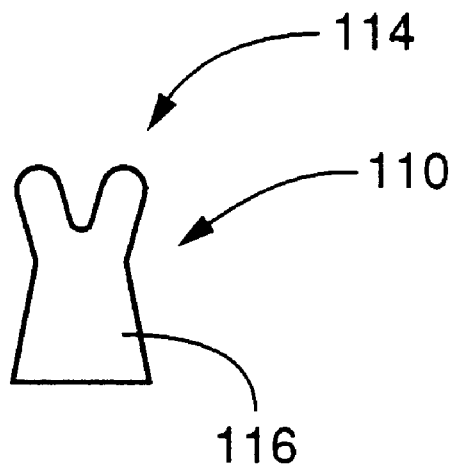
FIG. 14 is a side elevation view of a Y-shaped projection of the connection member.

The two pairs of Y-shaped projections 110 are formed by bending two pairs of projecting portions which respectively project from the lengthwise opposite ends of the main portion 104 in opposite directions parallel to the plane of the main portion 104, such that the bent projecting portions extend in a same direction perpendicular to the plane of the main portion 104, as shown in FIG. 12. Each pair of Y-shaped projections 110 are arranged in the widthwise direction of the main portion 104, as shown in FIG. 13. Each Y-shaped projection 110 includes a bifurcated upper portion 114 which gives a generally Y-shape configuration thereto. As shown in the enlarged view of FIG. 14, each Y-shaped projection 110 includes a base portion 116 having a generally trapezoidal shape. The width of the base portion 116 decreases in a direction toward the upper portion 114, which is formed within a range corresponding to the greatest width of the base portion 116.

Each inverted-J-shaped projection 112 is formed by cutting, and then bending, a portion of the main portion 104 such that the bent portion extends perpendicularly to the remaining portion of the main portion 104, as shown in FIG. 12. Therefore, the main portion 104 has four openings each having a shape corresponding to each projection 112, as shown in FIG. 11. As shown in the enlarged view of FIG. 15, each inverted-J-shaped projection 112 has a generally inverted-J-shaped configuration wherein an upper portion 118 of the each projection 112 is curved in a direction having a component parallel to the widthwise direction of the each projection 112. The upper portion 118 is formed by forming a recess 120 in an inner one of widthwise opposite end portions of the each projection 112 and forming an upper end edge 122 which is inclined such that one of widthwise opposite ends of the upper end edge 122 on the side of the inner end portion of the each projection 112 is more distant from the main portion 104 than the other end of the same 122 on the side of the other, outer end portion. The recess 122 is defined by a generally concave curve. Thus, the upper curved portion 118 is formed within a range corresponding to the width of a base portion 124 of the each projection 122. Like each pair of Y-shaped projections 110, each pair of inverted-J-shaped projections 112 are formed side by side in the widthwise direction of the main portion 104, and the two projections 112 are symmetrical with each other such that the respective upper curved portions 118 thereof project inward toward each other.

The connection member 100 is used to connect respective particular portions of the terminal and initial end portions 96, 98 of the two EC tapes 62 that correspond to the feed holes 74 of the respective carrier tapes 64. An exclusive tape connecting tool (not shown) is used by the operator to caulk the caulking projections 108 of the connection member 100 and thereby connect the two EC tapes 62 to each other. This tape connecting tool is disclosed in U.S. patent application Ser. No. 09/108,243. The tape connecting tool has a plurality of positioning projections on which first the feed holes 106 of the connection member 100 are fitted and then the feed holes 74 of the terminal and initial portions 96, 98 of the two EC tapes 62 are fitted. Thus, one of the lengthwise opposite end feed holes 106 of the connection member 100 is aligned with one of the feed holes 74 of the terminal end portion 96 of the current EC tape 62, the other end feed hole 106 of the connection member 100 is aligned with one of the feed holes 74 of the initial end portion 98 of the new EC tape 62, and the intermediate feed hole 106 of the connection member 100 is aligned with respective semi-circular feed holes 74 of the two end portions 96, 98. Each pair of inverted-J-shaped projections 112 are positioned between the semi-circular feed holes 74 and a corresponding one of the respective complete feed holes 106 of the two EC tapes 62, and each pair of Y-shaped projections 110 are positioned between the two complete feed holes 106 of a corresponding one of the two EC tapes 62.

When in the above-indicated state the operator operates the tape connecting tool, first, the Y-shaped projections 110 and the inverted-J-shaped projections 112 substantially completely penetrate through the respective carrier tapes 64 of the two EC tapes 62 and project out of the respective top surfaces 72 of the carrier tapes 64. Then, the upper bifurcated portions 114 of each pair of Y-shaped projections 110 and the upper curved portions 118 of a corresponding pair of inverted-J-shaped projections 112 are bent toward each other. Consequently the main portion 104 is closely contacted with the respective back surfaces 73 of the two carrier tapes 64, and the upper portions 114, 118 are closely contacted with the respective top surfaces 72 of the carrier tapes 64, and cooperate with the main portion 104 to sandwich the respective end portions of the two carrier tapes 64 and thereby reliably connect the terminal and initial end portions 96, 98 of the two EC tapes 62 to each other.

After the respective carrier tapes 64 of the two EC tapes 62 are connected to each other by the connection member 100, the respective top-cover tapes 66 of the terminal and initial end portions 96, 98 of the two EC tapes 62 are connected to each other with the connection tape 102 which is formed of a synthetic resin, as shown in FIGS. 9 and 10. The connection tape 102 has a tacky material applied to one of opposite major surfaces thereof, and the operator adheres the connection tape 102 to the respective top-cover tapes 66 of the current and new EC tapes 62.

Figure 16:
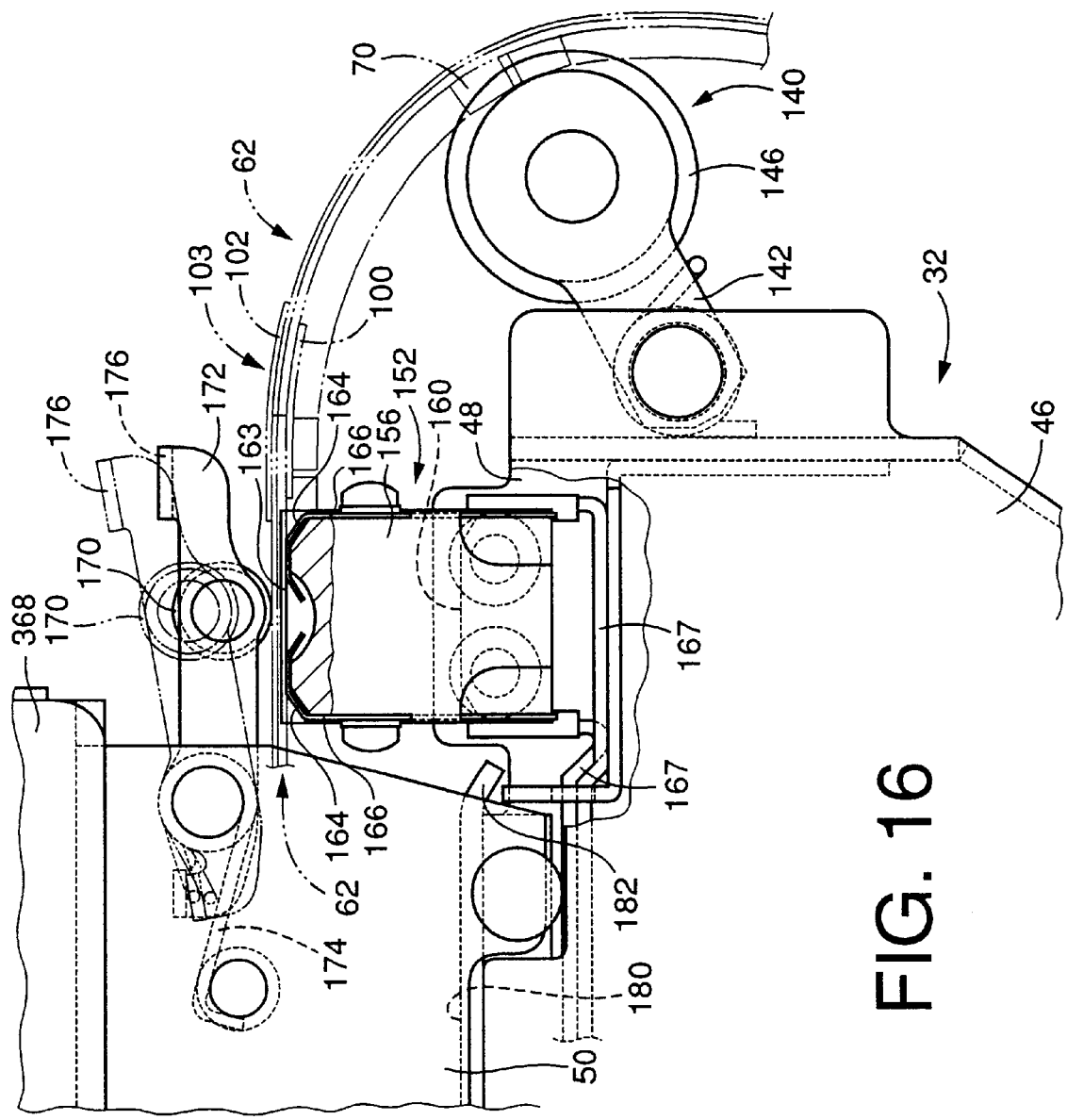
FIG. 16 is a partly cross-sectioned, front elevation view of a detecting head of a metal detector of each of the EC-supply units.
Figure 17:
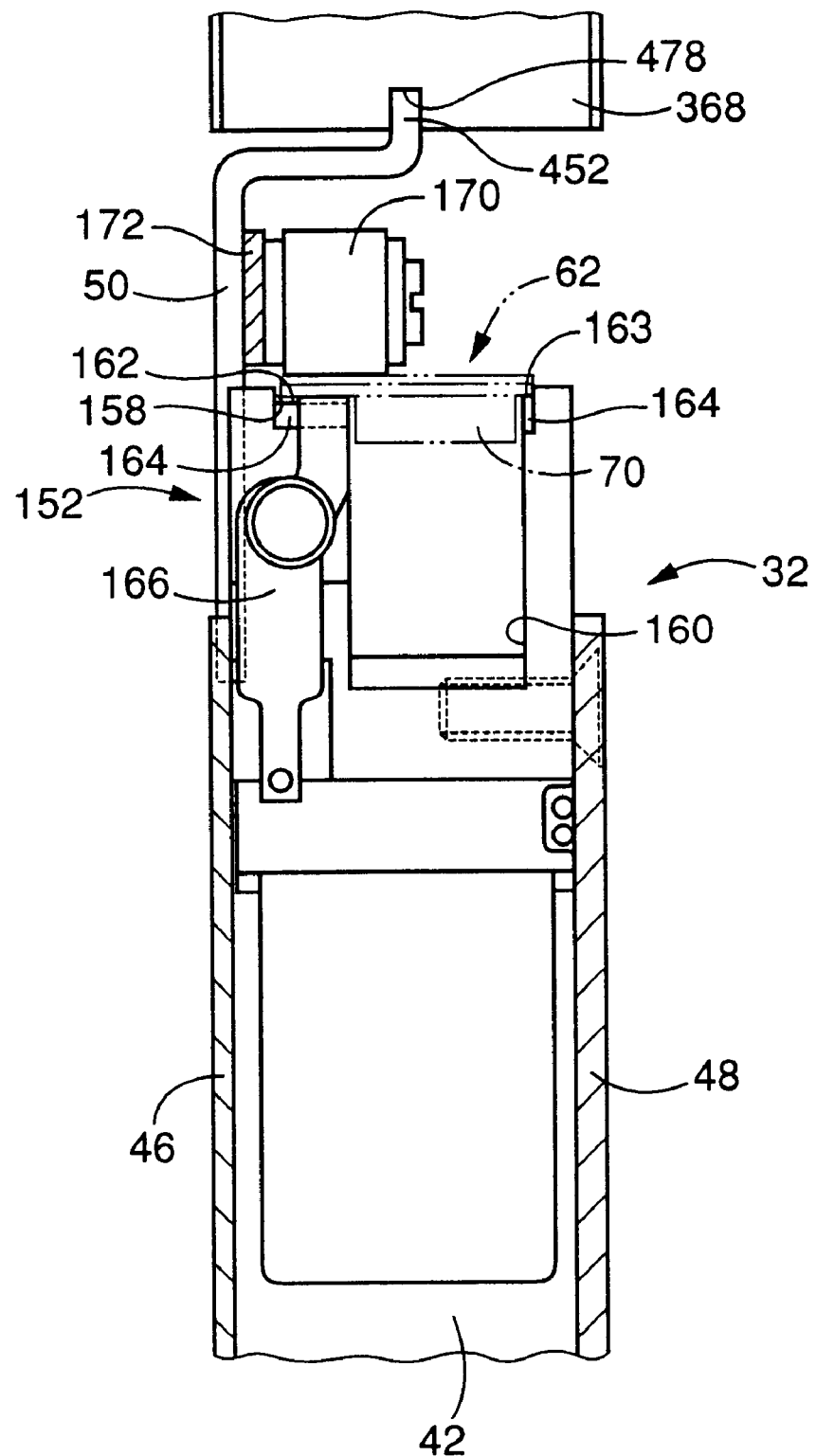
FIG. 17 is a side elevation view of the detecting head.

Each of the third and fourth members 46, 48 as the two elements of the frame 40 of each EC-supply unit 32 has a shape like a thin plate, as shown in FIG. 17. The third and fourth members 46, 48 cooperate with each other to sandwich the first member 42 in the widthwise direction of the each unit 32, and are fixed to the first member 42. A rear end of the third member 46 that is distant from the first member 42 and is near to the corresponding supply reel 76 supports a guide roller 140 as a rotatable guide member, via a lever 142, such that the guide roller 140 is rotatable about an axis line parallel to the widthwise direction of the EC tape 62. The EC tape 62 drawn from the supply reel 76 is engaged with the guide roller 140, and is fed forward while being prevented from being moved in the widthwise direction thereof by a pair of flanges 146 of the roller 140 (only one flange 146 is shown in FIG. 16).

A detecting head 152 of a metal detecting device 150 as a connection detecting device is provided adjacent to, and on a downstream side of, the guide roller 140 in the direction in which the EC tape 62 is fed (hereinafter, referred to as the "EC-feed direction"). The detecting head 152 includes a block-like main member 156 which is fitted in a space defined between the third and fourth members 46, 48, and is fixed to those members 46, 48 such that the main member 156 can be detached from the same 46, 48. The main member 156 includes an upper end portion which projects upward from the third and fourth members 46, 48 and which has a shallow groove 158 and a deep groove 160. The shallow groove 158 extends parallel to the EC-feed direction and has a width slightly greater than that of the carrier tape 64. The deep groove 160 opens in the bottom of the shallow groove 158, has a width smaller than that of the shallow groove 158, and allows the embossed portions 70 of the EC tape 62 to pass therethrough. The deep groove 160 is provided at a position biased toward the fourth member 48 relative to the shallow groove 158. The shallow groove 158 has a pair of support surfaces 162, 163 which support and guide the pair of end portions 68 of the EC tape 62, respectively. The one support surface 162 on the side of the third member 46 has a greater width, and supports and guides the one end portion 68 having the feed holes 74. The other support surface 163 on the side of the fourth member 48 has a smaller width, and supports and guides the other end portion 68 free of the feed holes 74. Each of the support surfaces 162, 163 has two inclined surfaces 164 which are formed in opposite end portions thereof as seen in the EC-feed direction, respectively, such that each of the two inclined surfaces 164 is inclined downward in a direction toward a corresponding one of the opposite ends of the each surface 164. The front and rear inclined surfaces 164 of the support surfaces 162, 163 guide the end portions 68 of the EC tape 62, when each portion of the tape 62 enters and quits the metal detecting device 150.

Two electrodes 166 are fixed by respective fixing devices (not shown) to two side surfaces of a particular portion of the main member 156, respectively, that corresponds to the wide support surface 162. The two side surfaces are distant from each other in the EC-feed direction. Each of the two fixed electrodes 166 extends in a vertical direction, and can be detached from a corresponding one of the two side surfaces. As shown in FIGS. 16 and 17, respective upper portions of the two electrodes 166 are bent, along the wide support surface 162, toward each other with a predetermined space being left therebetween. Thus, the two electrodes 166 are distant from each other on a path along which the connection member 100 is moved when the EC tapes 62 are fed forward, and cooperate with the wide support surface 162 to support the one end portion 68 having the feed holes 74. When the connection member 100 passes over the two electrodes 166, the connection member 100 can simultaneously contact both of the two electrodes 166 and thereby electrically connect the same 166 to each other.

Figure 31:
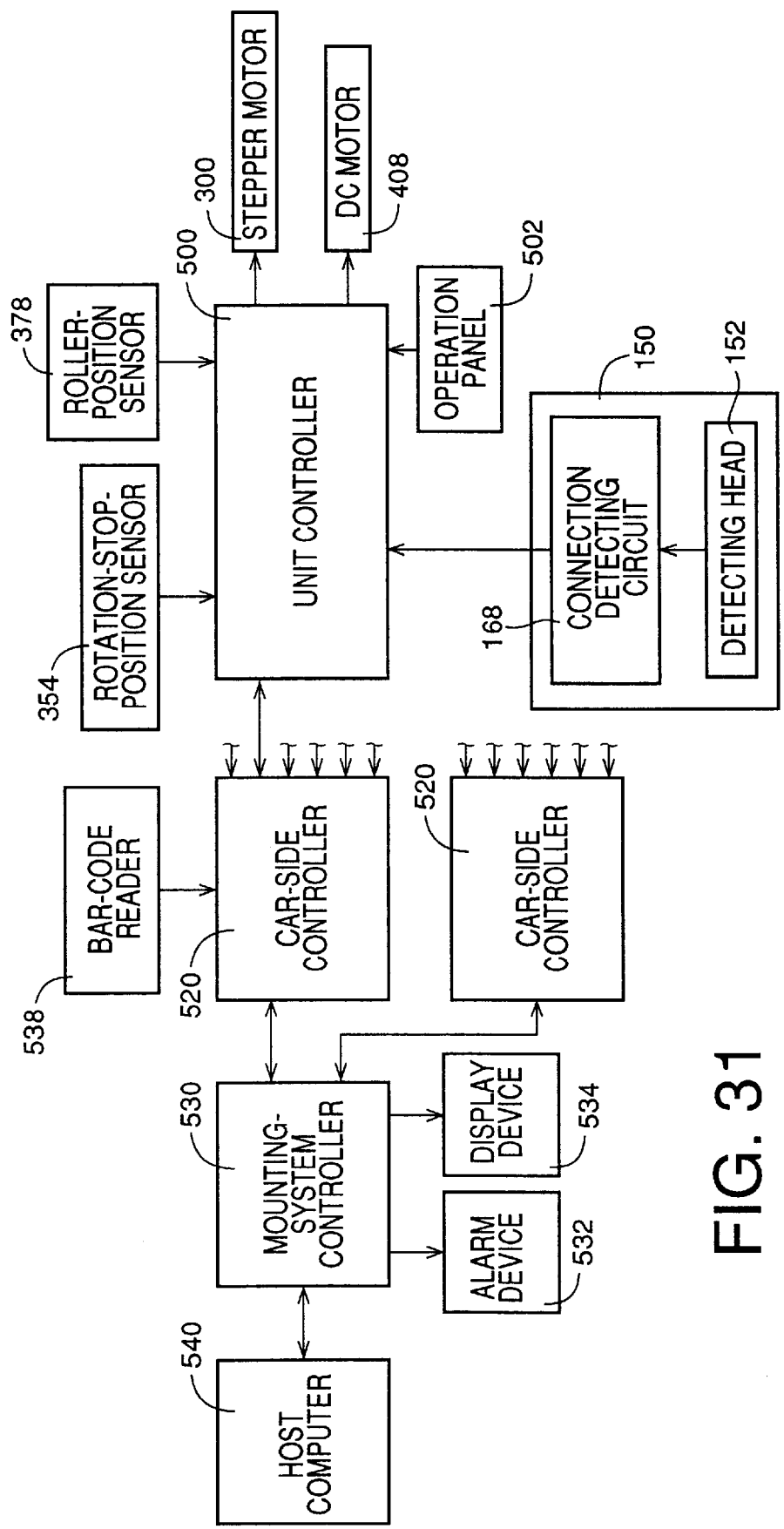
FIG. 31 is a diagrammatic view of a control system of the CB assembling system.

The two electrodes 166 of the detecting head 152 are connected via a wiring 167 to a connection detecting circuit 168 (FIG. 31). The detecting head 152 and the detecting circuit 168 cooperate with each other to provide the metal detecting device 150. Thus, the metal detecting device 150 is a sort of contact-type sensor. In the state in which the two electrodes 166 are electrically connected to each other, the connection detecting circuit 168 produces a first signal; and in the state in which the two electrodes 166 are not connected to each other, the detecting circuit 168 produces a second signal different from the first signal. Usually, the two electrodes 166 are not connected to each other. When the metallic connection member 100 connecting between the two EC tapes 62 passes over the two electrodes 166, the two electrodes 166 are electrically connected to each other via the connection member 100. From the first or second signal supplied from the metal detecting device 150 or the connection detecting circuit 168 thereof, a unit controller 500 (FIG. 31) recognizes that the connection member 100 is passing over the two electrodes 166, and thereby detects the connection member 100 or the connection portion 103.

After the EC tape 62 is guided by the guide roller 140, the two end portions 68 thereof are supported and guided by the wide support surface 162 (and the two electrodes 166) and the narrow support surface 163, respectively, while the embossed portions 70 thereof enter the groove 160 and move in the same 160. One of the two end portions 68 that has the feed holes 74 is pressed against the two electrodes 166 by a pressing roller 170 as a pressing member that is attached to the fifth member 50 fixed to the third member 46.

As shown in FIG. 17, the fifth member 50 has a shape like a thin plate, and a lever 172 is attached to a rear end portion of the fifth member 50 such that the lever 172 is pivotable about an axis line perpendicular to the EC-feed direction. The pressing roller 170 is attached to the lever 172 such that the roller 170 is rotatable about an axis line parallel to the axis line of pivotal motion of the lever 172. The lever 172 is biased by a spring member 174 as an elastic member as a sort of biasing device that is provided between the lever 172 and the fifth member 50, so that the pressing roller 170 is biased in a direction toward the two electrodes 166. Thus, the pressing roller 170 presses the EC tape 62 or the carrier tape 64 against the electrodes 166. When the connection member 100 passes over the two electrodes 166, the pressing roller 170 presses the connection member 100 against the electrodes 166, so that the two electrodes 166 are reliably electrically connected to each other via the connection member 100. Thus, the unit controller 500 surely detects the connection portion 103 of the two EC tapes 62.

The lever 172 includes an operable portion 176 which is manually operable by the operator for pivoting the lever 172 against the biasing force of the spring member 174, so that a space is produced between the pressing roller 170 and the electrodes 166 and an end portion of an EC tape 62 can be manually put in that space. After the end portion of the EC tape 62 is sandwiched between the pressing roller 170 and the main member 156 of the detecting head 152, the operator releases the operable portion 176, to allow the pressing roller 170 to press the one end portion 68 having the feed holes 74, against the electrodes 166.

Figure 18:
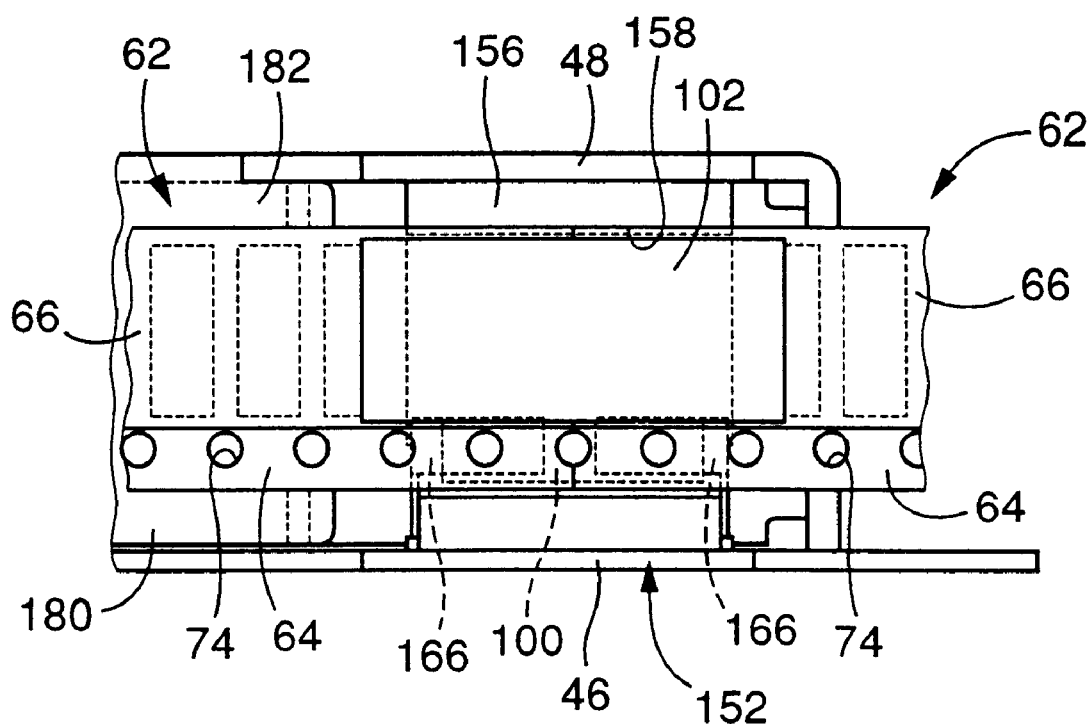
FIG. 18 is a plan view of the detecting head.

As shown in FIGS. 16 and 18, an upper portion of the fourth member 48 is bent perpendicularly toward the third member 46, so that an upper surface of the bent upper portion of the fourth member 48 provides a horizontal support surface 180 which extends in the lengthwise direction of the each EC-supply unit 32 and which supports and guides respective bottoms of the embossed portions 70 of the EC tape 62. One of opposite end portions of the support surface 180 that is nearer to the detecting head 152, i.e., an upstream-side one of the opposite end portions as seen in the EC-feed direction has a guide surface 182 which is inclined downward in a direction toward the head 152. The EC tape 62, after having passed through the detecting head 152, moves on the support surface 180. The EC tape 62 moving on the support surface 180 is prevented, by the respective frames of two EC-supply units 32 adjacent to the each EC-supply unit 32, from moving in the widthwise direction of the tape 62.

Figure 19:
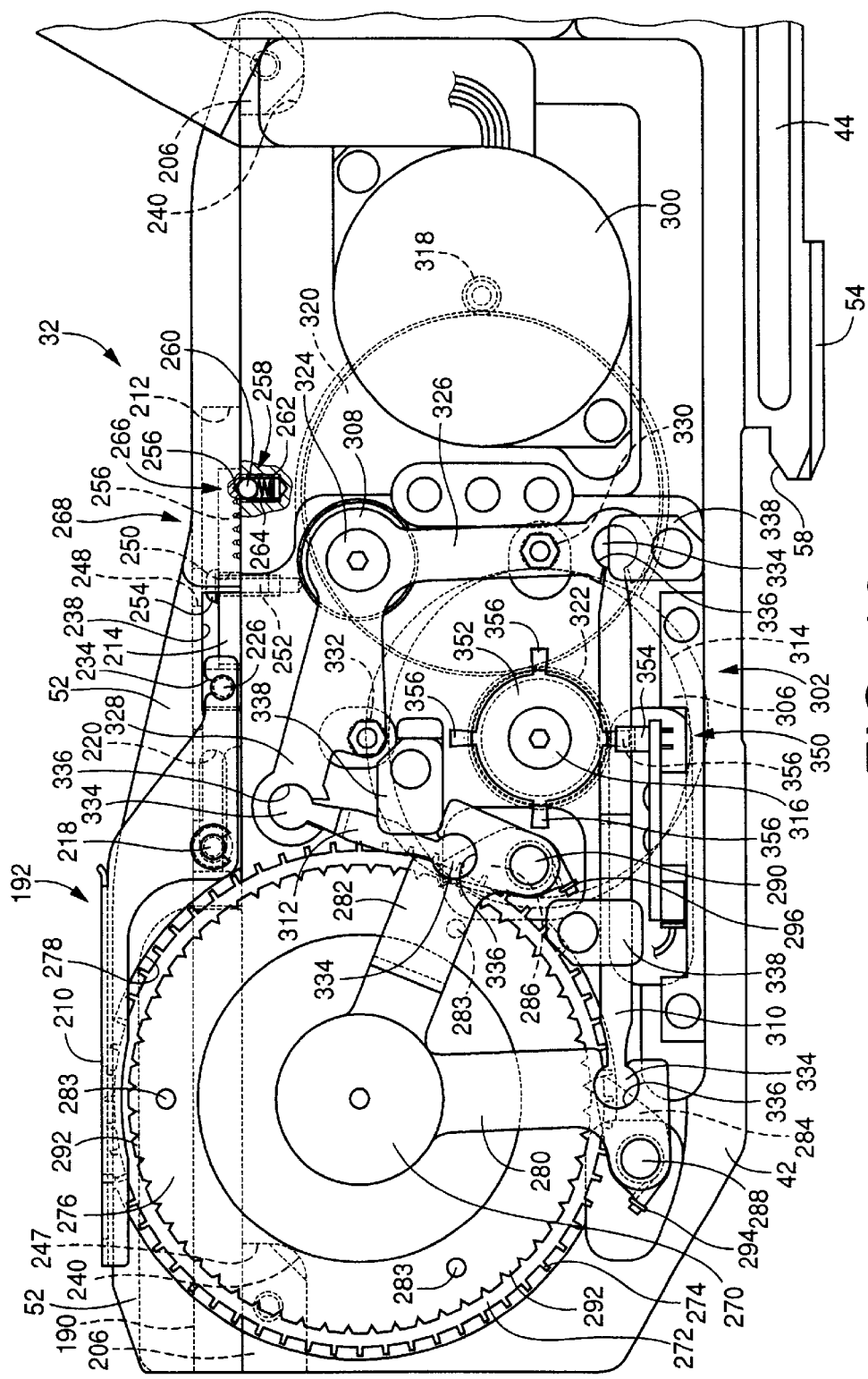
FIG. 19 is a front elevation view of the EC-tape feeding device of each of the EC-supply units.
Figure 21:
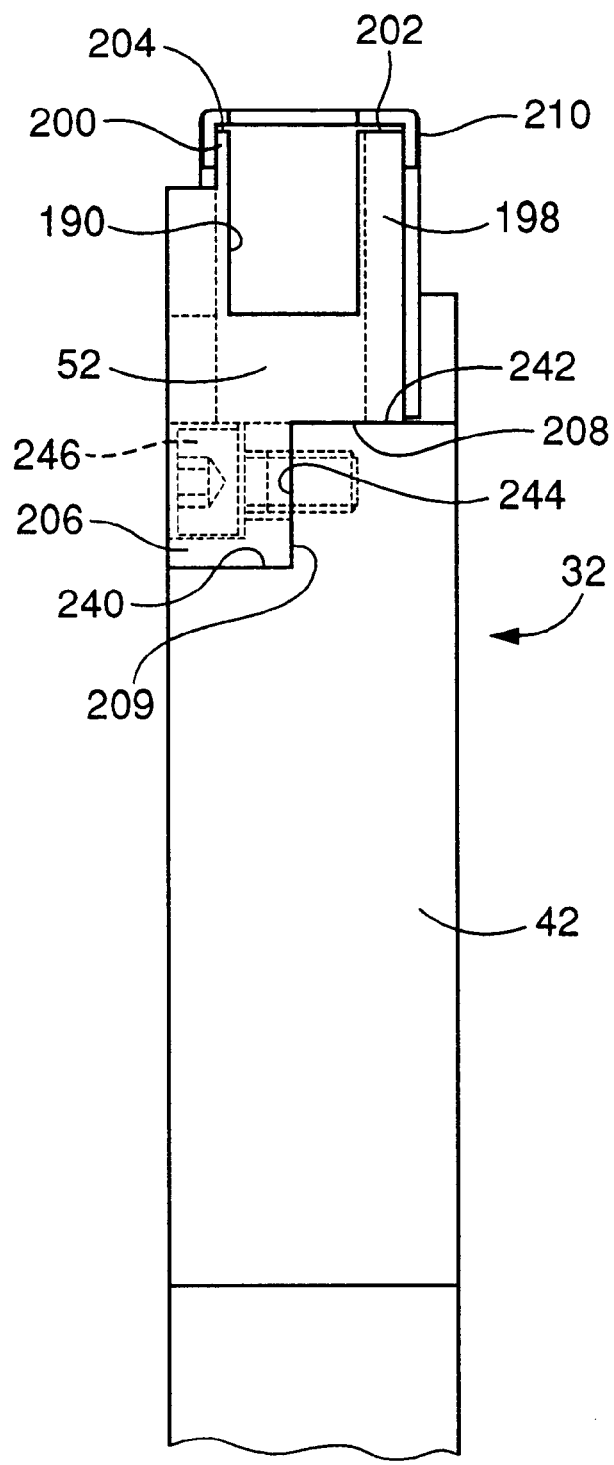
FIG. 21 is a side elevation view of an upper portion of each EC-supply unit.

After the EC tape 62 is supported and guided by the support surface 180, the tape 62 is guided by the sixth member 52 which has a groove 190 in a front portion of the each EC-supply unit 32. As shown in FIGS. 19 and 21, the sixth member 52 has a shape like an elongate block, and is detachably attached to the front portion of the first member 42. The first member 42 provides a main frame member; the sixth member 52 provides a tape-guide member; and the sixth member 52 attached to the first member 42 provides a tape-guide portion 192 of the EC-supply unit 32.

The groove 190 extends in the lengthwise direction of the sixth member 52, i.e., parallel to the EC-feed direction. As shown in FIG. 21, the groove 190 has a width and a depth which allow the embossed portions 70 to pass therethrough. The groove 190 is defined by a pair of side walls which provide a pair of support rails 198, 200, respectively. The two support rails 198, 200 has respective upper end surfaces which provide respective support surfaces 202, 204 which support and guide the respective lower surfaces of the two end portions 68 of the EC tape 62. The first support surface 202 is wider than the second support surface 204, and supports the one end portion 68 having the feed holes 74. The second support surface 204 supports the other end portion 68 free of the feed holes 74.

As shown in FIGS. 21 and 24 (24A and 24B), lengthwise opposite end portions of the sixth member 52 have respective legs 206. As shown in FIG. 21, the legs 206 are provided at respective locations distant from the first support surface 202 in the widthwise direction of the sixth member 52. The sixth member 52 has two positioning surfaces 208, 210- which are perpendicular to each other.

Figure 20:
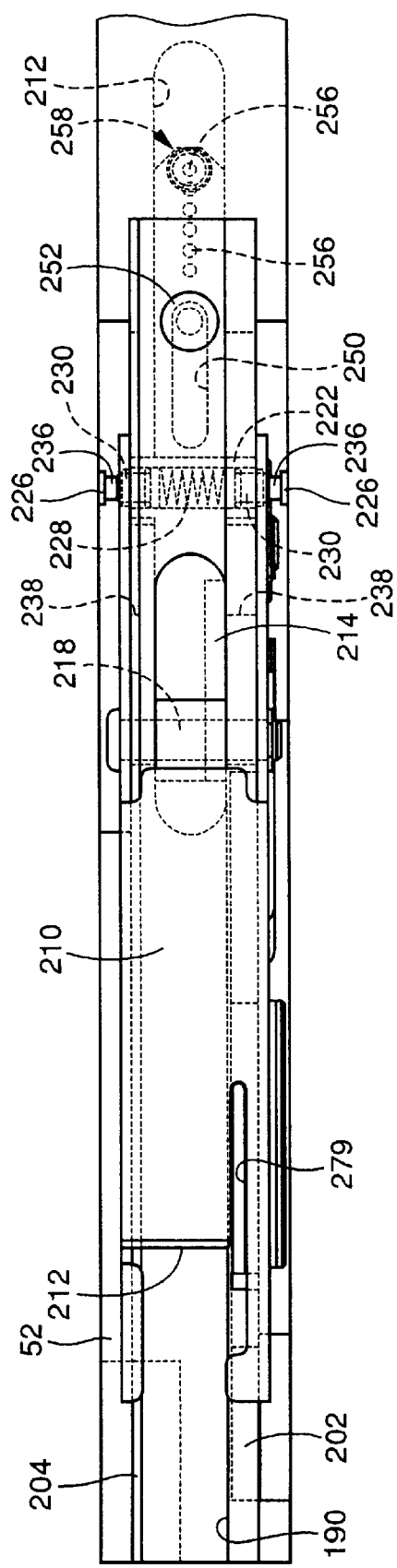
FIG. 20 is a plan view of a front portion of each EC-supply unit.

A cover member 210 is attached to the sixth member 52, and prevents the EC tape 62 from moving up off the support surfaces 202, 204. As shown in FIG. 21, the cover member 210 has a generally inverted-U-shaped cross section and, as shown in FIG. 20, a top wall of the cover member 210 covers almost all portions of the groove 190 and the support surfaces 202, 204. The cover member 210 has an opening 212 through which each EC 60 is taken by the EC sucker 22 of the EC mounting system 16.

Figure 25:
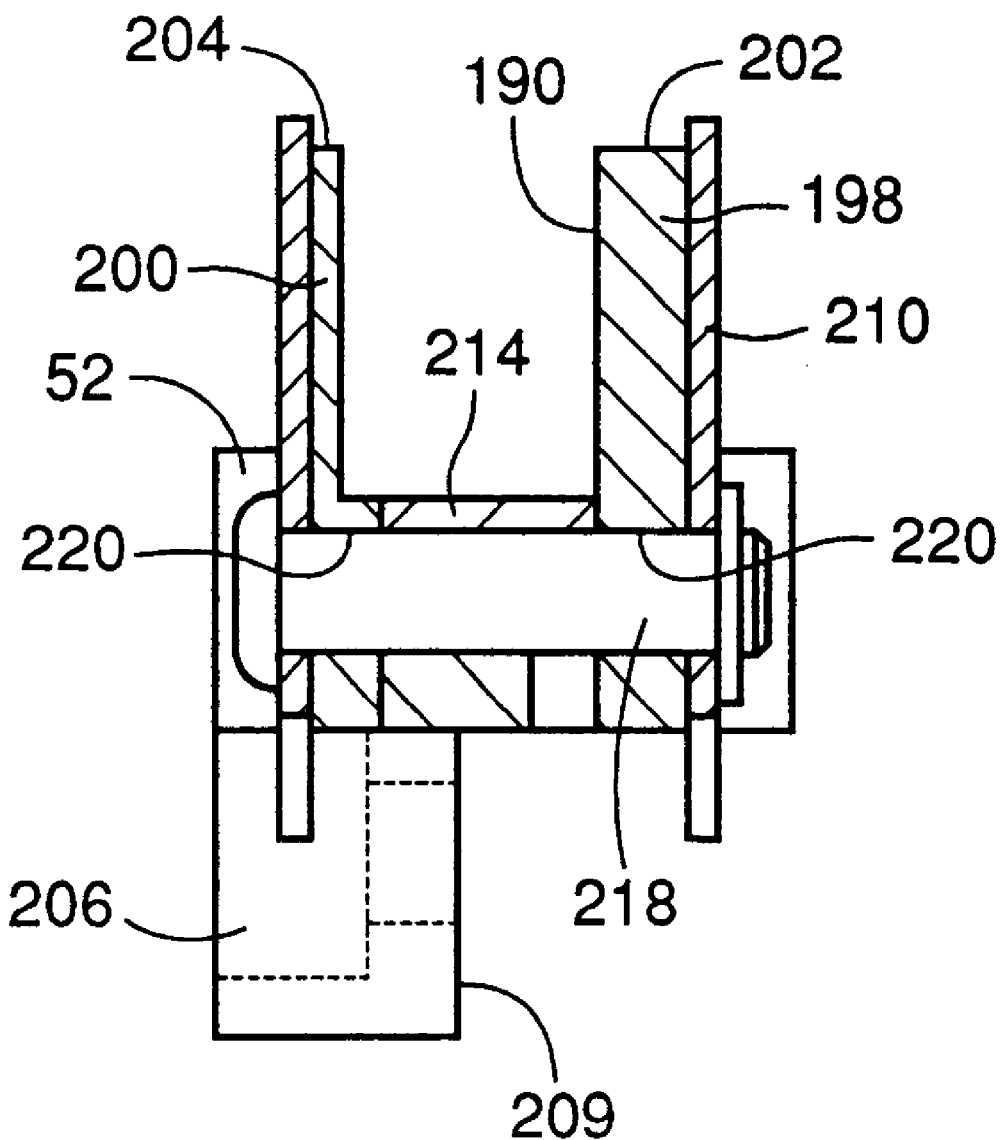
FIG. 25 is a cross-sectioned, side elevation view of the tape-guide member and the cover member, taken through a portion of the cover member that is connected to the tape-guide member.

The cover member 210 is attached to the sixth member 52 such that the cover member 210 is movable in the lengthwise direction of the sixth member 52, i.e., in opposite directions parallel to the EC-feed direction. Thus, the position of the cover member 210 relative to the frame 40 including the sixth and first members 52, 42 can be changed in the directions parallel to the EC-feed direction. A slide member 214 is movably or slideably fitted in an elongate hole 216 which is formed in the sixth member 52 such that the elongate hole 216 extends parallel to the EC-feed direction. As shown in FIG. 25, an axis member 218 is fitted in a front portion of the slide member 214 such that the axis member 218 extends perpendicularly to the EC-feed direction, i.e., parallel to the widthwise direction of the EC tape 62. Opposite end portions of the axis member 218 project out of the slide member 214 on both sides of the sixth member 52, and respective lengthwise intermediate portions of a pair of side walls of the cover member 210 are pivotally fitted on the projecting end portions of the axis member 218, respectively. Thus, the cover member 210 is attached to the sixth member 52 such that the cover member 210 is pivotable about an axis line parallel to the widthwise direction of the EC tape 62. The axis member 218 also functions to attach the slide member 214 to the sixth member 52 and attach the cover member 210 to the slide member 214. The sixth member 52 has two elongate holes 220, shown in FIGS. 24 and 25, which prevent the axis member 218 from being interfered with by the sixth member 52 when the cover member 210 and the slide member 214 are moved with each other.

Figure 23:
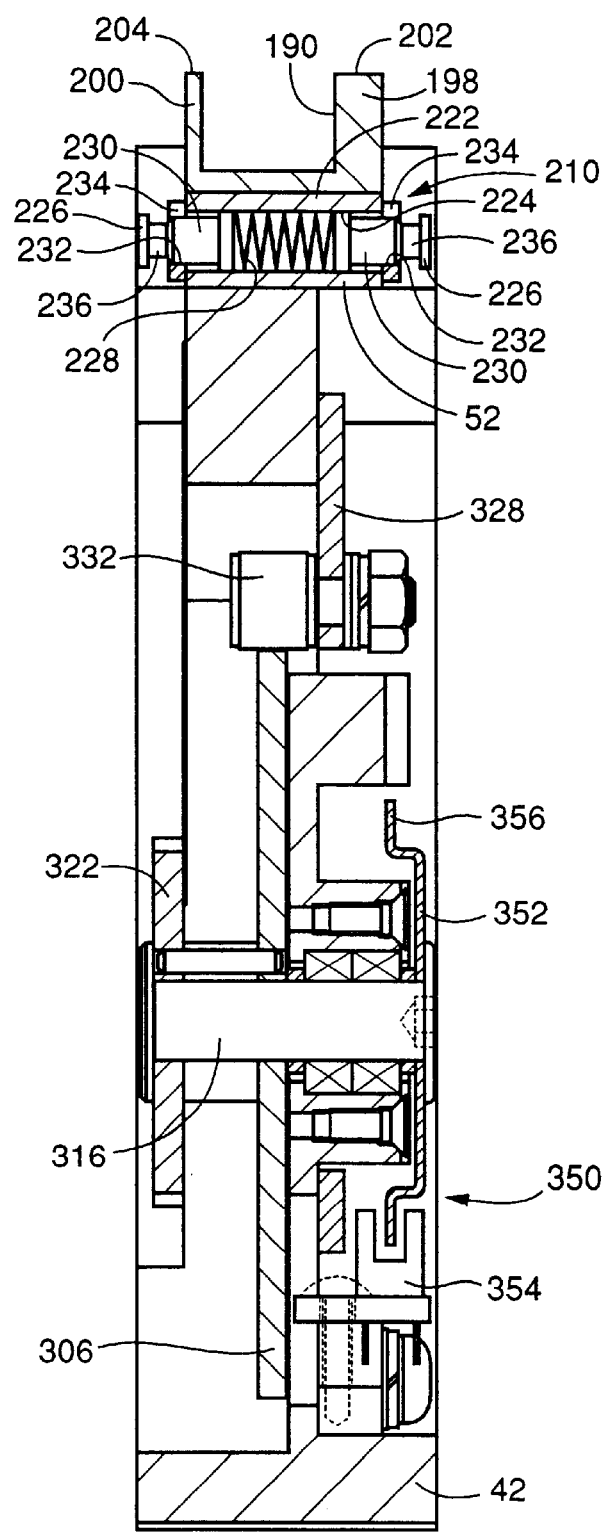
FIG. 23 is a cross-sectioned, side elevation view of each EC-supply unit, taken through a rotation-stop-position sensor thereof.

A lengthwise intermediate portion 222 of the slide member 214 has a great width, as shown in FIGS. 20 and 23, and a rear portion of the cover member 210 is engaged with the wide portion 222. As shown in FIG. 23, the wide portion 222 has a through-hole 224 which is formed through the thickness of the slide member 214 in the widthwise direction thereof. A pair of engaging pins 226 each as an engaging member are fitted in axially opposite end portions of the through-hole 224, respectively, such that the two pins 226 are oriented in opposite directions, respectively, and a spring member 228 biases the two pins 226 in those opposite directions, respectively, i.e., in respective directions in which the two pins 226 project out of the through-hole 224. Each pin 226 has a stepped shape, and a large-diameter engaging portion 23.0: of the each pin 226 is fitted in an engaging hole 232 of the cover member 210. Thus, the cover member 210 is attached to the wide portion 222 of the slide member 214. FIG. 24 shows a recess 234 which is continuous with each engaging hole 232 of the cover member 210 and which has a width smaller than the diameter of the each engaging hole 232. Thus, when the operator pivots the cover member 210 in the state in which the engaging pins 226 are retracted into the through-hole 224 against the biasing force of the spring member 228 and respective small-diameter portions 236 of the two pins 226 are positioned in the respective engaging holes 232, the cover member 210 can be disengaged from the pins 226 and can be pivoted about the axis member 218. FIG. 24 also shows a recess 238 of the sixth member 52 that allows the wide portion 222 to be moved relative to the sixth member 52. The limit of movement of each engaging pin 226 due to the biasing action of the spring member 228 is defined by a movement-limit defining member (not shown). Thus, the pins 226 are prevented from coming off the through-hole 224, which means that the movement-limit defining members also function as coming-off preventing members.

As shown in FIGS. 19 and 21, the first member 42 has two recesses 240 at two locations distant from each other in the lengthwise direction thereof. The sixth member 52 is placed on the first member 42 such that the legs 206 of the sixth member 52 are fitted in the recesses 240 of the first member 42, the first positioning surface 208 is contacted with an upper surface 242 of the first member 42, and the second positioning surface 209 is contacted with a recess-defining surface 244 of the first member 42. Thus, the sixth member 52 is accurately positioned relative to the first member 42, both in the widthwise direction of the each EC-supply unit 32 and in a vertical direction perpendicular to the widthwise and lengthwise directions of the same 32. Bolts 246 each as a fixing device are used to attach the sixth member 52 to the first member 42 such that the sixth member 52 is detachable from the first member 42. The upper surface 242 and the recess-defining surface 244 of the first member 42 function as positioning surfaces which position the six member 52 relative to the first member 42, and cooperate with the positioning surfaces 208, 209 to provide a positioning device. The second positioning surface 209 also functions as a reference plane which defines a position of the sixth member 52 relative to the first member 42 in the widthwise direction of the each EC-supply unit 32.

In addition, since the downstream-side leg 206 of the sixth member 52 as seen in the EC-feed direction is contacted with an end surface 247 of the downstream-side recess 240 of the first member 42, the sixth member 52 is positioned relative to the first member 42 in the EC-feed direction. The upstream-side recess 240 as seen in the EC-feed direction has dimensions which allow, in the state in which the sixth member 52 is thus positioned relative to the first member 42, the upstream-side leg 206 of the sixth member 52 to be fitted therein. A portion of the sixth member 52 that defines the positioning surfaces 208, 209 provides an attachment portion which is attached to the first member 42 as the main frame member. A portion of the sixth member 52 that includes the support rail 198 having the wide support surface 202 supporting the one end portion 68 having the feed holes 74, provides a portion of the sixth member 52 that corresponds to the EC-tape feeding device 90, or a sprocket 272 (described later) as an element of the feeding device 90. The sixth member 52 has both the attachment portion and the portion corresponding to the EC-tape feeding device 90, in the same half portion thereof as seen in the widthwise direction thereof.

In the state in which the sixth member 52 is fixed to the first member 42, a screw 252 is screwed with the first member 42 such that the screw 252 extends through a through-hole 248 (FIG. 24) formed through the thickness of the sixth member 52, and through an elongate hole 250 (FIG. 20) of the slide member 214. Thus, as shown in FIG. 19, the slide member 214 is fixed to the first member 42 in the state in which a head portion 254 of the screw 252 prevents the slide member 214 from moving up off the first member 42.

Before the slide member 214 is fixed to the first member 42, the position of the cover member 210 in the directions parallel to the EC-feed direction is adjusted. As shown in FIGS. 20 and 24, a rear portion of the slide member 214 has a plurality of conical holes 256 at a regular interval of distance in the lengthwise direction of the sixth member 52. Since a ball 260 of a ball plunger 258 of the first member 42 is fitted in one of the conical holes 256, the slide member 214 is positioned relative to the first member 42, and accordingly the cover member 210 is positioned relative to the first member 42. The slide member 214 has a plurality of center holes, and respective opening end portions of the center holes define the conical holes 256. As shown in FIG. 19, the ball plunger 258 includes a cylindrical casing 262 which has an externally threaded outer circumferential surface and which accommodates the ball 260, and a spring member 264 which biases the ball 260 in a direction in which the ball 260 projects out of the casing 262. The casing 262 is screwed with the first member 42. The movement of the slide member 214 is allowed by the retraction of the ball 260 into the casing 262 against the biasing force of the spring member 264 and the disengagement of the ball 20 from one conical hole 256. When the ball 260 is engaged with another conical hole 256, the slide member 214 or the cover member 210 is positioned relative to the first member 42.

The position of the cover member 210 relative to the frame 40 including the first member 42 and the sixth members 42, 52 can be changed in the same number of steps as the number of the conical holes 256, for example, to one position shown in FIG. 24A and another position shown in FIG. 24B. The position of the cover member 2.10 is changed in those steps depending on a dimension of the ECs 60 as seen in a direction parallel to the EC-feed direction, i.e., depending on a pitch at which the ECs 60 are held by the EC tape 62. Whichever position the cover member 210 may take, the cover member 210 does not cover each EC 60 being fed to the EC-supply position, thereby allowing the each EC 60 to be taken from the embossed portion 70, but covers the next or adjacent EC 60 on the upstream side of the each EC 60 being at the EC-supply position.

The cover member 210 is attached together with the sixth member 52 to the first member 42, in the state in which the cover member 210 is attached to the sixth member 52. After the sixth member 52 is attached to the first member 42, the cover member 210 is moved in the EC-feed direction to a position corresponding to the pitch at which the ECs 60 are held by the EC tape 62 (hereinafter, referred to as "the EC-hold pitch"). In the state in which the ball 260 of the ball plunger 258 is engaged with one conical hole 256 and the sixth member 52 is positioned relative to the first member 42, the screw 252 is screwed with the first member 42 through the elongate hole 250, and thus the slide member 214 or the cover member 210 is fixed to the first member 42 in the directions parallel to the EC-feed direction. Therefore, even if vibration may be input to the each EC-supply unit 32, the cover member 210 is not moved out of position relative to the first member 42. Even in this state, the cover member 210 can be disengaged from the slide member 214 and pivoted about the axis member 218.

When the operator sets an initial end portion of an EC tape 62 on the sixth member 52, first, the cover member 210 is removed from the engaging pins 226, is pivoted about the axis member 218, and is moved away from the sixth member 52. Next, the embossed portions 70 of the EC tape 62 are fitted in the groove 190, so that the two end portions 68 are placed on the two support surfaces 202, 204, respectively, and the feed holes 74 are engaged with projections of the sprocket 272 described later. Then, the cover member 210 is pivoted to cover the EC tape 62, while the pins 226 are retracted into the through-hole 224 against the biasing force of the spring 228 to a position where the respective small-diameter portions 236 of the pins 226 are aligned with the respective recesses 234 of the cover member 210. After the cover member 210 is pivoted and the small-diameter portions 236 are fitted in the respective engaging holes 232 through the respective recesses 234, the operator releases the pins 226. Thus, the engaging portions 230 are engaged with the respective engaging holes 232 because of the biasing action of the spring member 228, and the cover member 210 is attached to the slide member 214. In this state, the cover member 210 cannot be pivoted. Therefore, when the top-cover tape 66 is peeled from the carrier tape 64, the cover member 210 cannot be moved. The EC tape 62 is prevented from moving in the widthwise direction thereof, because the embossed portions 70 thereof are fitted in the groove 190 and because the two end portions 68 thereof are prevented from moving in the widthwise direction thereof, by the two side walls of the cover member 210.

After the sixth member 52 and the cover member 210 are thus fixed to the first member 42, the position of the cover member 210 is changed when the current sort of EC tapes 60 are changed to another sort of EC tapes 75. In this situation, the operator loosens the screw 252 and thereby unfastens the cover member 210 from the first member 42. Then, the operator grasps the cover member 210, and moves the slide member 214 or the cover member 210 while retracting the ball 260 of the ball plunger 258 into the casing 262 against the biasing force of the spring member 264 and thereby disengaging the ball 260 from one conical hole 256. Though the screw 252 is not removed from the first member 42, the movement of the slide member 214 relative to the screw 252 (i.e., the first member 42) is allowed by the elongate hole 250.

The cover member 210 is re-positioned relative to the first member 42, when the ball 260 is engaged with another conical hole 256 and the slide member 214 is positioned again relative to the first member 42. After this re-positioning of the cover member 210, the operator re-fastens the screw 252 and thereby fixes the cover member 210 to the first member 42 in the directions parallel to the EC-feed direction. In the present embodiment, the engaging pins 226 and the engaging holes 232 cooperate with each other to provide an attaching device which attaches the cover member 210 to the slide member 214; the slide member 214, the conical holes 256 as engaging recesses as a sort of stationary engaging portions, the ball 260 as an engaging projection as a sort of elastic engaging portion, and the spring member 264 cooperate with each other to provide a stepwise position changing device 266; and the stepwise position changing device 266 cooperates with the axis member 218 and the elongate holes 220 to provide a cover attaching device 268.

When the cover member 210 is moved to change its position in the directions parallel to the EC-feed direction, the axis member 218 is also moved together with the cover member 210 and the slide member 214. Accordingly, at any position, the cover member 210 can be pivoted about the axis member 218, so that an EC tape 62 can be set on the each EC-supply unit 32.

Next, there will be described the EC-tape feeding device 90.

Figure 22:
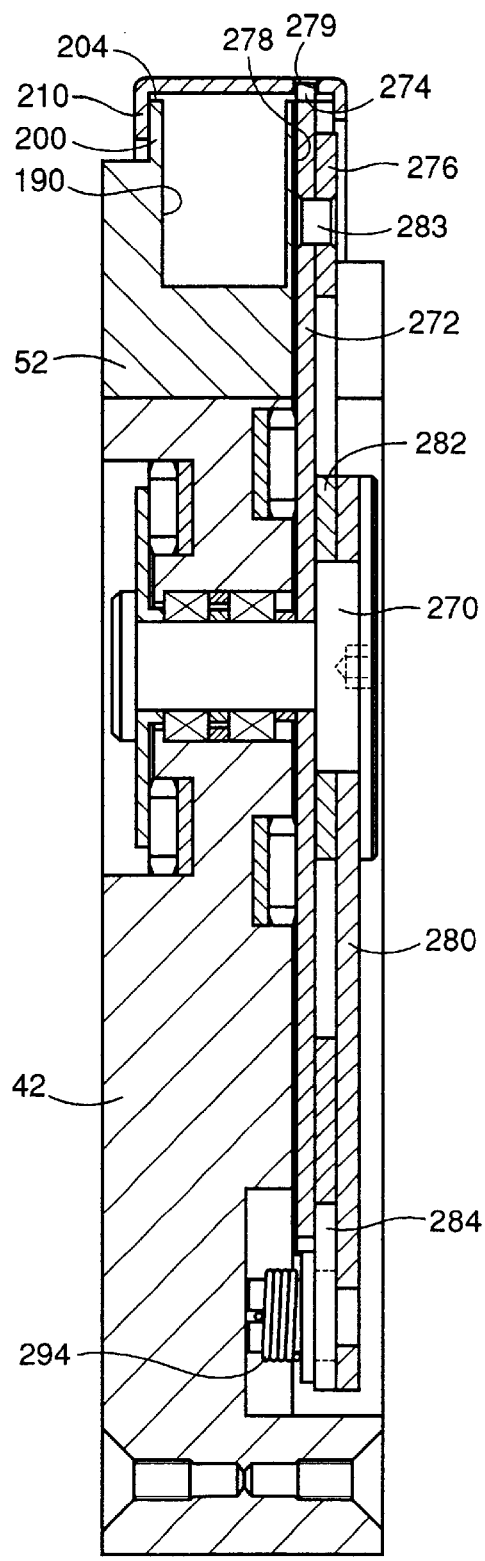
FIG. 22 is a cross-sectioned, side elevation view of each EC-supply unit, taken through a sprocket and a ratchet wheel thereof.

As shown in FIGS. 19 and 22, the first member 42 supports an axis member 270 such that the axis member 270 is rotatable about an axis line perpendicular to the EC-feed direction, i.e., parallel to the widthwise direction of the each EC-supply unit 32 and the widthwise direction of the EC tape 62. A sprocket 272 as a feed member is attached to the axis member 270 such that the sprocket 272 is not rotatable relative to the axis member 270. The sprocket 272 has a number of projections 274 which project radially outward from an entire outer circumferential surface of the sprocket 272. The projections 274 are engaged with the feed holes of 74 of the carrier tape 64. The sprocket 272 supports a ratchet wheel 276 whose diameter is smaller than that of the sprocket 272, such that the ratchet wheel 276 is concentric with the sprocket 272 and is not rotatable relative to the same 272. As shown in FIG. 24, the sixth member 52 has a recess 278 which prevents the sixth member 52 from interfering with the sprocket 272 and the ratchet wheel 276. As shown in FIG. 20, the cover member 210 has a recess 279 in a portion thereof corresponding to the feed holes 74 of the carrier tape 64, and the recess 279 prevents the cover member 210 from interfering with the projections 274 of the sprocket 272.

As shown in FIGS. 20 and 22, the axis member 270 additionally supports two pivotable members 280, 282 as two reciprocative members, such that each of the two pivotable members 280, 282 is reciprocatively pivotable relative to the axis member 270 about a common axis line. The ratchet wheel 276 has an annular shape, and is fixed with a plurality of pins 283 to the sprocket 272 such that the ratchet wheel 276 is concentrically positioned relative to the sprocket 272. As shown in FIG. 22, the second pivotable member 282 includes a base portion which is located on the same plane as that on which the ratchet wheel 276 is located, and is bent at a lengthwise intermediate portion thereof from which an end portion thereof extends radially outward on the same plane as that on which the first pivotable member 280 is located. The two pivotable members 280, 282 have the same radial length from the common axis line thereof to the respective radially outer ends thereof. The ratchet wheel 276 may be formed as an integral portion of the sprocket 272.

The two pivotable members 280, 282 support respective ratchet pawls 284, 286 at the same radial distance from the common axis line, such that the two ratchet pawls 284, 286 are pivotable about respective pins 288, 290, are engageable with teeth 292 provided on an entire outer circumferential surface of the ratchet wheel 276, and are biased toward respective directions in which the pawls 284, 286 engage the teeth 292, by respective spring members 294, 296 which are provided between the pawls 284, 286 and the corresponding pivotable members 280, 282. When each of the pivotable members 280, 282 is pivoted in a first direction (i.e., a counterclockwise direction in FIG. 19; hereinafter, referred as "the forward direction"), a corresponding one of the ratchet pawls 284, 286 remains engaged with the teeth 292; and when the each pivotable member 280, 282 is pivoted in a second direction (i.e., a clockwise direction in FIG. 19; hereinafter, referred as "the backward direction"), the corresponding one ratchet pawl 286, 284 is moved back over the teeth 292.

Therefore, when each of the pivotable members 280, 282 is pivoted in the forward direction, the ratchet wheel 276 is rotated in its forward direction and the sprocket 272 is rotated to feed forward the EC tape 62. This is an EC-tape feeding action of the EC-tape feeding device 90. However, when the each pivotable member 280, 282 is pivoted in the backward direction, the corresponding one ratchet pawl 284, 286 is moved over the teeth 292 of the ratchet wheel 276. This is a preparing action of the EC-tape feeding device 90 for its next EC-tape feeding action. Thus, each of the two pivotable members 280, 282 performs its forward and backward pivotal motions to feed forward the EC tape 62.

A stepper motor 300 as a rotary drive source as an element of a drive device, and a motion converting device 302 cooperate with each other to pivot reciprocatively the two pivotable members 280, 282 in opposite directions, respectively, that is, in such a way that when one of the two members 280, 282 is pivoted in the forward direction, the other member 282, 280 is pivoted in the backward direction and, when the one member 280, 282 is pivoted in the backward direction, the other member 282, 280 is pivoted in the forward direction. The stepper motor 300 is supported by the first member 42 such that an axis line about which the rotor of the motor 300 is rotated is parallel to the common axis line of pivotal motion of the two pivotable members 280, 282. The stepper motor 300 is rotated by an amount or angle proportional to the number of drive signals supplied thereto.

The motion converting device 302 includes a plate cam 306 as a rotary cam as a sort of cam, a bell-crank lever 308 as a cam follower, and two connection links 310, 312 each as a connecting device as a sort of motion transmitting device. An outer circumferential surface of the plate cam 306 provides a cam surface 314. The plate cam 306 is attached to the first member 42 via an axis member 316 such that the cam 306 is rotatable about an axis line parallel to the common axis line of pivotal motion of the two pivotable members 280, 282. When the rotation of the stepper motor 300 is transmitted to the plate cam 306 via gears 318, 320, 322, the cam 306 is rotated. The cam surface 314 of the plate cam 306 has a generally elliptic shape which includes two identical portions having respective identical shapes, as seen in the circumferential direction of the cam 306. More specifically described, the cam surface 314 includes two first portions the distance from the axis member 316 of each of which continuously increases in the circumferential direction of the cam 306, and two second portions the distance from the axis member 316 of each of which continuously decreases in the same direction. The two first portions are distant from each other by 1800 degrees about the axis member 316, the two second portions are distant from each other by 180 degrees about the same 316, and the two first portions and the two second portions are alternate with each other about the same 316. Thus, the four portions in total are distant from one another by a regular angular interval of 90 degrees about the axis member 316.

Each of the above-indicated four portions of the cam surface 314 is so formed that the bell-crank lever 308 as the cam follower is pivoted according to a known modified constant velocity curve. Therefore, while the bell-crank lever 308 follows each of the above-indicated first portions of the cam surface 314 over 90 degrees, the lever 308 is first pivoted positive-acceleratedly, subsequently at a constant velocity, and then negative-acceleratedly (i.e., deceleratedly); and while the lever 308 follows each of the second portions of the cam surface 314 over 90 degrees, the lever 308 is pivoted, at respective angles or timings, strictly symmetrically with the pivotal motion thereof along the each first portion, therefore, is pivoted at respective acceleration values whose respective absolute values are equal to those of respective acceleration values at corresponding timings when the lever 308 follows the each first portion but whose positive or negative signs are opposite to those of the latter acceleration values. Thus, the cam surface 34 has a shape which assures that while the plate cam 306 is rotated at a constant velocity, the velocity of pivotal motion of the bell-crank lever 308 is smoothly increased from zero, is kept at a constant velocity for a while, and then is smoothly decreased to zero, and additionally is smoothly decreased from zero, is kept at a constant velocity for a while, and then is smoothly increased to zero.

The bell-crank lever 308 is attached to the first member 42 via an axis member 324 such that the lever 308 is pivotable about an axis line parallel to the common axis line of pivotal motion of the two pivotable members 280, 282. The lever 308 includes two arms 326, 328 which support respective rollers 330, 332 which are engaged with two portions of the cam surface 314 that are angularly distant from each other by about 90 degrees. Therefore, as the plate cam 306 is continuously rotated in a certain direction, the bell-crank lever 308 is forcedly pivoted in its forward and backward directions, in an alternate manner, so that the two arms 326, 328 of the lever 308 are reciprocatively pivoted in a same direction by a same angle irrespective of which direction the lever 308 may be pivoted in. The forward and backward directions of pivotal motion of the lever 308 correspond to a clockwise and a counterclockwise direction in FIG. 19, respectively.

The two arms 326, 328 have a same length, and respective one circular end portions 334 of the two connection links 310, 312 are pivotally connected to respective end portions of the two arms 326, 328 that are at a same distance from the axis member 324. The respective other circular end portions 334 of the two connection links 310, 312 are pivotally connected to respective end portions of the two pivotable members 280, 282 that are at a same distance from the axis member 270. Each of the respective end portions of the two pivotable members 280, 282 and the two arms 326, 328 to which the circular end portions 334 of the two links 310, 312 are connected, has a recess 336 including a circular portion and a tapered portion. Thus, the respective circular end portions 334 of the links 310, 312 are pivotally connected to the respective circular portions of the respective recesses 336 of the pivotable members 280, 282 and the arms 326, 328, on a common plane. In other words, the arms 326, 328, the links 310, 312, and the pivotable members 280, 282 are pivotally connected to one another on the common plane. The first member 42 supports a plurality of hold-down members 338 which prevent the connection links 310, 312 from coming off the arms 326, 328 and the pivotable members 280, 282, respectively.

When the bell-crank lever 308 is pivoted reciprocatively, forward and backward, by the plate cam 306, the two pivotable members 280, 282 are pivoted reciprocatively, forward and backward, via the respective connection links 310, 312. However, the two connection links 310, 312 connect the two pivotable members 280, 282 to the two arms 326, 328, respectively, such that the two members 280, 282 are pivoted by a same angle but in opposite directions, respectively, that is, such that when one of the two members 280, 282 is pivoted forward, the other member 282, 280 is pivoted backward and, when the one member 280, 282 is pivoted backward, the other member 282, 280 is pivoted forward. The two connection links 310, 312 are connected to the two pivotable members 280, 282 and the two arms 326, 328, such that when the two members 280, 282 are positioned at respective middle angles of respective angular ranges within which the two members 280, 282 are allowed to pivot, the two links 310, 312 extend perpendicular to the corresponding members 280, 282 and such that when the two arms 326, 328 are positioned at respective middle angles of respective angular ranges within which the two arms 326, 328 are allowed to pivot, the two links 310, 312 extend perpendicular to the corresponding arms 326, 328. The two arms 326, 328 have a same length, i.e., a same distance between the axis member 324 and each of the respective portions of the two arms 326, 328 to which the two links 310, 312 are connected. The two pivotable members 280, 282 have a same length, i.e., a same distance between the axis member 270 and each of the respective portions of the two members 280, 282 to which the two links 310, 312 are connected. Therefore, the two arms 326, 328 are always pivoted by a same angle in a same direction, whereas the two pivotable members 280, 282 are always pivoted by a same angle but in opposite directions, respectively.

When the bell-crank lever 308 is pivoted in its forward direction by the rotation of the plate cam 306, the second pivotable member 282 is pivoted forward so that the sprocket 272 is rotated and the EC tape 62 is fed forward. This is one EC-tape feeding action of the pivotable member 282. During this, the first pivotable member 280 is pivoted backward so that the first ratchet pawl 284 is moved back over the teeth 292 of the ratchet wheel 276, and thus prepares for the next EC-tape feeding action thereof. When the lever 308 is pivoted in its backward direction, the second pivotable member 282 is pivoted backward so that the second ratchet pawl 286 is moved back over the teeth 292 of the ratchet wheel 276, and thus prepares for the next EC-tape feeding action thereof, and the first pivotable member 280 is pivoted forward so that the sprocket 272 is rotated forward, and thus performs one EC-tape feeding action. When one of the two pivotable members 280, 282 is pivoted backward and a corresponding of the two ratchet pawls 284, 286 is moved over the teeth 292, the ratchet wheel 276 is not rotated backward, because the other member 282, 280 is pivoted forward to rotate the ratchet wheel 272 forward. The ratchet wheel 276 cooperates with each of the two ratchet pawls 284, 286 to provide a one-way pivotal-motion transmitting device which transmits the forward pivotal motion of a corresponding one of the two pivotable members 280, 282 to the sprocket 272 but does not transmit the backward pivotal motion of the corresponding one pivotable member 280, 282 to the same 272. Thus, the two one-way pivotal-motion transmitting devices commonly include the ratchet wheel 272.

Figure 26:
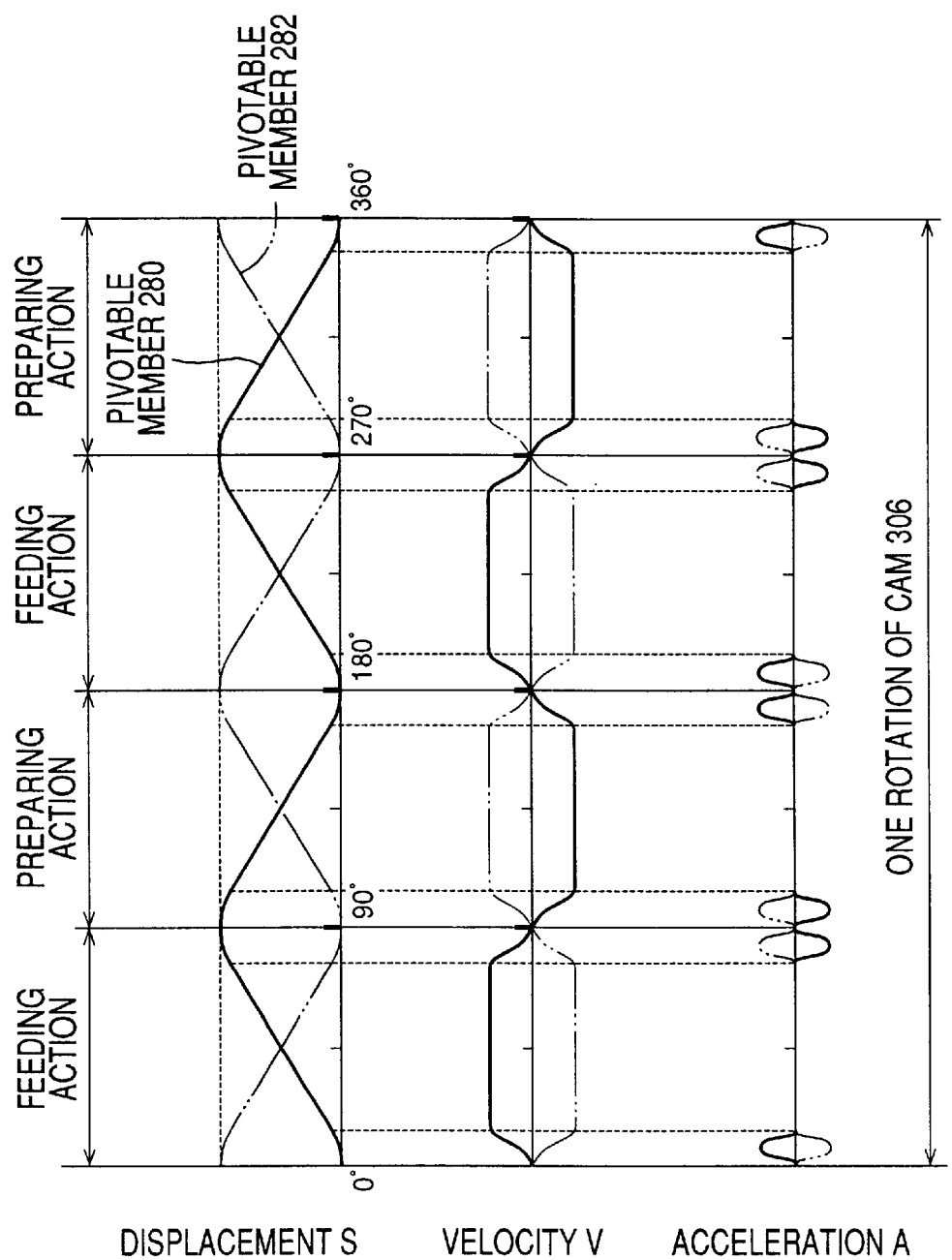
FIG. 26 is a chart representing a relationship between the rotation angle of a plate cam of the EC-tape feeding device and the action, displacement, velocity, and acceleration of each of two pivotable members of the feeding device.

As described above, the cam surface 314 of the plate cam 306 has a generally elliptic shape including two identical portions having an identical shape. As indicated at solid line in FIG. 26, the first pivotable member 280 performs two EC-tape feeding actions and two EC-tape-feed preparing actions, while the plate cam 306 is rotated one time, i.e., over 360 degrees. The second pivotable member 282 does so but, as indicated at two-dot chain line, has an angular-phase difference of 90 degrees from the first member 280. Each time the plate cam 306 is rotated by 90 degrees, the bell-crank lever 308 changes its pivoting direction, and the two pivotable members 280, 282 exchange their pivoting directions with each other and alternately perform their EC-tape feeding actions. As described above, the cam surface 314 is so formed that the bell-crank lever 308 is pivoted according to a modified constant velocity curve. As shown in FIG. 26, the acceleration (and deceleration), A, of each of the two pivotable members 280, 282 is smoothly changed, that is, the each pivotable member 280, 282 is smoothly accelerated from the velocity, V, of zero and smoothly decelerated to the velocity V of zero, and additionally is smoothly decelerated from the velocity V of zero and smoothly accelerated to the velocity V of zero.

Therefore, the inertia produced when the sprocket 272 and the ratchet wheel 276 are stopped is small. In addition, the biasing force of each of the spring members 294, 296 to bias a corresponding one of the ratchet pawls 284, 286 in a direction to engage the teeth 292 of the ratchet wheel 272 is predetermined at a value which can prevent the corresponding one ratchet pawl 284, 286 from being pivoted by the sprocket 272 and the wheel 276 against the biasing force of the each spring member 294, 296. Thus, the sprocket 272 and the ratchet wheel 276 are prevented from being rotated in excess of an angular position which is given thereto by the forward pivotal motion of each of the pivotable members 280, 282. Accordingly, each of the ECs 60 held by the EC tape 62 is accurately positioned at the EC-supply position of the each EC-supply unit 32.

A pitch at which the EC tape 62 is fed when each of the two pivotable members 280, 282 performs one EC-tape feeding action, will be referred to as "the reference pitch". The reference pitch is equal to the smallest one of respective different pitches at which ECs are held by different sorts of EC tapes. As described previously, in the case where different sorts of ECs having different dimensions are held at different pitches by different sorts of EC tapes, the different pitches are the reference pitch or the product of the reference pitch and an integral number M not less than two. Therefore, when the first EC tape 62 holding the ECs 60 at the smallest pitch, i.e., the reference pitch is fed over a distance equal to the reference pitch, the plate cam 306 needs to be rotated by 90 degrees to drive the sprocket 272 one time; and when the second EC tape 75 holding the ECs 60 at a pitch equal to twice the reference pitch is fed over a distance equal to twice the reference pitch, the cam 306 needs to be rotated by 180 degrees to drive the sprocket 272 two times. The first EC tape 62 provides a first sort of EC tape, and the second EC tape 75 provides a second sort of EC tape. Similarly, when an EC tape holding ECs at a pitch equal to the product of the reference pitch and the integral number M (not less than three) is fed over a distance equal to that product, the cam 306 needs to be rotated by (90×M) degrees to drive the sprocket 272, M times.

Respective gear ratios of the gears 318, 320, 322 which transmit the rotation of the stepper motor 300 to the plate cam 306 are predetermined such that when the motor 300 is fully rotated one time, the cam 306 is rotated by 90 degrees and the sprocket 272 is driven one time. Therefore, when the sprocket 272 needs to be driven one time, the motor 300 is fully rotated one time; and when the sprocket 272 needs to be driven M times (not less than two), the motor 300 is rotated M times. Thus, the motor 300 can be easily controlled.

The first member 42 supports a rotation-stop-position detecting device 350 which detects that the plate cam 306 is positioned at any one of its four rotation stop positions which are equiangularly distant from one another by 90 degrees. The detecting device 350 includes a detection plate 352 fixed to the axis member 316 to which the plate cam 306 is fixed, and a rotation-stop-position sensor 354. The detection plate 352 has four dogs 356 which are equiangularly distant from one another about the axis member 316. The rotation-stop-position sensor 354 is provided by a transmission-type optical sensor which includes a light emitter and a light receiver. When the plate cam 306 is positioned at any one of the four rotation-stop positions, a corresponding one of the four dogs 356 interrupts the light emitted by the light emitter and prevents the light receiver from receiving the light.

Irrespective of whether the sprocket 272 needs to be driven one time or M times, the rotation-stop-position sensor 354 produces a stop-position signal, so long as the stepper motor 300 does not go out of synchronism and accordingly accurately stops the plate cam 306 at one of its rotation-stop positions. However, if the motor 300 goes out of synchronism and accordingly does not stop the cam 306 at any rotation-stop positions, the light receiver receives the light emitted by the light emitter and accordingly the sensor 354 does not produce the stop-position signal. Thus, the unit controller 500 recognizes that the stepper motor 300 is out of synchronism, and operates for eliminating the difference between the number of drive signals supplied to the motor 300 and the current rotation position of the same 300. More specifically described, if the stop-position signal is produced when the motor 300 is additionally rotated by a predetermined small angle, the motor 300 is further rotated so that one of the dogs 356 is aligned with the respective centers of the light emitter and receiver as seen in the direction of rotation of the detection plate 352. On the other hand, if the stop-position signal is not produced, the unit controller 500 immediately informs the operator of the occurrence of an abnormality, for example, operates an alarm device 532 (FIG. 31) to produce an alarm sound in a manner described later. Alternatively, the controller 500 may do so after having tried a predetermined number of times to rotate additionally the motor 300 and thereby obtain the stop-position signal.

Next, the TCT treating device 92 will be described in detail.

Figure 15:
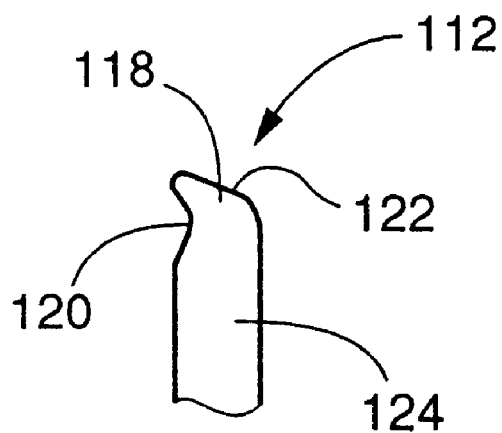
FIG. 15 is a side elevation view of an inverted-J-shaped projection of the connection member.
Figure 27:
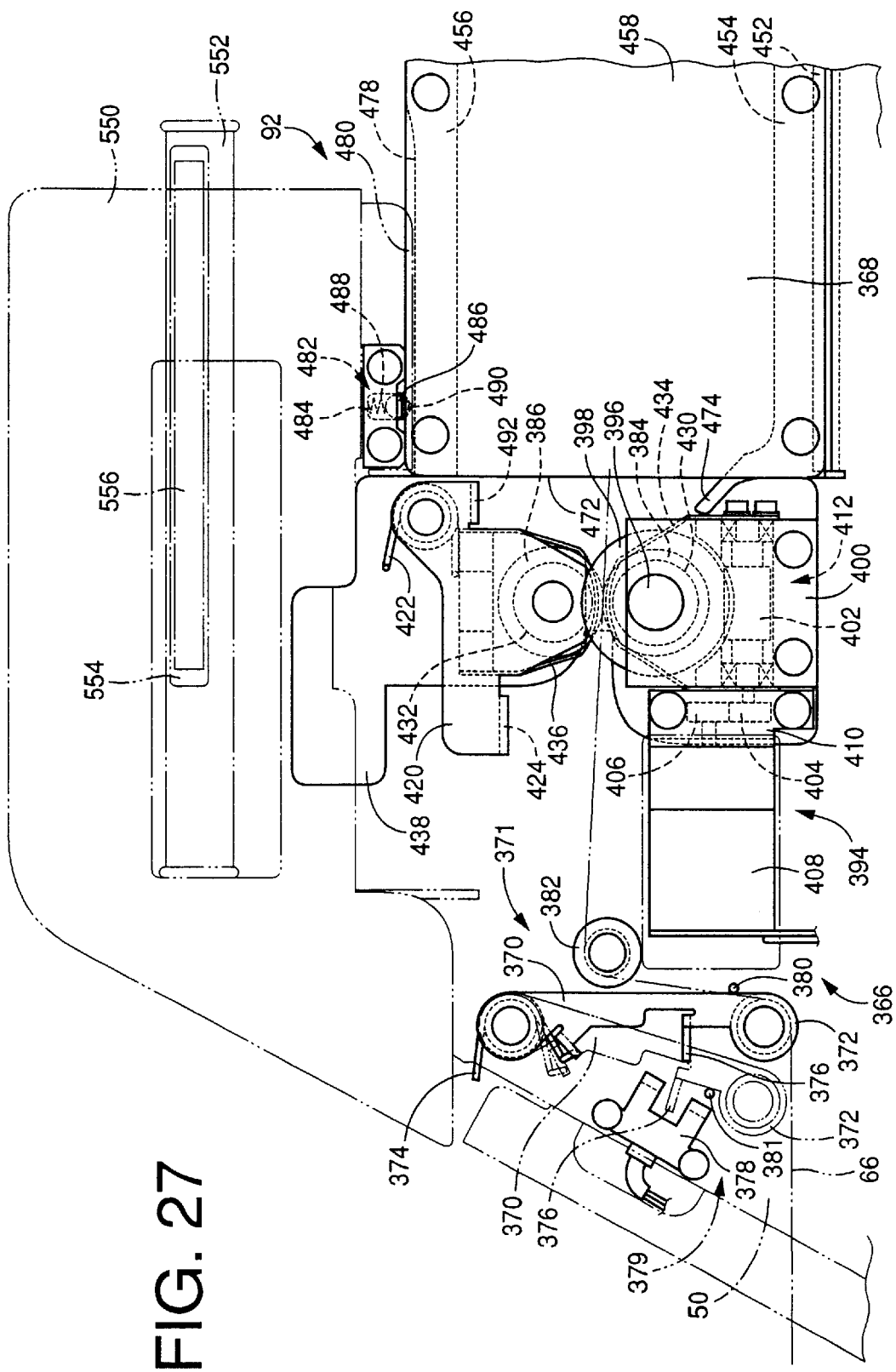
FIG. 27 is a front elevation view of a top-cover-tape ("TCT") treating device of one of the EC-supply units.

As shown in FIG. 27, the TCT treating device 92 includes a TCT feeding device 366 and a TCT collecting box 368. As shown in FIG. 15, the fifth member 50 fixed to the first member 42 has a shape like a plate, is thinner than the same 42, and projects upward from the same 42. The first member 42 provides a main frame member, the fifth member 50 provides a secondary frame member, and the first and fifth members 42, 50 provides respective elements of a frame 369 of the TCT feeding device 366.

As shown in FIG. 27, a roller 382 is attached to a side surface of the fifth member 50 such that the roller 382 is rotatable about an axis line parallel to the widthwise direction of the top cover tape ("TCT") 66. The TCT 66 which is peeled from the carrier tape 64 is folded back about 180 degrees at an end of the opening 212 of the cover member 210, and is engaged with the roller 382 such that the widthwise direction of the TCT 66 is substantially horizontal and is parallel to the widthwise direction of the each EC-supply unit 32. The opening 212 of the cover member 210 and the roller 382 cooperate to define a path along which the TCT 66 is fed. The roller 382 has a pair of flanges (not shown) which prevent the TCT 66 from moving out of position in its widthwise direction.

The fifth member 50 supports a tension adjusting device 371 which is provided on an upstream side of the roller 382 as seen in the direction in which the TCT 66 is fed (hereinafter, referred to as "the TCT-feed direction"), that is, is provided such that the tension adjusting device 371 is nearer to the opening 212 of the cover member 210 than the roller 382. The tension adjusting device 371 includes a roller-support lever 370 as a roller-support member, a roller 372 supported by the lever 370, and a spring member 374 as an elastic member as a sort of biasing device. The roller-support lever 370 is attached, at one end portion thereof, to the fifth member 50 such that the lever 370 is pivotable about an axis line parallel to the widthwise direction of the TCT 66.

The roller 372 is rotatably attached to the other end portion of the roller-support lever 370. The lever 370 has a length which can cross the path of feeding of the TCT 66, and supports the roller 372 such that the roller 372 is movable in a direction in which the roller 372 crosses the path. The spring member 374 whose one end is engaged with the fifth member 50 biases the roller-support lever 370 in a direction in which the roller 372 engages and bends the TCT 66 and thereby changes the path of feeding of the same 66. The roller 372 has a pair of flanges (not shown) which prevent the TCT 66 from moving out of position in its widthwise direction.

The roller-support lever 370 includes a detection member 376 as a detectable portion that projects in a direction (i.e., clockwise in FIG. 27) opposite to the direction in which the spring member 374 biases the lever 370. The fifth member 50 supports a roller-position sensor 378 at a downstream-side end of locus of movement of the detection member 376 as seen in the direction of projection of the same 376. The roller-position sensor 378 is provided by a transmission-type optical sensor which includes a light emitter and a light receiver and, when the roller-support lever 370 is pivoted or moved against the biasing force of the spring member 374 so that the detection member 376 interrupts the light emitted by the light emitter and prevents the light receiver from receiving the light, the sensor 370 detects that the lever 370 or the roller 372 has reached a predetermined position. The roller-position sensor 378 and the detection member 376 cooperate with each other to provide a roller-position detecting device 379.

The limit of pivotal motion of the roller-support lever 370 due to the biasing action of the spring member 374 is defined by a stopper member 380 supported by the fifth member 50, and the limit of pivotal motion of the lever 370 in the direction toward the roller-position sensor 378 is defined by a stopper member 381 supported by the fifth member 50. The second stopper 381 is provided at a position which assures that the stopper 381 stops the lever 370 after the detection member 376 interrupts the light emitted by the light emitter of the roller-position sensor 378, and before the member 376 interferes with the sensor 378.

The TCT 66 which is engaged with the roller 372 is additionally engaged with the roller 382, and is further pinched by a pair of feed gears 384, 386 as TCT-feed rotatable members. The tension adjusting device 371 is provided on an upstream-side of the feed gears 384, 386 in the direction of feeding of the TCT 66. The axis line of rotation of the roller 382 is level with respective meshing portions of the feed gears 384, 386. Thus, the TCT 66 which leaves the roller 382 easily enters and leaves the feed gears 384, 386 in a direction perpendicular to a straight line connecting between respective axis lines of rotation of the feed gears 384, 386.

Figure 28:
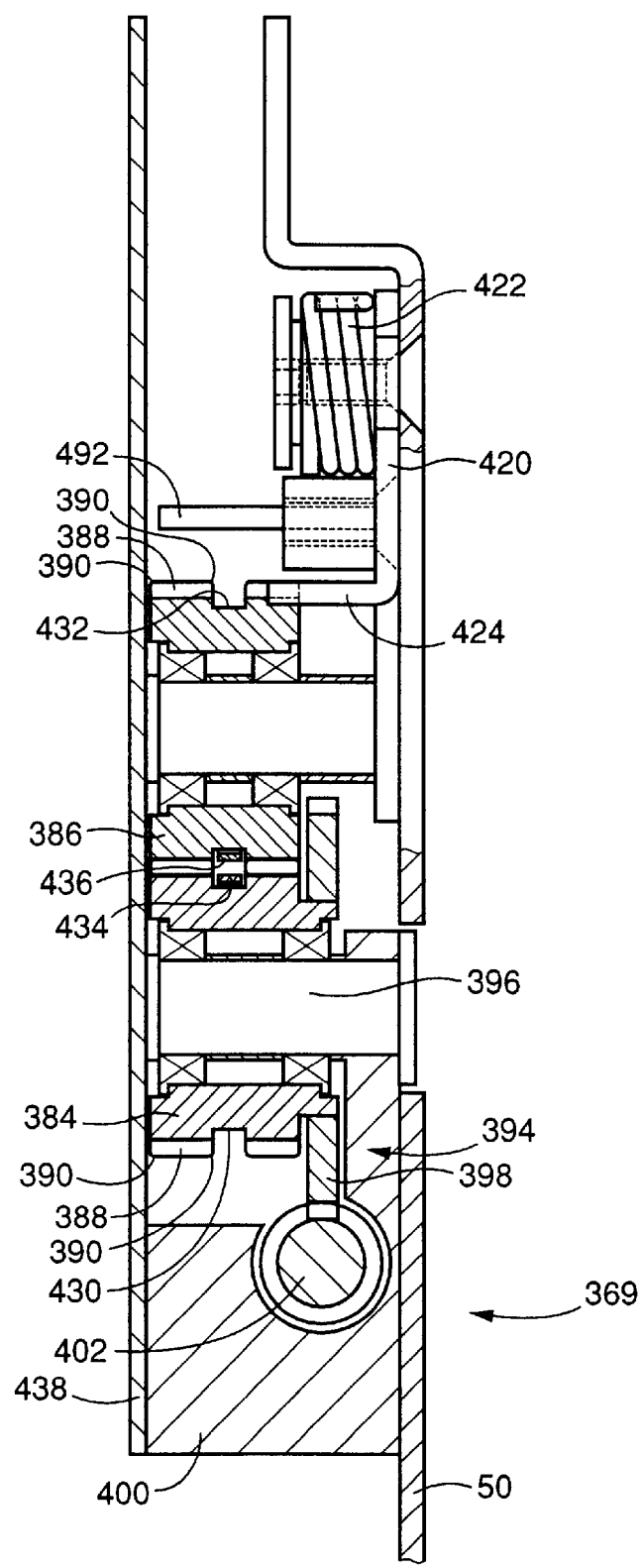
FIG. 28 is a cross-sectioned, side elevation view of a TCT feeding device as an element of the TCT treating device.

The two feed gears 384, 386 have a same size and are provided by respective moldings each formed of aluminum. As shown in FIG. 28, end portions of each tooth 388 of each feed gear 384, 386 are rounded to provide rounded portions 390. The first feed gear 384 is rotated by a rotary drive device 394. As shown in FIG. 28, an axis member 396 is supported by the fifth member 50 such that the axis member 396 extends parallel to the widthwise direction of the TCT 66, i.e., a direction perpendicular to the direction of feeding of the TCT 66, and the feed gear 384 is rotatably attached to the axis member 396. A worm wheel 398 is provided as an integral portion of the first feed gear 384. The worm wheel 398 is meshed with a worm 402 which is supported by a support block 400 fixed to the fifth member 50, such that the worm 402 is rotatable about an axis line perpendicular to the widthwise direction of the TCT 66. When the worm 402 is rotated by a DC (direct current) motor 408 as a sort of electric motor as a drive source, via gears 404, 406 (FIG. 27), the feed gear 384 is rotated.

The DC motor 408 is attached to a bracket 410 fixed to the fifth member 50, such that an axis line of rotation of a rotor of the motor 408 is parallel to the axis line of rotation of the worm 402, that is, is perpendicular to the widthwise direction of the TCT 66. The worm 402 and the worm wheel 398 cooperate with each other to transmit or transform the rotation of the rotor of the DC motor 408 about the axis line perpendicular to the widthwise direction of the TCT 66, into the rotation of the feed gear 384 about the axis line parallel to the widthwise direction of the TCT 66. Therefore, the each EC-supply unit 32 can have a smaller widthwise dimension as compared with the case where the DC motor 408 would be provided such that the axis line of rotation of its rotor is parallel to the widthwise direction of the TCT 66. The worm wheel 398, the worm 402, and the gears 404, 406 cooperate with one another to provide a rotation transmitting device 312, which cooperates with the DC motor 408 to provide the rotary drive device 394.

The second feed gear 386 is rotatably supported by a gear-support lever 420 as a rotatable-member-support lever as a sort of rotatable-member-support member that is pivotally attached to the fifth gear 50 at a level higher than the first feed gear 384. A spring member 422 as an elastic member as a sort of biasing device that is provided between the lever 420 and the fifth member 50 biases the lever 420 in a direction toward the first feed gear 384. Thus, the second feed gear 386 can be moved toward, and away from, the first feed gear 384. The straight line connecting between the respective axis lines of rotation of the two feed gears 384, 386 is vertical, and the two feed gears 384, 386 are meshed with each other on the vertical straight line.

The gear-support lever 420 includes an operable portion 424 which extends in a direction parallel to the widthwise direction of the TCT 66. The operator pivots, with his or her fingers, the operable portion 424 of the lever 420 against the biasing force of the spring member 422, and thereby moves the second feed gear 386 away from the first feed gear 384. In this state, the operator can insert an end portion of the TCT 66 in between the two feed gears 384, 386. When the operator releases his or her fingers from the operable portion 424, the second feed gear 386 is biased and moved toward the first feed gear 384, so that the end portion of the TCT 66 is pinched between the respective teeth 388 of the two feed gears 384, 386.

Figure 29:
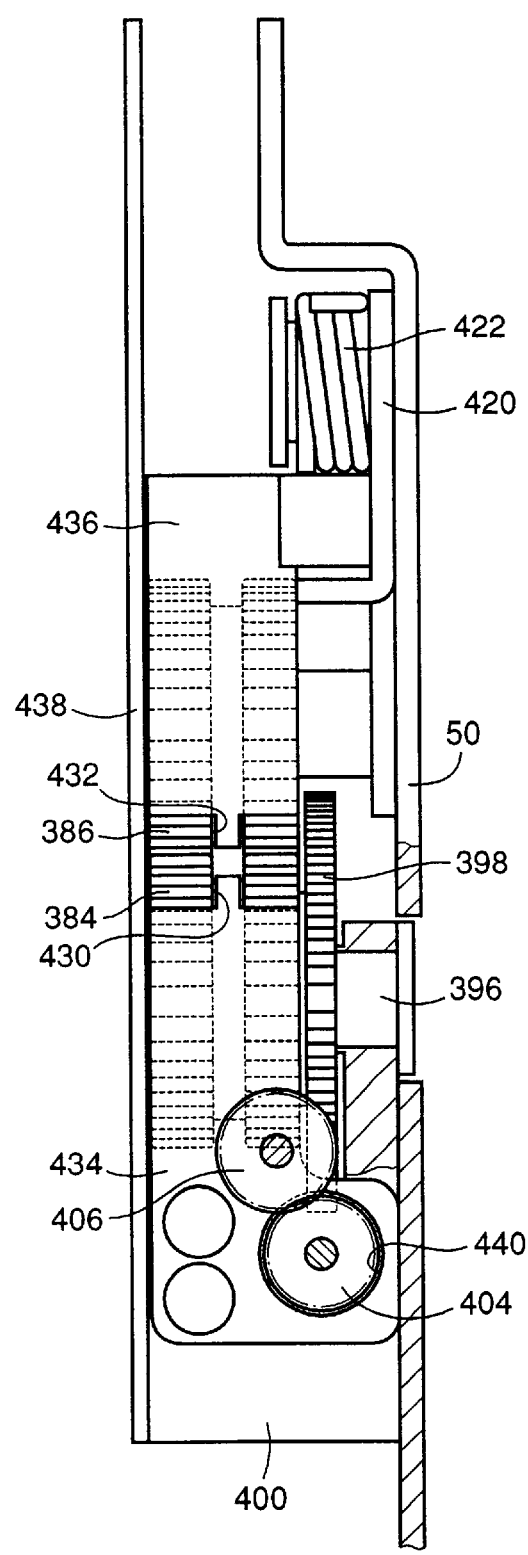
FIG. 29 is a partly cross-sectioned, side elevation view of the TCT feeding device.

As shown in FIGS. 28 and 29, the two feed gears 384, 386 have, at respective axially middle portions thereof, respective annular scraper grooves 430, 432 which are formed in respective outer circumferential surfaces thereof. Two scrapers 434, 436 are partly fitted in the two scraper grooves 430, 432, respectively. The scrapers 434, 436 are provided by respective metallic thin plates.

The first scraper 434 provided for the first feed gear 384 includes a lengthwise middle narrowed portion whose width assures that the middle narrowed portion can be fitted in the first scraper groove 430; two lengthwise intermediate widened portions which are located on both sides of the middle narrowed portion and whose width is equal to that of the first feed gear 384; and lengthwise opposite end portions whose width is greater than that of the gear 384, as shown in FIG. 29, and is somewhat smaller than the distance between the fifth member 50 and a cover member 438 which is fixed to the support block 400 to cover the feed gears 384, 386. The cover member 438 is provided adjacent to the feed gears 384, 386 in a direction parallel to the respective axis lines of rotation of the gears 384, 386, such that the cover member 438 covers a side surface of the fifth member 50 from an upstream portion of the side surface with respect to the respective meshing portions of the gears 384, 386 as seen in the direction of feeding of the TCT 66, via a portion of the surface corresponding to those meshing portions, to a downstream portion of the surface adjacent to the TCT collecting box 368. The cover member 438 cooperates with the first and fifth members 42, 50 to provide the frame 369 of the TCT feeding device 366.

The narrowed middle portion of the first scraper 434 is fitted in the first scraper groove 430, the two widened portions of the same 434 on both sides of the middle portion that are not fitted in the groove 430 are bent along the first feed gear 384, and the two end portions of the same 434 are fixed to the support block 400. That is, a portion of the first scraper 434 is fitted in the first scraper groove 430, such that that portion of the scraper 434 is present in the respective meshing portions of the two feed gears 384, 386. Thus, the first scraper 434 is continuously present from a position upstream of the first feed gear 384 to a position downstream of the same 384 as seen in the direction of feeding of the TCT 66. Since the first scraper groove 430 is deeper than respective tooth grooves of the teeth 388 of the first feed gear 384, the portion of the first scraper 434 that is present in the meshing portions of the feed gears 384, 386 does not interfere with the feeding of the TCT 66. In addition, the first scraper 434 starts guiding the TCT 66 just when the TCT 66 leaves the meshing portions of the feed gears 384, 386. All the above explanations are true with the second scraper groove 432, the second scraper 436, and the second feed gear 386.

As shown in FIG. 29, the first scraper 434 has an opening 440 which is for preventing the scraper 434 from interfering with the worm 402. The first scraper 434, except for its middle portion fitted in the first scraper groove 430, is provided in close contact with the cover member 438, which contributes to preventing the TCT 66 from entering a space possibly left between the cover member 438 and the first feed gear 384.

Like the first scraper 434, the second scraper 436 provided for the second feed gear 386 includes a lengthwise middle narrowed portion whose width assures that the middle narrowed portion can be fitted in the second scraper groove 432; and two widened portions which are located on both sides of the middle narrowed portion and whose width is equal to that of the second feed gear 386. The narrowed middle portion of the second scraper 436 is fitted in the second scraper groove 432 of the second feed gear 386, the two widened portions of the same 436 on both sides of the middle portion that are not fitted in the groove 432 are bent along the second feed gear 386, and opposite end portions of the same 436 are fixed to the gear-support lever 420. That is, a portion of the second scraper 436 is fitted in the second scraper groove 432, such that that portion of the scraper 436 is present in the respective meshing portions of the two feed gears 384, 386. Thus, the second scraper 436 is continuously present from a position upstream of the second feed gear 386 to a position downstream of the same 386 in the direction of feeding of the TCT 66. The second scraper 436, except for its middle portion fitted in the second scraper groove 432, is provided in close contact with the cover member 438, which contributes to preventing the TCT 66 from entering a space possibly left between the cover member 438 and the second feed gear 386. A material having a low friction coefficient, such as polytetrafluoroethylene, is applied to respective surfaces of the scrapers 434, 436 that are exposed to the path of feeding of the TCT 66, to lower respective friction coefficients of those surfaces of the same 434, 436.

Thus, the two scrapers 434, 436 are provided for the two feed gears 384, 386, respectively, such that the scrapers 434, 436 are continuously present from the upstream side of the gears 384, 386 to the downstream side of the same 384, 386, that is, the respective one widened portions of the scrapers 434, 436 are present on the side of an inlet of the meshed gears 384, 386, that is, on an upstream side of the same 384, 386 in the direction of feeding of the TCT 66, and the respective other widened portions of the scrapers 434, 436 are present on the side of an outlet of the gears 384, 386, that is, on a downstream side of the same 384, 386 in the same direction. An angle contained by the respective widened portions of the two scrapers 434, 436 at each of the inlet and the outlet of the meshed gears 384, 386 is greater than 45 degrees, most preferably, greater than 120 degrees.

Figure 30:
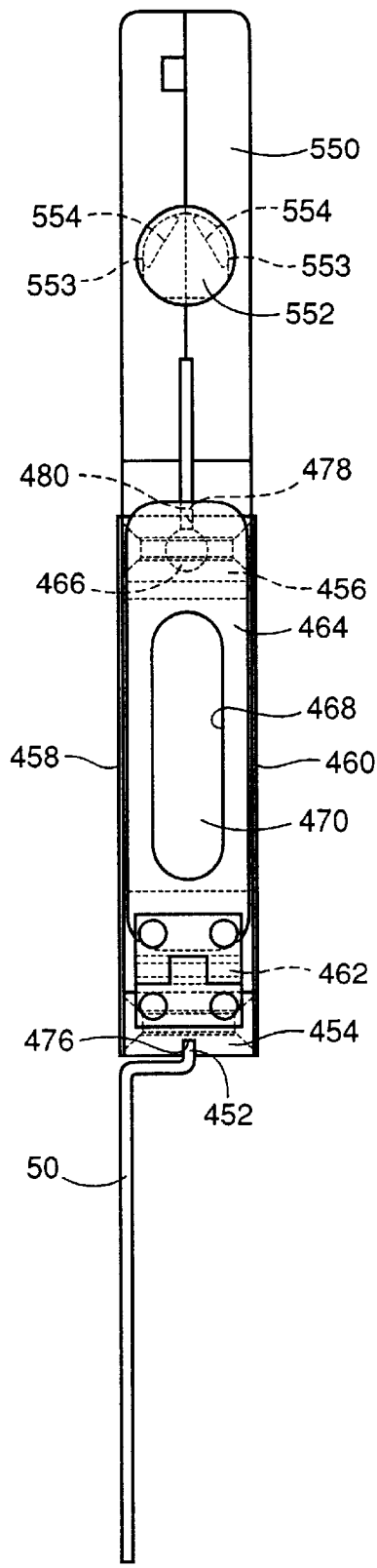
FIG. 30 is a collecting box as an element of the TCT treating device.

The TCT 66 fed by the feed gears 384, 386 is collected by the TCT collecting box 368. The collecting box 368 is provided on a downstream side of the feed gears 384, 386 in the direction of feeding of the TCT 66, and is detachably attached to the fifth member 50. As shown in FIG. 30, an upper end portion of a rear portion of the fifth member 50 is first bent toward a widthwise middle portion of the each EC-supply unit 32 and then bent vertically upward to provide a positioning portion 452 which extends in the lengthwise direction of the unit 32.

As shown in FIGS. 27 and 30, the TCT collecting box 368 includes two beam members 454, 456 each of which has a shape like a thick block, and two thin side plates 458, 460 which are fixed to respective side surfaces of the beam members 454, 456, and has a front and a rear opening as seen in a direction parallel to the direction of feeding of the TCT 66. The beam members 454, 456 and the side plates 458, 460 are formed of a metallic material, such as aluminum, which contributes to preventing the TCT 66 from adhering to the collecting box 368.

As shown in FIG. 30, the rear opening of the TCT collecting box 368 that is more distant from the feed gears 384, 386 than the front opening thereof is closed by a lid 464 which is formed of a magnetic material and which is pivotally attached to the first beam member 454 via an axis member 462. The lid 464 is kept closed because the lid 464 is attracted by a magnet 466 fixed to the second beam member 456. Since the lid 464 has a window 468, the operator can look into an inside space of the box 368 through the window 468. Since the window 468 is covered by a transparent resin sheet 470, the TCT 66 does not "leak" from the box 368.

The front opening of the TCT collecting box 368 that is near to the feed gears 384, 386 is kept open, and provides an inlet 472 through which the TCT 66 flows into the box 368. As shown in FIG. 27, the first beam member 454 includes a TCT-guide projection 474 which projects obliquely upward and frontward, toward the first scraper 434, and which guides the flowing of the TCT 66 into the box 368. Polytetrafluoroethylene is applied to respective inner surfaces of the beam members 454, 456, the side plates 458, 460, the lid 464, and the guide projection 474 that are exposed to the inside space of the box 368, to lower respective friction coefficients of those inner surfaces and thereby prevent the TCT 66 from adhering thereto.

As shown in FIG. 30, the first beam member 454 has a positioning groove 476 formed in a widthwise middle portion thereof. The operator fits the positioning groove 476 on the positioning portion 452 of the fifth member 50, thereby positioning the TCT collecting box 368 in the widthwise direction thereof, and then moves the box 368 forward on the positioning portion 452. Thus, the box 368 is attached to the fifth member 50. Similarly, the second beam member 456 has a positioning groove 478 formed in a widthwise middle portion thereof, and the operator fits the positioning groove 478 on another positioning portion 480 of the fifth member 50, thereby positioning the box 368 in the widthwise direction thereof.

Two ball plungers 482 are provided on both side surfaces of the positioning portion 480 of the fifth member 50 (only one plunger 482 is shown in FIG. 27; the fifth member 50 is indicated at two-dot chain line but the one ball plunger 482 is indicated at solid line and broken line for easier understanding purposes only). Each of the two ball plungers 482 includes a casing 484 having a threaded outer circumferential surface; a ball 486 as an engaging member that is accommodated in the casing 484; and a spring member 486 as an elastic member as a sort of biasing device that biases the ball 486 in a direction in which the ball 486 projects out of the casing 484. The TCT collecting box 368 is moved to a position where the respective balls 484 of the two ball plungers 482 project and engage respective conical holes 490 as engaging holes which are formed in the second beam member 456, so that the box 368 is positioned in the lengthwise direction thereof. Since the box 368 is thus engaged with the fifth member 50, the box 368 is prevented from moving out of position due to, e.g., vibration exerted thereto. In this state, the TCT-guide projection 474 projects toward the first scraper 434 provided for the first feed gear 384, to a position adjacent to the scraper 434, and guides the TCT 66 from the scraper 434 to the box 368. The operator can remove the box 368 from the fifth member 50, by drawing the box 368 in a direction away from the fifth member 50, thereby causing the balls 486 to be pushed back into the casings 484 against the biasing forces of the spring members 488, and moving the box 368 rearward. As shown in FIG. 27, the gear-support lever 420 includes a closing portion 492 which extends parallel to the widthwise direction of the TCT 66 and which prevents the TCT 66 from "leaking" out of the inlet 472 of the box 368.

As shown in FIG. 27, a fixed handle member 550 is detachably attached to an upper end portion of the fifth member 50, such that the fixed handle member 550 is positioned in the widthwise direction of the each EC-supply unit 32. A movable handle member 552 is supported by the fixed handle member 550 such that the movable handle member 552 is movable in a direction parallel to the lengthwise direction of the each unit 32. A rear end portion of the movable handle member 552 projects rearward from the fifth member 50. The operator can draw or move the movable handle member 552 rearward by grasping the projecting end portion of the member 552. The operator attaches and detaches the each unit 32 to and from the table 30, while grasping the movable handle member 552 drawn out of the fifth member 50, and carries the each unit 32 while grasping the fixed handle member 550 with the movable handle member 552 being drawn out.

As shown in FIG. 30, the movable handle member 552 has, in an outer circumferential surface thereof, two flat surfaces 553 as rotation preventing surfaces that extend in a direction parallel to the lengthwise direction of the member 552 and that prevent the member 552 from rotating relative to the fixed handle member 550. In addition, the movable handle member 552 has, in the outer circumferential surface thereof, two chamfered portions that extend in the lengthwise direction of the fixed handle member 550 and that have respective surfaces 554 to one of which a bar-code seal 556 is adhered. A bar code representing identification information identifying the each EC-supply unit 32 from the other EC-supply units 32 is printed on the bar-code seal 556.

As shown in FIG. 1, the carrier tape 64 from which the ECs 60 have been supplied is guided by a guide member 494 provided on the car 34, to a tape cutter 496, so that the carrier tape 64 is cut into small pieces by the tape cutter 496 and the small pieces are collected by a collecting box 498.

Figure 32:
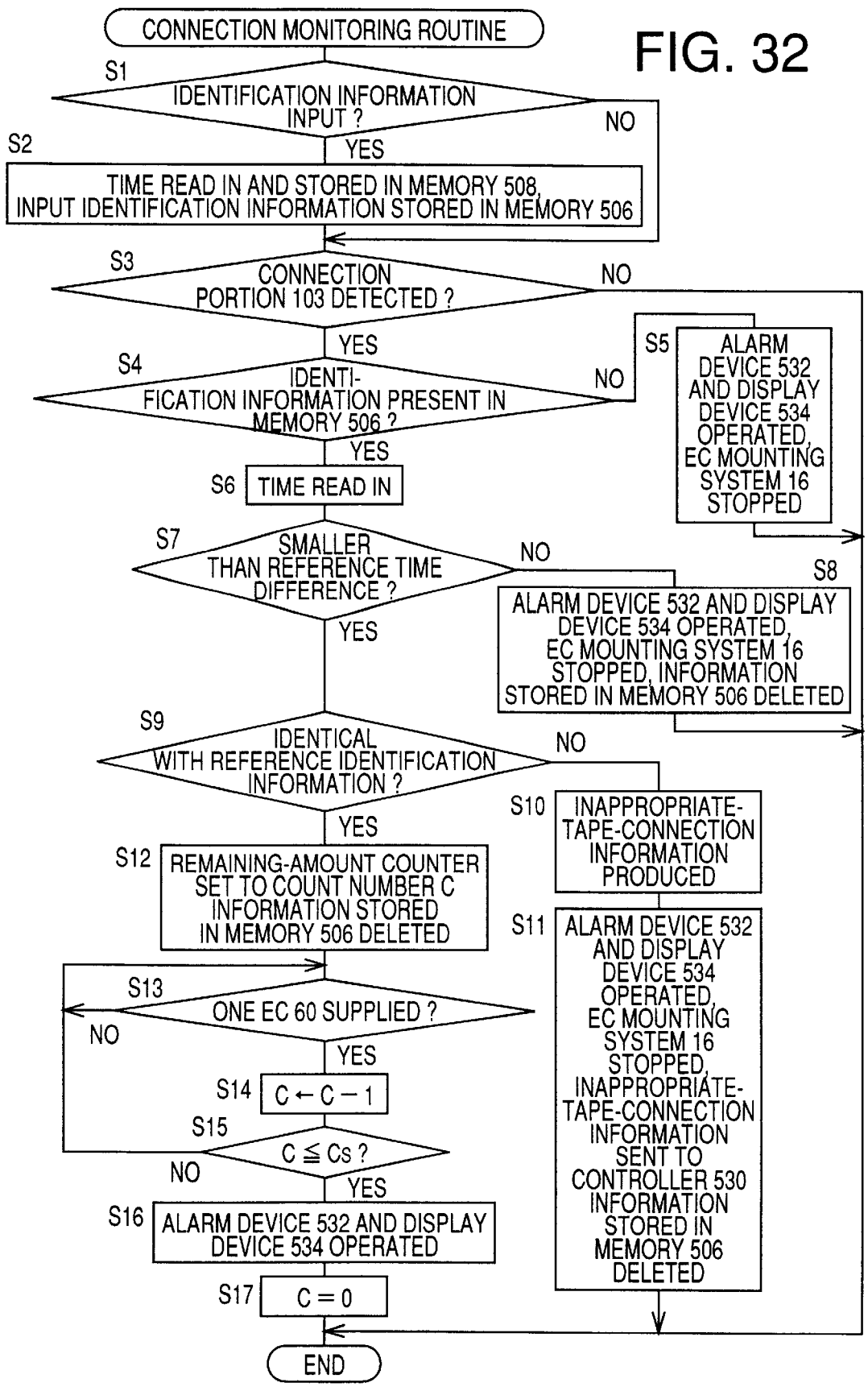
FIG. 32 is a flow chart representing a connection monitoring routine which is stored in a read only memory ("ROM") of a computer of a unit controller of each of the EC-supply units.
Figure 33:
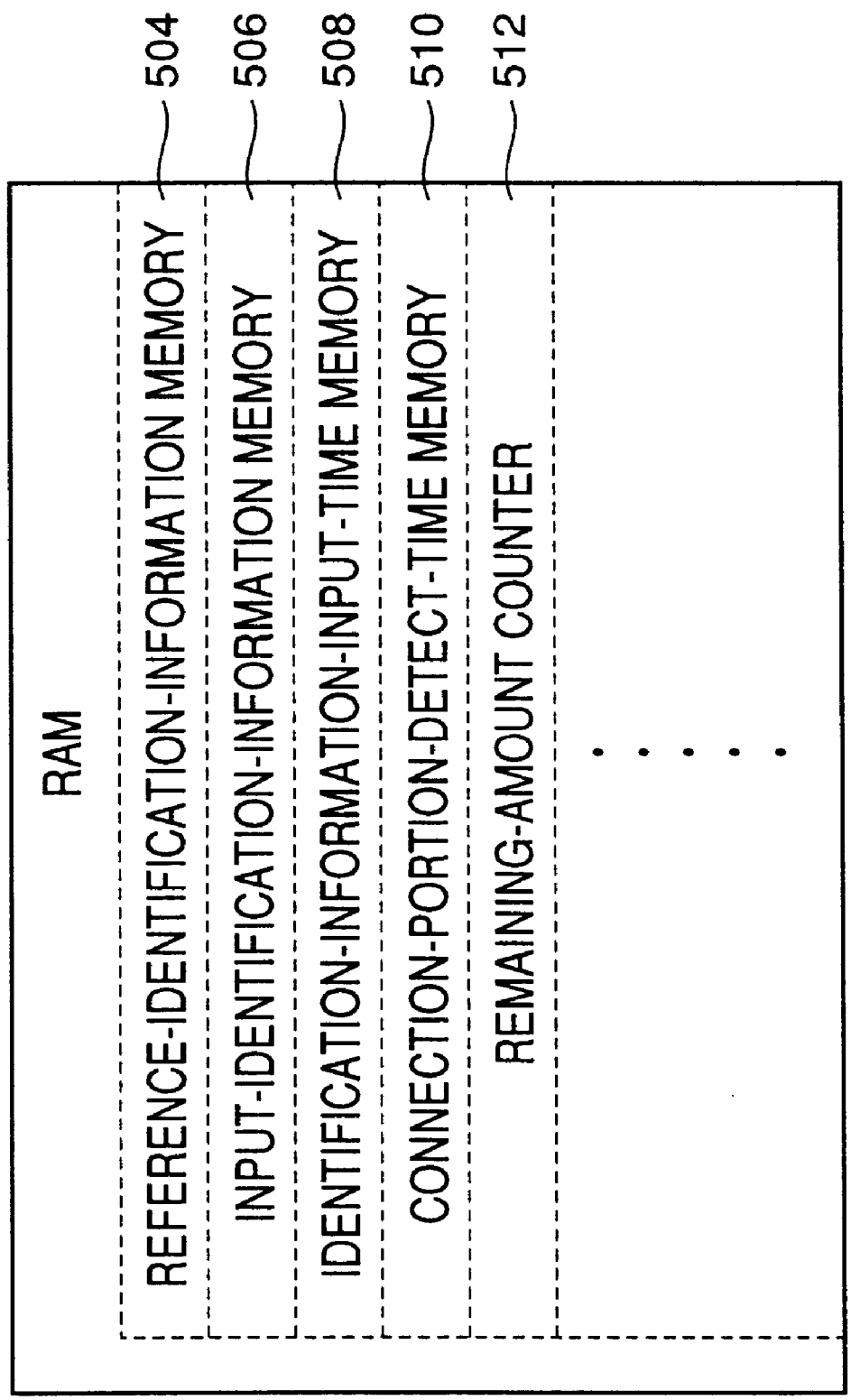
FIG. 33 is an illustrative view of a structure of a random access memory ("RAM") of the computer.

As shown in FIG. 31, each of the EC-supply units 32 includes a unit controller 500 including three computers (not shown) which are exclusively used to monitor the connection of two EC tapes 62 on the each unit 32, control the stepper motor 300, and control the DC motor 408, respectively. In addition, the connection detecting circuit 168 of the metal detecting device 150, the rotation-stop-position sensor 354, the roller-position sensor 378, and an operation panel 502 are connected to the unit controller 500. FIG. 32 shows a flow chart representing a connection monitoring routine which is stored in a read only memory ("ROM") of the first exclusive computer which monitors the connection of two EC tapes 62, and a random access memory ("RAM") of the first computer includes, in addition to a working memory, a reference-identification-information memory 504, an input-identification-information memory 506, an identification-information-input-time memory 508, a connection-portion-detect-time memory 510, and a remaining-amount counter 512. A processing unit ("PU") of the first computer includes a timer.

As shown in FIG. 31, the unit controller 500 of each EC-supply unit 32 is connected to a car-side controller 520 which is provided on each car 34, and exchanges information with the car-side controller 520. Each of the two car-side controllers 520 is connected to a mounting-system controller 530 which is employed by the EC mounting system 16, and exchanges information with the mounting-system controller 530. The mounting-system controller 530 controls the alarm device 532 and a display device 534 which are employed by the EC mounting system 16, such that the alarm device 532 generates an alarm sound and the display device 534 displays information describing an error which has occurred. A bar-code reader 538 is connected to the each car-side controller 520. The mounting-system controller 530 is connected to a host computer 540, and exchanges information with the host computer 540.

In the CB assembling system 10 constructed as described above, the EC sucker 22 is moved to take an EC 60 from one of the EC-supply units 32 and mount the EC 60 on a PWB 20. After the EC sucker 22 takes the EC 60 and before the sucker 22 mounts the EC 60 on the PWB 20, the image taking device 38 takes an image of the EC 60 held by the EC sucker 22, and the mounting-system controller 530 calculates, based on image data representing the taken image, X-direction and Y-direction position errors of the EC 60 held by the EC sucker 22 and a rotation position error of the EC 60 about an axis line of the EC 60. In addition, before the EC 60 is mounted on the PWB 20, another image taking device (not shown) takes respective images of two reference marks which are affixed to two portions of the PWB 20, respectively, that are diagonally distant from each other, and the controller 530 calculates, based on image data representing the taken images, X-direction and Y-direction position errors of each of a plurality of EC-mount places on the PWB 20 where ECs 60 are to be mounted. After the X-direction and Y-direction position errors of the EC 60, the X-direction and Y-direction position errors of the EC-mount place where the EC 60 is to be mounted, and the rotation position error of the EC 60 are corrected, the EC 60 is mounted at the EC-mount place on the PWB 20.

Each of the EC-supply units 32 is waiting for supplying the following EC 60, in the state in which the preceding EC 60 has been taken from the embossed portion 70 of the carrier tape 64, that is, in the state in which the empty embossed portion 70 is positioned at the EC-supply position. The mounting-system controller 530 selects one of the EC-supply units 32 that is next to supply an EC 60 to the EC sucker 22, and sends, to the unit controller 500 of the selected unit 32, a command that commands the exclusive computer of the unit controller 500 to operate the stepper motor 300 and thereby feed the EC tape 62.

The stepper motor 300 is rotated by an amount needed for the following EC 60 to be moved to the EC-supply position, depending upon the pitch at which the ECs 60 are held by the EC tape 62. Since the pitch at which the ECs 60 are held by the first EC tape 62 is the smallest pitch equal to the reference pitch, the stepper motor 300 is controlled to rotate the plate cam 306 by 90 degrees. Consequently one of the two pivotable members 280, 282 performs one EC-tape feeding action (i.e., one forward motion) to feed the EC tape 62 by a distance equal to the reference pitch. That is, one EC-tape feeding action of the pivotable member 280 or 282 causes the sprocket 272 to be driven one time, so that the following EC 60 is moved to the EC-supply position. Each time the sprocket 272 is driven one time, one EC 60 is supplied to the EC sucker 22. Hereinafter, this EC supplying step will be referred to as the single-feeding-action EC supplying step.

In the case where one EC-supply unit 32 feeds the second EC tape 75 and supplies the ECs 60 from the same 75, the pitch at which the ECs 60 are held by the tape 75 is twice the reference pitch, and the stepper motor 300 is controlled to rotate the plate cam 306 by 180 (i.e., 90×2) degrees. Thus, the two pivotable members 280, 282 alternately perform respective EC-tape feeding actions (i.e., respective forward motions), each one time, so that the sprocket 272 is driven two times and the following EC 60 is moved to the EC-supply position. Since one EC 60 is supplied to the EC sucker 22 each time the sprocket 272 is driven M (e.g., two) times, this EC supplying step will be referred to as the M-time-feeding-action EC supplying step. The exclusive computer of the unit controller 500 that controls the stepper motor 300 provides a tape-feed control device which controls the number of rotations of the stepper motor 300, depending upon a pitch at which ECs are held by an EC tape, so that the EC tape is fed by a distance equal to the pitch.

In the case where one EC is supplied to the EC sucker 22 each time the sprocket 272 is driven one time, the EC sucker 22 is lowered in synchronism with the feeding of an EC tape in response to the single driving of the sprocket 272. Meanwhile, in the case where one EC is supplied to the EC sucker 22 each time the sprocket 272 is driven M times, the EC sucker 22 is moved downward in synchronism with the feeding of an EC tape in response to the last or M-th driving of the sprocket 272. The mounting-system controller 530 functions as a synchronism control device which controls the EC sucker 22 such that the EC sucker 22 is move downward concurrently with at least a portion of the single or M-th feeding of an EC tape, or immediately after the single or M-th feeding of the EC tape has ended. In the case where the EC sucker 22 is move downward concurrently with at least a portion of the single or M-th feeding of an EC tape, the single or M-th feeding of the EC tape ends before the EC sucker 22 takes an EC from the EC tape, that is, the leading EC of the EC tape is moved to the EC-supply position before the EC sucker 22 sucks and holds the leading EC. Since the mounting-system controller 530 can obtain, from the unit controller 500 of each EC-supply unit 32, information relating to the feeding of the EC tape, i.e., information relating to the driving of the sprocket 272, the mounting-system controller 530 can control, based on the obtained information, the downward movement of the EC sucker 22.

As described above, the cam surface 314 of the plate cam 306 is so formed that each of the two pivotable members 280, 282 is pivoted according to the modified constant velocity curve shown in FIG. 26. More specifically described, the bell-crank lever 308 is smoothly accelerated from the speed of zero, subsequently pivoted at a constant velocity, and then smoothly decelerated to the speed of zero, so that each of the two pivotable members 280, 282 is smoothly accelerated from the speed of zero, subsequently pivoted at a constant velocity, and then smoothly decelerated to the speed of zero. Therefore, the feeding of the EC tape 62 can be started and stopped with reduced vibration, and accordingly each EC 60 can be prevented from jumping out of the embossed portion 70 or changing its posture in the embossed portion 70.

In addition, since the two pivotable members 280, 282 alternately perform respective EC-tape feeding actions and substantially continuously drive the sprocket 272, the EC tape 62 is fed forward without cease. Therefore, even in the case where the pitch at which ECs are held by an EC tape is M times longer than the reference pitch, the EC tape can be fed quickly.

The second exclusive computer of the unit controller 500 controls the stepper motor 300 and thereby controls the feeding of the EC tape 62. This exclusive computer, a drive circuit (not shown) for driving the stepper motor 300, and the rotation-stop-position detector 350 cooperate with one another to provide a drive-source control device.

As described above, if the stepper motor 300 goes out of synchronism, the second computer of the unit controller 500 performs countermeasures including additionally rotating the stepper motor 300 by a small angle, so as to obtain the stop-position signal produced by the rotation-stop-position sensor 354. On the other hand, if the unit controller 500 cannot eliminate the error that has occurred, because of the out-of-synchronism state, between the number of drive signals supplied to the motor 300 and the current rotation position of the same 300, the mounting-system controller 530 controls, based on the commands supplied from the unit controller 500 via the car-side controller 520, the alarm device 532 to produce an alarm sound indicating that an abnormality has occurred, and controls the display device 534 to display a screen image describing what the abnormality is.

When the EC tape 62 is fed forward, the stepper motor 300 is operated and simultaneously the DC motor 408 of the TCT feeding device 366 is operated. Thus, the TCT 66 is fed forward while being peeled from the carrier tape 64, so that the TCT 66 is collected into the TCT collecting box 368. This means that the TCT feeding device 366 also functions as a TCT peeling device.

When the DC motor 408 is operated, the two feed gears 384, 386 are rotated to feed the TCT 66. Since the amount of peeling of the TCT 66 from the carrier tape 64 is limited by the end of the opening 212 of the cover member 210, the TCT 66 is peeled from the carrier tape 64 by an amount equal to the amount of feeding of the carrier tape 64 or the EC tape 62. Since it is required that the TCT 66 be accurately peeled by the amount equal to the amount of feeding of the carrier tape 64, the feed gears 384, 386 are rotated to feed the TCT 66, by an amount more than the amount of feeding of the carrier tape 64.

The above-indicated excessive rotation of the feed gears 384, 386 is allowed because then the tensile force of the TCT 66 is increased and accordingly the roller-support lever 370 is pivoted against the biasing force of the spring member 374. The DC motor 408 is stopped before the stepper motor 300 is stopped, and accordingly the feed gears 384, 386 are stopped before the feeding of the carrier tape 64 is stopped. As the carrier tape 64 is fed after the stopping of the feed gears 384, 386, the roller-support lever 370 is pivoted by the biasing action of the spring member 374, so that the TCT 66 is peeled from the carrier tape 64. While the carrier tape 64 is fed, the tensile force of the TCT 66 is adjusted by the lever 370, so that the TCT 66 is fed while being peeled, without being loosened.

More specifically described, the amount of feeding of the TCT 66 is somewhat more than that of the carrier tape 64, and accordingly the roller-support lever 370 is positioned, because of the increased tensile force of the TCT 66, at a position nearer to the roller-position sensor 378 than the stopper member 380. Though the lever 370 is pivoted against the biasing force of the spring member 374, the lever 370 is not contacted with the stopper member 380 and the TCT 66 is not loosened. However, as the feeding of the EC tape 62 is repeated and the peeling and feeding of the TCT 66 is repeated, eventually the detection member 376 of the lever 370 is detected by the roller-position sensor 378, so that the DC motor 408 is stopped. Thus, the tensile force of the TCT 66 is prevented from exceeding a predetermined value, and the TCT 66 is prevented from being broken. As the EC tape 62 is fed after the DC motor 408 is stopped, the lever 370 is pivoted by the spring member 374, so that the TCT 66 is peeled from the carrier tape 64 while being stretched out. If the time period in which the TCT 66 is fed by the operation of the DC motor 408 has not ended yet when the lever 370 is pivoted by the biasing action of the spring member 374 and accordingly the roller-position sensor 378 no longer detects the detection member 376, the DC motor 408 is started again to rotate the feed gears 384, 386 and thereby feed the TCT 66.

The roller-position sensor 378 can detect an abnormality which occurs to the TCT feeding device 366. For example, if the DC motor 408 continues to operate, for some reason, even after the feeding of the EC tape 62 ends, the tensile force of the TCT 66 is increased and the roller-support lever 370 is pivoted against the biasing force of the spring member 374, so that the detection member 376 is detected by the roller-position sensor 378. Thus, the unit controller 500 can recognize that an abnormality has occurred to the DC motor 408 or a control circuit to control the motor 408, and can stop the operation of the motor 408. Thus, the TCT 66 is prevented from being broken. In addition, the unit controller 500 commands the mounting-system controller 530 to control the alarm device 532 and the display device 534 to inform the operator of the occurrence of abnormality. The third exclusive computer of the unit controller 500 controls the DC motor 408 based on the detection signals supplied from the roller-position sensor 378. Thus, the exclusive computer of the unit controller 500 that controls the DC motor 408 of the TCT feeding device 366 provides a TCT-feed stopping device.

The TCT 66 which has been peeled from the carrier tape 64 and fed by the feed gears 384, 386 flows into the TCT collecting box 368 through the inlet 472 thereof. Since the two feed gears 384, 386 are rotated while the respective teeth 388 thereof mesh each other and pinch the TCT 66, the TCT 66 is surely fed forward. In addition, the second scraper 436 provided for the second feed gear 386 can surely peel the TCT 66 from the teeth 38 of the gear 386, even if the TCT 66 may be adhered to the teeth 38 because of a tacky material possibly left on one major surface of the TCT 66 that has been adhered to the carrier tape 64. Thus, the TCT 66 is prevented from remaining adhered to the teeth 388 of the second feed gear 386 and interfering with the feeding of the following portion of the TCT 66. The other major surface of the TCT 66 on which no tacky material is provided is contacted with the first feed gear 384. The first scraper 434 which is provided for the first feed gear 384 peels, even if the TCT 66 may hang down onto the gear 384 because of its own weight, the TCT 66 from the teeth 388 of the gear 384 and thereby prevents the TCT 66 from jamming on the gear 384.

In addition, the respective bent, widened portions of the two scrapers 434, 436 that are provided on the side of the outlet of the two feed gears 384, 386 open about 120 degrees. Accordingly, the TCT 66 is not adhered to the scrapers 434, 436 and is smoothly fed to the TCT collecting box 368. Since polytetrafluoroethylene is applied to the respective surfaces of the scrapers 434, 436 that face the path of feeding of the TCT 66, and the inner surfaces of the box 368, to lower their respective friction coefficients, the TCT 66 is not adhered to those elements 434, 436, 368.

The operator can look into the inner space of the TCT collecting box 368 through the window 468 and judge whether the box 368 is full of the collected TCT 66. If a positive judgment is made, the operator opens the lid 464 and removes the TCT 66 from the box 368. Alternatively, the operator can remove the full box 368 from the fifth member 50, and replace the full box 368 with a new, empty box 368. At this time, the operator cuts the TCT 66 at a portion thereof near the feed gears 384, 386, and inserts the cut end of the TCT 66 into the new box 368. Alternatively, a container may be placed in the inside space of the box 238. In the last case, the operator replaces the container full of the collected TCT 66, with a new, empty container.

When the supplying of the ECs 60 advances and eventually the remaining amount of the current EC tape 62 wound on one supply reel 76 decreases to a small amount, the alarm device 532 and the display device 534 inform the operator of this situation and command him or her to connect another EC tape 62 to the current EC tape 62 now supplying the ECs 60. More specifically described, first, the operator removes the current EC tape 62 from the current supply reel 76, removes the current supply reel 76 from the bucket 78, sets another supply reel 76 in the bucket 78, and connects another EC tape 62 wound on the new supply reel 76, to the current EC tape 62 supplying the ECs 60. The connection of the two EC tapes 62 are carried out using the above-described metallic connection member 100 and the connection tape 102. In the present embodiment, another EC tape 62 which is to be connected to the terminal end portion 96 of the current EC tape 62 being fed by the EC-tape feeding device 90 to supply the ECs 60, is a new one which has not supplied any ECs 60. The respective operations of the alarm device 532 and the display device 534 will be described in detail later.

The first exclusive computer of the unit controller 500 monitors the connection of two EC tapes, according to the connection monitoring routine shown in FIG. 32. First, at Step S1, the computer judges whether identification information identifying an EC tape has been input. When the operator connects two EC tapes, he or her operates, before or after the connection, the bar-code reader 538 to read in the bar code 88 of the supply reel on which the following EC tape to be connected to the current or preceding EC tape 62 is wound, and the bar code printed on the bar-code seal 556 adhered to the EC-supply unit 32 feeding the preceding EC tape 62. The bar code of the EC-supply unit 32 is read in, in the state in which the movable handle member 552 is drawn out of the fixed handle member 550. Since the bar-code reader 538 is connected to the car-side controller 520, the car-side controller 520 sends, based on the identification information represented by the read-in bar code of the EC-supply unit 32, the identification information represented by the read-in bar code 88 of the following EC tape, to the unit controller 500 of that EC-supply unit 32. Thus, a positive judgment is made at Step S1.

On the other hand, if a negative judgment is made at Step S1, the control of the computer goes to Step S3 to judge whether a connection portion 103 has been detected. If a negative judgment is made at Step S3, the current control cycle according to this routine ends.

If a positive judgment is made at Step S1, the control goes to Step S2 to store the input identification information identifying the following EC tape, in the input-identification-information memory 506. In addition, the computer reads in a time which is measured by the timer when a positive judgment is made at Step S1, and stores the read-in time in the identification-information-input-time memory 508. Step S2 is followed by Step S3. Since a connection-detect position where the detecting head 152 is provided is distant from a tape-connect position where the two EC tapes are connected to each other, a certain time is needed for the connection portion 103 to be fed from the tape-connect position to the connection-detect position. Therefore, at an early stage, a negative judgment is made at Step S3.

Whether the operator may have read in, or may have failed to read in, using the bar-code reader 538, the bar code 88 of the following EC tape, before or after connecting the two EC tapes to each other, a positive judgment is made at Step S3, when the connection portion 103 reaches the detecting head 152 and the connection member 100 electrically connects the two electrodes 166, that is, when the detecting head 152 detects the connection portion 103. Then, the control of the computer goes to Step S4 to judge whether any identification information is present in the input-identification-information memory 506. In the case where the operator has failed to read in the bar code 88 of the following EC tape when connecting the following EC to the preceding EC tape 62, no information is present in the memory 506 and a negative judgment is made at Step S4. Thus, the control goes to Step S5.

At Step S5, the computer sends, to the mounting-system controller 530 via the car-side controller 520, commands to operate the alarm device 532 and the display device 534 to inform and indicate that the operator has failed to read in the bar code 88 of the following EC tape, and stop the operation of the EC mounting system 16. More specifically described, the mounting-system controller 530 controls the alarm device 532 to generate an alarm sound, and controls the display device 534 to display a message that the operator has failed to read in the bar code, and indicate a particular EC-supply unit 32 which is feeding the following EC tape whose bar code 88 has not been read in. The mounting-system controller 530 can identify the particular EC-supply unit 32, based on the particular unit controller 500 which has sent the commands to operate the alarm device 532 and the display device 534. In addition, the controller 530 stops the operation of the EC mounting system 16.

The current control cycle ends with Step S5, and the computer starts with Step S1 in the next control cycle. If the operator reads in the bar code 88 of the following EC tape and inputs the identification information represented by the read-in bar code 88, a positive judgment is made at Step S1, and Steps S2 and S3 are performed. If the EC mounting system 16 is started again after the reading of the bar code 88, a connection-detect signal is virtually produced, and a positive judgment is made Step S3. Thus, Step S4 is performed. Since the identification information is present in the memory 506, a positive judgment is made at Step S4, and the control goes to Step S6. It is usual that the system 16 is resumed after the reading of the bar code 88. Steps S1 and S3 are repeated till identification information is input and the system 16 is resumed.

Thus, in the present embodiment, it is judged whether identification information has been input when two EC tapes are connected to each other and, before the identification information is input, no ECs are mounted on a PWB 20. Thus, each EC-supply unit 32 is prevented from supplying ECs from an incorrect sort of EC tape, and the EC mounting system 16 is prevented from mounting an incorrect sort of ECs on a PWB 20.

If a positive judgment is made at Step S4, the control goes to Step S6 to read in a time which is measured by the timer when a positive judgment is made at Step S4, and store the read-in time in the connection-portion-detect-time memory 510. Step S6 is followed by Step S7 to subtract the time stored in the memory 508, from the time stored in the memory 510, and judge whether the thus obtained time difference is smaller than a reference time difference. Since Step S7 is carried out only when a positive judgment is made at Step S4 and Step S2 must have been carried out before Step S4, the computer can compare the time difference between the two times, with the reference time difference.

The above-indicated time-difference comparison is performed to exclude the identification information which has not been input in relation with the connection of two EC tapes 62, and avoid a wrong judgment that the identification information has been input in relation with the connection of two EC tapes. Since the connection-detect position and the tape-connect position are distant from each other, it needs a certain time for the connection portion 103 to be moved from the tape-connect position to the connection-detect position. This time can be estimated based on the distance between the tape-connect position and the connection-detect position (i.e., a length of the preceding EC tape 62 between the detecting head 152 and the connection member 100 when the two EC tapes are connected to each other); the pitch at which the ECs 60 are held by each EC tape 62; and the rate at which the each EC-supply unit 32 supplies the ECs 60 from the each EC tape 62, that is, whether or not the each unit 32 continuously supplies the ECs 60. Therefore, the reference time difference is predetermined to be somewhat longer than the thus estimated time. Thus, if the connection portion 103 is detected within the reference time difference after the following EC tape is connected to the preceding EC tape 62 and identification information is input, it can be judged that the input identification information is the identification information which has been input in relation with the connection of two EC tapes. In addition, the reference time difference is predetermined to be long enough to be able to judge that the input identification information is the identification information which has been input in relation with the connection of two EC tapes, even in the case where the operator reads in the bar code 88 of the following tape before connecting the two EC tapes to each other.

On the other hand, if no connection portion 103 is detected within the reference time difference, a problem may have occurred. For example, in the present CB assembling system 10, after the EC mounting system 16 starts mounting the ECs 60 on the PWBs 20, the bar code 88 of one supply reel may be read in for some reason although, in fact, no EC tapes are connected. Even in this case, a positive judgment is made at Step S1 and, at Step S2, the time when the positive judgment is made is read in and stored, and the identification information is stored in the input-identification-information memory 506. If subsequently the operator does not fail to read in the bar code 88 of the following EC tape connected to the preceding EC tape 62, then new identification information represented by the read-in bar code 88 is stored in the memory 506 in place of the old identification information. In this case, therefore, no problem occurs. On the other hand, if the operator fails to read in, the memory 506 keeps the identification information which has not been input in relation with the connection of two EC tapes, and the identification information causes a positive judgment to be made at Step S4. In the latter case, however, since the identification information or bar code 88 has been input or read in a considerably long time before the two EC tapes are connected to each other, the time difference between the inputting of the identification information and the detection of the connection portion 103 is greater than the reference time difference. Thus, a negative judgment is made at Step S7, since it is judged that the identification information stored in the memory 506 cannot be the identification information input in relation with the connection of two EC tapes.

If a negative judgment is made at Step S7, the control of the computer goes to Step S8 to delete the information stored in the input-identification-information memory 506 and send, to the mounting-system controller 530 via the car-side controller 520, commands to stop the operation of the EC mounting system 16 and operate the alarm device 532 and the display device 534 to inform and indicate that identification information has been input, but not in relation with the connection of two EC tapes, and that the reading-in of the bar code 88 has not been done in relation with the connection of two EC tapes. After Step S8, the current control cycle ends, and the computer operates in the same manner as described above in the case where the reading-in of the bar code 88 has not been done and a negative judgment is made at Step S4.

If the time difference between the inputting of the identification information and the detection of the connection portion 103 is smaller than the reference time difference, a positive judgment is made at Step S7, and the control goes to Step S9 to judge whether the identification information identifying the following EC tape connected to the preceding EC tape 62 is identical with reference identification information identifying a correct sort of EC tape 62 to be connected to the preceding tape 62. The reference identification information is supplied from the host computer 540 and is stored in the reference-identification-information memory 504. A negative judgment made at Step S9 means that the following EC tape actually connected to the preceding one 62 is not the correct sort of EC tape 62 to be connected to the preceding one 62. In this case, the control goes to Step S10 to produce a set of inappropriate-tape-connection information indicating that the input and stored identification information is not identical with the reference identification information. More specifically described, the set of inappropriate-tape-connection information includes information indicating that an incorrect sort of EC tape has been connected; information specifying a particular EC-supply unit 32 to which the incorrect sort of EC tape 62 has been connected; the identification information identifying the correct sort of EC tape 62 to be connected; and the identification information identifying the incorrect sort of EC tape 62 which has been actually connected. Step S10 is followed by Step S11 to delete the information stored in the memory 506 and send, to the mounting-system controller 530 via the car-side controller 520, commands to stop the operation of the EC mounting system 16, operate the alarm device 532 to inform the operator of the fact that an incorrect sort of EC tape 62 has been connected, and operate the the display device 534 to display the set of inappropriate-tape-connection information. In addition, the computer sends the set of inappropriate-tape-connection information to the controller 530.

If a positive judgment is made at Step S9, the control goes to Step S12 to set, as a count number, C, of the remaining-amount counter 512, the sum of the number of ECs 60 held by the following EC tape 62 connected to the preceding one 62 and the number of ECs 60 held by the preceding one 62 between the connection-detect position and the EC-supply position. Since the distance between the connection-detect position and the EC-supply position is known in advance based on the designing of the each EC-supply unit 32, the computer can calculate, based on this distance and the pitch at which the ECs 60 are held by the each EC tape 62, the number of ECs 60 held by the preceding EC tape 62 between the connection-detect position and the EC-supply position. In addition, the computer deletes the information stored in the input-identification-information memory 506, since that information is no longer needed, in the present connection monitoring routine, after a positive or negative judgment is obtained at Step S9.

Step S12 is followed by Step S13 to judge whether one EC 60 has been supplied, that is, whether the EC sucker 22 has taken one EC 60 from one embossed portion 70. The computer makes this judgment based on the information supplied thereto from the mounting-system controller 530 which controls the EC taking operation of the EC sucker 22. If a positive judgment is made at Step S13, the control goes to Step S14 to subtract one from the count number C of the remaining-amount counter 512. Step S14 is followed by Step S15 to judge whether the count number C is equal to, or smaller than, a reference number, $C_S$. That is, the computer judges whether the remaining amount of the ECs 60 held by the EC tape 62 has decreased to a considerably small amount. At an early stage, a negative judgment is made at Step S15, and the control goes back to Step S13.

Steps S13 to S15 are repeated till a positive judgment is made at Step S15. Meanwhile, if a positive judgment is made at Step S15, the control goes to Step S16 to send, to the mounting-system controller 530 via the car-side controller 520, commands to operate the alarm device 532 and the display device 534 to inform and indicate that the remaining amount of the ECs 60 has decreased to the small amount. More specifically described, the computer sends information based on which the alarm device 532 generates an alarm sound requesting the operator to replenish a new EC tape 62, and based on which the display device 534 displays a message requesting the operator to replenish a new EC tape 62, and additionally displays the particular EC-supply unit 32 whose ECs 60 have decreased to the small amount, and the particular sort of EC tape 62 to be connected. Step S16 is followed by Step S17 to reset the count number C of the remaining-amount counter 512, to zero, and the current control cycle ends.

As is apparent from the foregoing description, in the present embodiment, the bar-code reader 538 provides an input device; and a portion of the first exclusive computer of the unit controller 500 that carries out Steps S9 and S10 of the connection monitoring routine of FIG. 32, provides an inappropriate-tape-connection-information producing device, which cooperates with the input device to provide a tape-connection-relating information producing device. A portion of the first computer that carries out Steps S1 and S4 provides an input judging device; a portion of the first computer that carries out Steps S2, S6, and S7 provides a connection-relating-input judging device; a portion of the first computer that obtains, at Step S12, the initial number of the ECs 60 that are present on the EC tape 62, from the input identification information, provides an initial-amount obtaining device; a portion of the first computer that carries out Steps S13 and S14 provides a remaining-amount obtaining device; and the alarm device 532 and the display device 534 cooperate with each other to provide a non-input informing device or an inappropriate-tape-connection informing device.

The EC-tape feeding device 90 carries out the step of feeding the EC tape 62 and thereby supplying the ECs 60, one by one, to the EC mounting system 16; the operator carries out the step of connecting the two EC tapes 62 to each other; the operator carries out the step of operating the bar-code reader 538 to read in the bar code 88 as the identification information; the metal detecting device 150 carries out the step of detecting the metallic connection member 100 and thereby detecting the connection portion 103; and the mounting-system controller 530 carries out the step of stopping the operation of the EC mounting system 16, based on the command supplied from the first computer of the unit controller 500. The first computer of the unit controller 500 carries out the step of obtaining, at Steps S13 to S15, the remaining amount of the ECs 60 that are present on the EC tape 62, and carries out the step of informing, at Step S16, the operator of the fact that the remaining amount of the ECs 60 is not more than a reference amount. The information read in by each bar-code reader 538 is input to the corresponding car-side controller 520. Since the ECs 60 supplied from the EC-supply units 32 supported by the two cars 34 are mounted on the PWBs 20, it can be said that the EC supplying system 18 is part of the EC mounting system 16. Therefore, it can be said that the inputting of the bar code 88 (i.e., the identification information) to each car-side controller 520 is also the inputting of the same to the EC mounting system 16.

Figure 34:
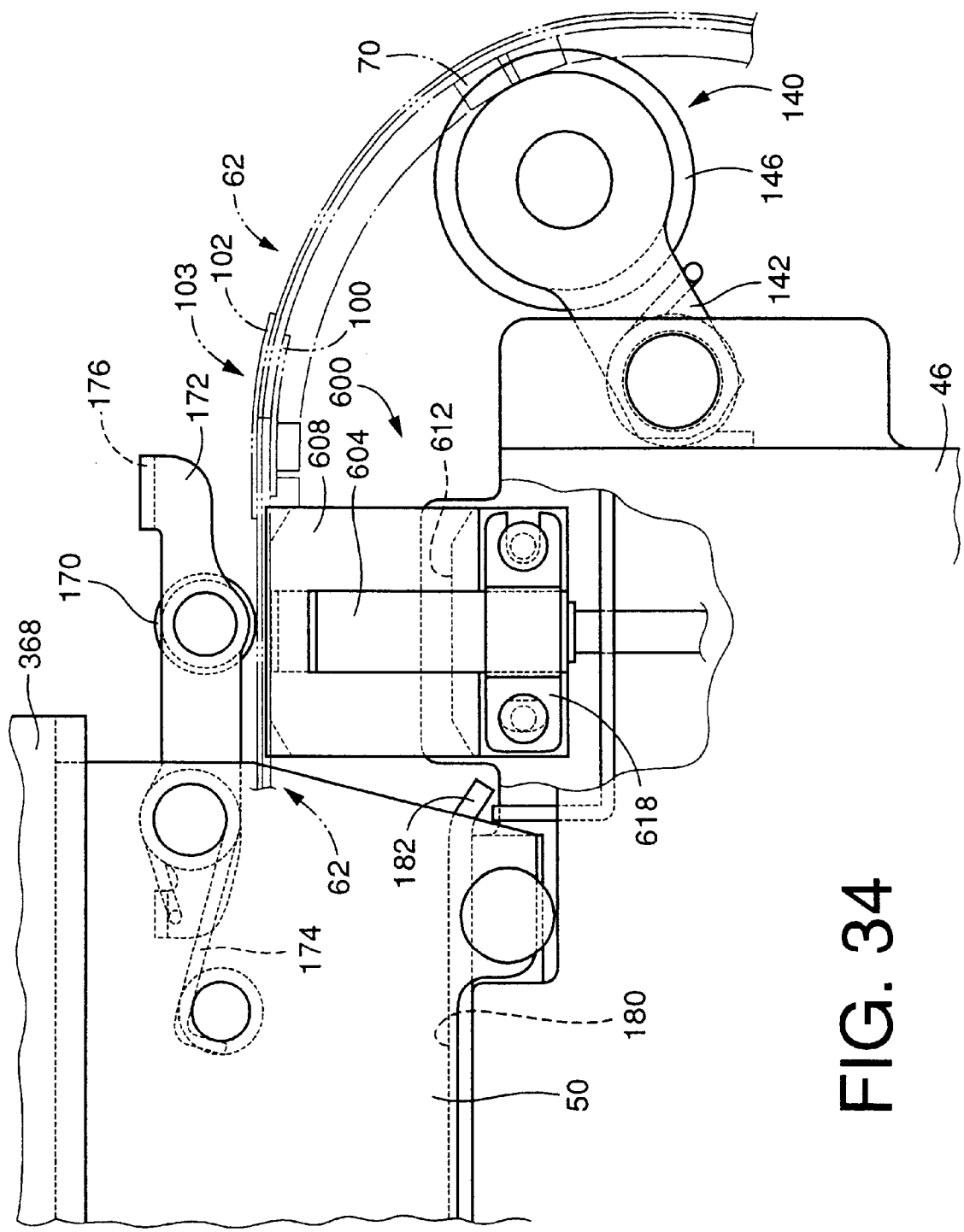
FIG. 34 is a front elevation view of a particular portion of another EC-supply unit as a second embodiment of the present invention in which a high-frequency-oscillation proximity sensor is provided.

In the illustrated embodiment, the metal detecting device 150 as the contact-type sensor that includes the two electrodes 166 detects the metallic connection member 100. However, it is possible to employ a non-contact-type metal detecting device. For example, FIG. 34 shows an EC-supply unit 600 which includes a high-frequency-oscillation proximity sensor 604. Since the other elements and parts of the EC-supply unit 600 are the same as those of each EC-supply unit 32, the same reference numerals as used to designate those elements and parts of the each EC-supply unit 32 are used to designate the corresponding elements and parts of the EC-supply unit 600, and the description thereof is omitted.

Figure 35:
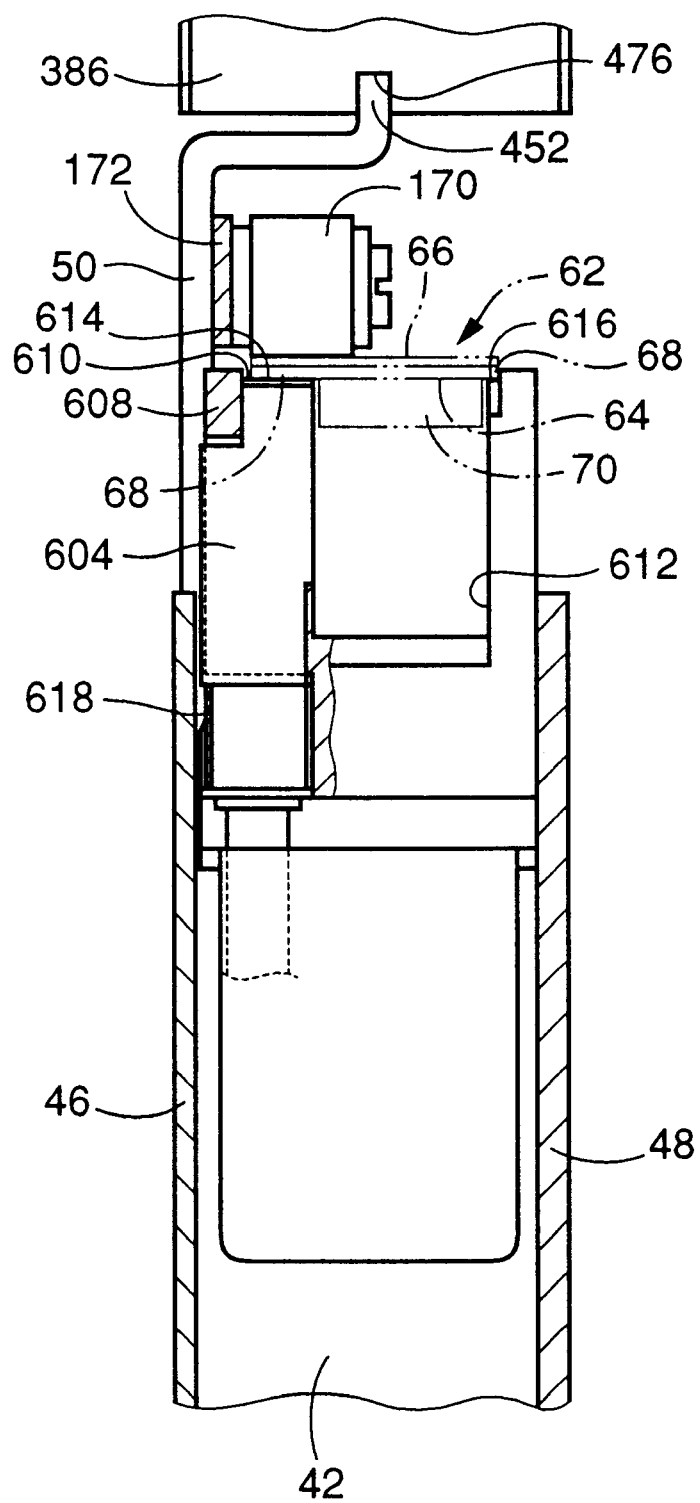
FIG. 35 is a partly cross-sectioned, side elevation view of the particular portion of the EC-supply unit of FIG. 34 in which the high-frequency-oscillation proximity sensor is provided.

The high-frequency-oscillation ("HFO") proximity sensor 604 is supported, like the detecting head 152 of the metal detecting device 150, by a support member 608 in respective rear portions of a third and a fourth member 46, 48 of the EC-supply unit 600. The support member 608 has a shape like a block and has, as shown in FIGS. 34 and 35, a first groove 610 which extends parallel to the direction of feeding of an EC tape 62 and which has a width somewhat greater than the width of a carrier tape 64 of the EC tape 62, and a second groove 612 which opens in the bottom of the first groove 610 and which has a depth and a width allowing each of embossed portions 70 of the EC tape 62 to pass therethrough. The support member 608 additionally has a wide support surface 614 which has a greater width and which supports one of opposite end portions of the carrier tape 64 that has feed holes 74, and a narrow support surface 616 which supports the other end portion 68 of the carrier tape 64.

Figure 36:
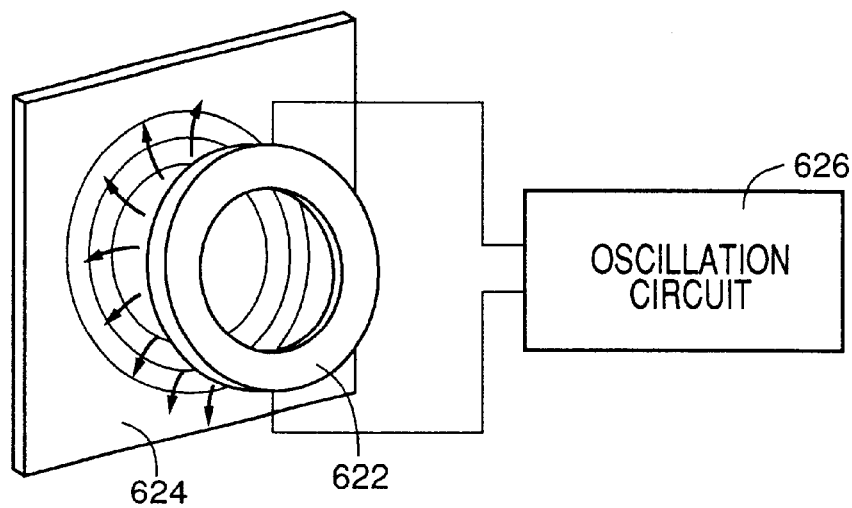
FIG. 36 is a view for illustrating the principle of operation of the proximity sensor of FIG. 35.

The HFO proximity sensor 604 is fitted in a portion of the support member 608 that corresponds to the wide support surface 614, and an attaching member 618 attaches the HFO proximity sensor 604 to the support member 608 such that the proximity sensor 604 is detachable from the support member 608. The HFO proximity sensor 604 extends vertically, such that the upper end surface of the sensor 604 is positioned below the wide support surface 614. FIG. 36 shows the principle of operation of the HFO proximity sensor 604. The HFO proximity sensor 604 includes an oscillation coil 622 and an oscillation circuit 626. If no object 624 (e.g., a metallic connection member 100) is present around the sensor 604, the oscillation circuit takes a normal oscillation state. On the other hand, if an object 624 approaches the sensor 604, the magnetic-force lines generated by the oscillation coil 622 cause the object 624 to produce an eddy current therein, which in turn affects the oscillation coil 622, thereby stopping the oscillation of the oscillation circuit 626. The HFO proximity sensor 604 includes a signal producing circuit (not shown) which produces different signals corresponding to different oscillation states of the oscillation circuit 626. A unit controller 500 can recognize or detect the object 624 or the connection member 100 based on the signals supplied from the HFO proximity sensor 604.

The EC tape 62 is fed while the two end portions 68 of the carrier tape 64 are supported on the two support surfaces 614, 616, respectively. The one end portion 68 having the feed holes 74 is prevented by a pressing roller 170 from moving up off the wide support surface 614. Even in this state, there is left some space between the one end portion 68 and the HFO proximity sensor 604. When a metallic connection member 100 used to connect two EC tapes 62 to provide a connection portion 100 is moved on the wide support surface 614, the connection member 103 is detected by the HFO proximity sensor 604. Thus, the connection portion 103 is detected.

Figure 37:
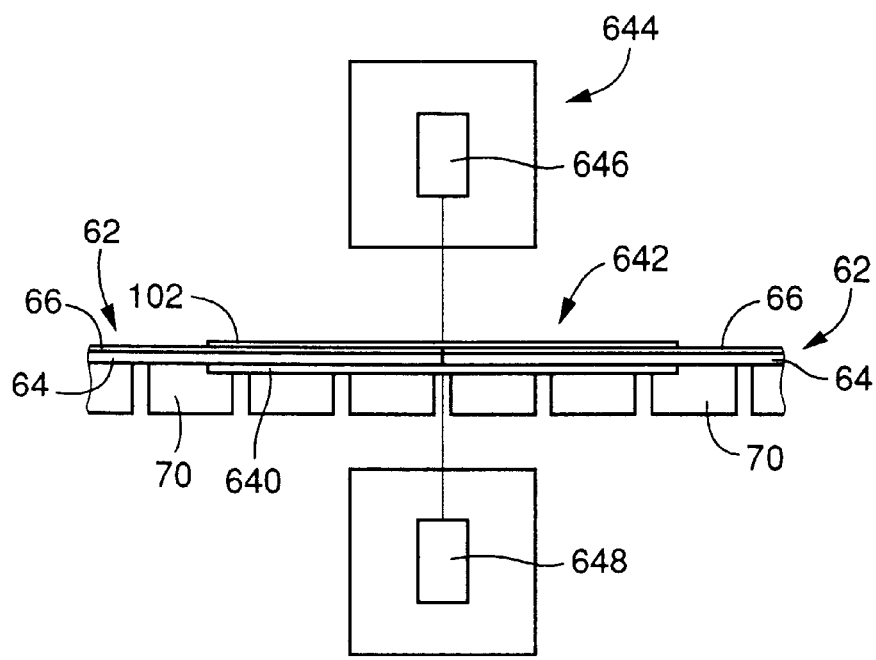
FIG. 37 is a schematic view of a transmission-type photoelectric sensor which is employed in another EC-supply unit as a third embodiment of the present invention.

It is possible to employ a different sort of non-contact sensor than the HFO proximity sensor 604. For example, it is possible to employ an optical detector such as a transmission-type photoelectric sensor, a reflection-type photoelectric sensor, or a color sensor. FIG. 37 shows a transmission-type photoelectric sensor 644.

Like respective TCTs 66 of two EC tapes 62 that are connected to each other with a connection tape 102, respective carrier tapes 64 of the two EC tapes 62 are connected to each other with a connection tape 640 as a sort of connection member that is formed of a synthetic resin. The carrier tapes 64 are formed of a transparent synthetic resin, whereas the connection tape 640 is formed of an opaque synthetic resin. One of opposite major surfaces of the connection tape 640 is coated with a tacky material (or an adhesive material). The respective carrier tapes 64 of the two EC tapes 62 to be connected to each other, and the connection tape 640 are positioned relative to one another, by using a positioning jig, like in the case where two carrier tapes 64 are connected to each other with the connection member 100. More specifically described, the connection tape 640 has a plurality of feed holes (not shown) at the same pitch as that at which each carrier tape 64 has the feed holes 74 and, after the two carrier tapes 64 are positioned relative to each other, the connection tape 640 is adhered to the two carrier tapes 64 such that the 5 feed holes of the connection tape 640 are aligned with those 74 of the carrier tapes 64. Thus, the two connection tapes 640, 102 cooperate with the terminal end portion of the current EC tape 62 and the initial end portion of the new EC tape 62 to provide a connection portion 642.

The transmission-type photoelectric ("TPE") sensor 644 includes a light emitting element 646 as a light emitter, and a light receiving element 648 as a light receiver, and is supported by a frame 40 of an EC-supply unit such that the two elements 646, 648 are located on both sides of a path of feeding of each EC tape 62, i.e., above and below the path, i.e., on both sides of each EC tape 62 as seen in the direction of thickness thereof. The two elements 646, 648 are located, in the widthwise direction of the EC-supply unit, at respective positions corresponding to one of two end portions 68 of each carrier tape 64 that has feed holes 74. The TPE sensor 644 includes a signal producing circuit (not shown) which produces different signals corresponding to different amounts of light received by the light receiving element 648. An exclusive computer of a unit controller 500 judges, based on the signals supplied from the signal producing circuit of the TPE sensor 644, whether each portion of each carrier tape 64 receiving the light emitted from the light emitting element 646 is the connection portion 642. Thus, the signal producing circuit of the TPE sensor 644 and the exclusive computer of the unit controller 500 cooperate with each other to provide a judging device.

When the remaining portion of each carrier tape 64 other than the connection portion 642 including the connection tape 640 passes through the TPE sensor 644, the light emitted from the light emitting element 646 transmits through the remaining portion of each carrier tape 64, and the light receiving element 648 receives the light. However, when the connection tape 640 passes through the sensor 644, the connection tape 640 prevents the transmission of the light emitted from the light emitting element 646. Thus, the light receiving element 648 receives different amounts of light corresponding to the time when the connection portion 642 passes and the time when the remaining portion of each carrier tape 64 passes. Thus, the unit controller 500 can detect the connection tape 640 and thereby detect the connection portion 642.

Figure 38:
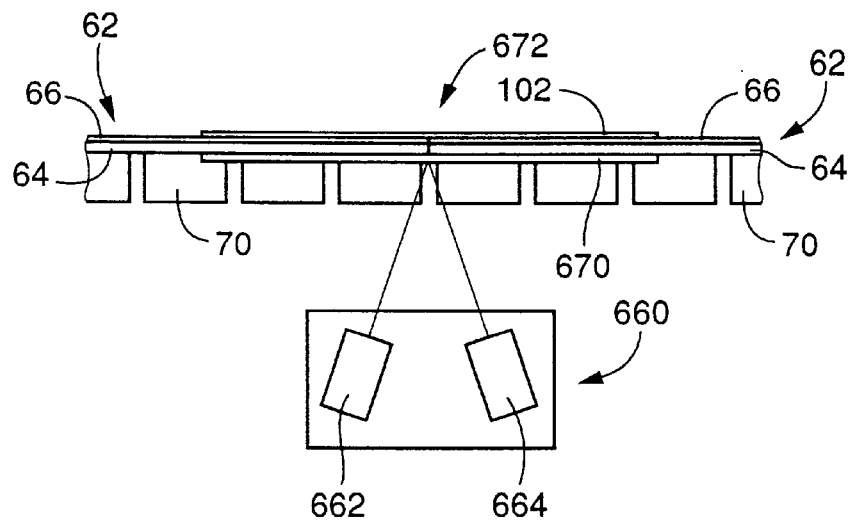
FIG. 38 is a schematic view of a reflection-type photoelectric sensor which is employed in another EC-supply unit as a fourth embodiment of the present invention.

FIG. 38 shows a reflection-type photoelectric ("RPE") sensor 660. The RPE sensor 660 includes a light emitting element 662 and a light receiving element 664. The two elements 662, 664 are supported by a frame 40 of an EC-supply unit, such that the two elements 662, 664 are located on a same side of a path of feeding of each EC tape 62, i.e., above or below the path, i.e., on a same side of each EC tape 62 as seen in the direction of thickness thereof. In the present embodiment, the two elements 662, 664 are located below the path. In addition, the two elements 662, 664 are located, in the widthwise direction of the EC-supply unit, at respective positions corresponding to one of two end portions 68 of each carrier tape 64 that has feed holes 74. The RPE sensor 660 includes a signal producing circuit (not shown) which produces different signals corresponding to different amounts of light received by the light receiving element 664. An exclusive computer of a unit controller 500 judges, based on the signals supplied from the signal producing circuit of the RPE sensor 660, whether each portion of each carrier tape 64 receiving the light emitted from the light emitting element 662 is the connection portion 642. Thus, the signal producing circuit of the RPE sensor 660 and the exclusive computer of the unit controller 500 cooperate with each other to provide a judging device.

Like respective TCTs 66 of two EC tapes 62 that are connected to each other with a connection tape 102, respective carrier tapes 64 of the two EC tapes 64 are connected to each other with a connection tape 670 as a sort of connection member that is formed of a synthetic resin. Thus, the two connection tapes 670, 102 cooperate with the terminal end portion of the current EC tape 62 and the initial end portion of the new EC tape 62 to provide a connection portion 672. The carrier tapes 64 have a color (e.g., white) which reflects a more amount of light, whereas the connection tape 670 has a color (e.g., black) which reflects a less amount of light. When the remaining portion of each carrier tape 64 other than the connection portion 672 including the connection tape 670 passes through the RPE sensor 660, the light emitted from the light emitting element 662 is reflected by the remaining portion of each carrier tape 64, and the light receiving element 664 receives the light. However, when the connection tape 670 passes through the sensor 660, the connection tape 670 absorbs the light emitted from the light emitting element 662. Thus, the light receiving element 664 receives greatly different amounts of light corresponding to the time when the connection portion 672 passes and the time when the remaining portion of each carrier tape 64 passes. Thus, the unit controller 500 can detect the connection tape 670 and thereby detect the connection portion 672.

Figure 39:
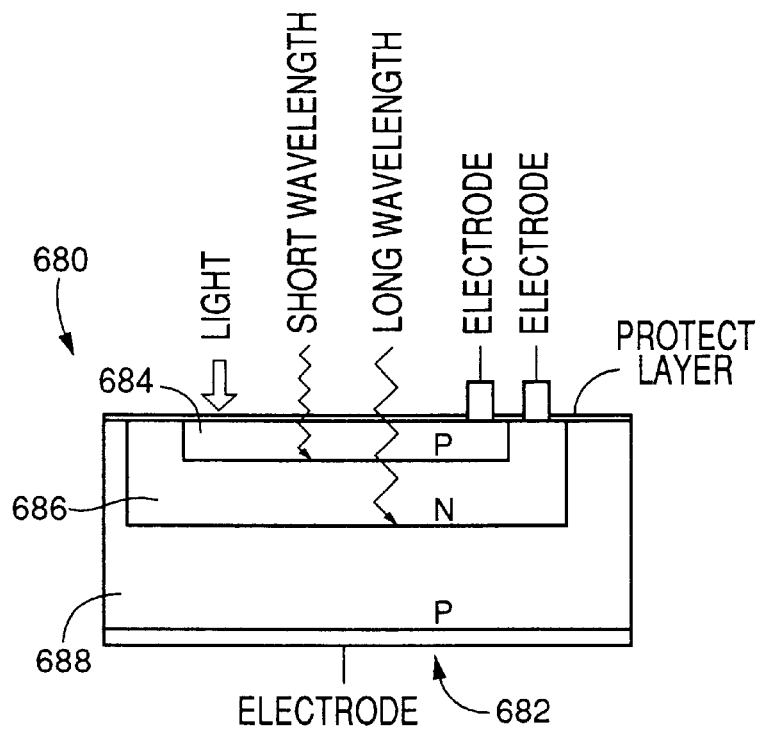
FIG. 39 is a view for illustrating the principle of operation of a color sensor which is employed in another EC-supply unit as a fifth embodiment of the present invention.

FIG. 39 shows the principle of operation of a stacked-semiconductor ("SS") color sensor 680 as a sort of non-contact sensor. The SS color sensor 680 includes a stacked-semiconductor or SS element 682 having three stacked semiconductor layers having different thickness values, and the SS element 682 separates incident light into two components having short and long wavelengths, respectively. More specifically described, the SS element 682 includes two P-N junctions each having a photovoltaic effect, that is, first and second layers 684, 686 cooperate with each other to provide the first P-N junction which measures an intensity of a light having a short wavelength and third and second layers 688, 686 cooperate with each other to provide the second P-N junction which measures an intensity of a light having a long wavelength.

Generally, silicon used as semiconductors transmits a light having a long wavelength and absorbs a light having a short wavelength. Meanwhile, a light having a short wavelength has a great energy. Therefore, while those facts are taken into consideration, the first layer 684 is formed with a thickness of about 500 nm and the second layer 686 is formed with a thickness of about 1,000 nm, so that the first and second layers 684, 686 have a maximum sensitivity wavelength of about 600 nm and the third and second layers 688, 686 have a maximum sensitivity wavelength of about 870 nm. An exclusive computer of a unit controller 500 determines a color based on the ratio of the light intensity measured by the first and second layers 684, 686 to that measured by the third and second layers 688, 686. Thus, so long as a carrier tape 64 and a connection tape having significantly different colors are employed, the exclusive computer of the unit controller 500 can detect the connection tape and thereby detect a connection portion of two EC tapes 62.

The color sensor is not limited to the SS color sensor 680. For example, it is possible to employ, as the color sensor, a photoelectric calorimeter which includes three sorts of optical filters having different spectral sensitivities, and three optical sensors.

Even in the case where the TPE sensor 644, the RPE sensor 660, or the color sensor 680 is used, it is possible to employ a metallic connection member 100 to connect two carrier tapes 64. In this case, the carrier tapes 64 and the connection member 100 are required to have significantly different transmission factors, reflection factors, or colors.

In each of the illustrated embodiments, the two bar-code readers 538 are connected to the two car-side controllers 520, respectively. However, it is possible that a number of bar-code readers 538 be connected to a number of unit controllers 500, respectively.

In each of the illustrated embodiments, the alarm device 532 and the display device 534 are employed in the EC mounting system 16. However, it is possible that each car 34 or each EC-supply unit 32 employ the alarm device 532 and the display device 534.

In each of the illustrated embodiments, each supply reel 76 has the bar code 88 which is directly printed thereon. However, it is possible to adhere a seal on which a bar code 88 is printed, to each supply reel 76.

In each of the illustrated embodiments, each unit controller 500 includes the three exclusive computers for monitoring the connection of two EC tapes 62, controlling the stepper motor 300 (i.e., the feeding of each EC tape 62), and controlling the DC motor 408 (i.e., the feeding of each TCT 66). However, it is possible that each unit controller 500 employ a single computer common to those operations.

It is not essential that each unit controller 500 be associated with the operation panel 502. That is, the panel 502 may be omitted.

In each of the illustrated embodiments, the feeding device (i.e., the EC-tape feeding device 90) which feeds the EC tape 62, 75 includes the motion converting device 302 which includes the cam (i.e., the plate cam 306) and the cam follower (i.e., the bell-crank lever 308) and which converts the rotation of the stepper motor 300 as the rotary drive source into the respective reciprocative pivotal motions of the two pivotable members (280, 282), and the two one-way pivotal-motion transmitting devices (i.e., the ratchet wheel 276 and the ratchet pawls 284, 286) which transmit the respective forward pivotal motions of the two pivotable members to the feed member (i.e., the sprocket 272). However, the EC-tape feeding device is not limited to the illustrated one 90. For example, the feeding device may employ a double-action fluid-pressure-operated cylinder device (e.g., a double-action air-pressure-operated cylinder device) as a sort of reciprocal drive source, and a motion converting device which converts the reciprocative motion of a reciprocative member of the fluid-pressure-operated cylinder device into the respective reciprocative pivotal motions of the two pivotable members. Otherwise, it is possible to pivot, based on a drive force of a drive source which is separate from each EC-supply unit 32, 600, the two pivotable members and thereby cause the feed member to feed each EC tape 62, 75. In each of the latter cases, it may, or may not, employ a cam and a cam follower for controlling the velocity of each of the two pivotable members.

In each of the illustrated embodiments, the EC-tape feeding device 90 includes the two pivotable members 280, 282. However, the EC-tape feeding device 90 may be modified to include only a single pivotable member.

In each of the illustrated embodiments, the TCT feeding device 366 feeds the TCT 66 while peeling the same 66 from the carrier tape 64, and collects the same 66 in the TCT collecting box 368. However, it is possible to treat the TCT 66 peeled from the carrier tape 64, in different manners. For example, it is possible to employ a take-up reel which takes up the peeled TCT 66, or an introduction pipe which introduces the peeled TCT 66 to a TCT collecting space.

In each of the illustrated embodiments, the TCT feeding device 366 also functions as the TCT peeling device. However, it is possible to employ a TCT feeding device and a TCT peeling device which are separate from each other.

In each of the illustrated embodiments, after the EC sucker 22 takes one EC 60 from one embossed portion 70 of each EC tape 62, the EC-supply unit 32, 600 feeding the each EC tape 62 waits for supplying the next EC 60, in the state in which the emptied embossed portion 70 remains at the EC-supply position of the unit 32, 600. However, it is possible that the unit 32, 600 wait for supplying the next EC 60, in the state in which the next EC 60 is fed to, and held at, the EC-supply position of the unit 32, 600. That is, after the EC sucker 22 takes one EC 60 from one embossed portion 70 of each EC tape 62, the each EC tape 60 is immediately fed so that the next EC 60 is moved to, and kept at, the EC-supply position of the unit 32, 600.

It is to be understood that the present invention may be embodied with other changes, improvements, and modifications that may occur to one skilled in the art without departing from the scope and spirit of the invention defined in the appended claims.

What is claimed is:

1. An apparatus (32, 600) for feeding a plurality of electric-component tapes (62) each of which includes a carrier tape (64) and holds a plurality of electric components (60) in a lengthwise direction of the carrier tape, and supplying, from said each electric-component tape, the electric components, one by one, to an object device (22), the apparatus comprising:

a feeding device (90) which feeds a first electric-component tape (62) in a lengthwise direction thereof, and a connection-portion detecting device (150, 170, 174/604) which detects a connection portion where a terminal end portion (96) of the first electric-component tape being fed by the feeding device is connected to an initial end portion (98) of a second electric-component tape (62), wherein the connection-portion detecting device comprises a metal detector (150/604) which detects a metallic connection member (100) which connects the terminal end portion of the first electric-component tape and the initial end portion of the second electric-component tape to each other.

2. The apparatus according to claim 1, further comprising a frame (40) including a guide (140) which guides the movement of each of the first and second electric-component tapes in the lengthwise direction thereof, wherein the connection-portion detecting device is supported by the frame in vicinity of a path of movement of said each electric-component tape.

3. The apparatus according to claim 1, wherein the metal detector (150) comprises:

a pair of electrodes (166) which are distant from each other on a locus of movement of the metallic connection member when the two electric-component tapes connected to each other are fed in the lengthwise direction thereof, and which are electrically connected to each other by the metallic connection member; and a connection detecting circuit (168) which electrically detects that the two electrodes are connected to each other by the metallic connection member.

4. The apparatus according to claim 3, wherein the connection-portion detecting device further comprises a pressing member (170) which presses the metallic connection member against the two electrodes.

5. The apparatus according to claim 4, wherein the pressing member comprises a pressing roller (170) which is movable toward, and away from, the metallic connection member, and which is rotatable about an axis line intersecting a direction of feeding of the two electric-component tapes connected to each other.

6. The apparatus according to claim 4, wherein the connection-portion detecting device further comprises a biasing device (174) which biases the pressing member in a direction in which the pressing member is moved toward the two electrodes.

7. The apparatus according to claim 1, wherein the metal detector comprises a non-contact sensor (604) which detects the metallic connection member, without contacting the connection member.

8. The apparatus according to claim 1, wherein the non-contact sensor comprises an induction proximity sensor (604).

9. An apparatus (32, 600) for feeding a plurality of electric-component tapes (62) each of which includes a carrier tape (64) and holds a plurality of electric components (60) in a lengthwise direction of the carrier tape, and supplying, from said each electric-component tape, the electric components, one by one, to an object device (22), the apparatus comprising:

a feeding device (90) which feeds a first electric-component tape (62) in a lengthwise direction thereof, a connection-portion detecting device (150, 170, 174/604/ 644/660/680) which detects a connection portion where a terminal end portion (96) of the first electric-component tape being fed by the feeding device is connected to an initial end portion (98) of a second electric-component tape (62);

an input device (538) which inputs identification information identifying the second electric-component tape; and a connection-relating-input judging device (500, S1–S8) which is connected to the input device and which judges whether the identification information has been input by the input device in relation with the connection of the first and second electric-component tapes to each other.

10. The apparatus according to claim 9, further comprising a tape-connection-relating-information producing device (532, 534, 500, S9, S10) which produces first information when the second electric-component tape is appropriate, and second information when the second tape is not appropriate.

11. The apparatus according to claim 10, wherein the tape-connection-relating-information producing device comprises an inappropriate-tape-connection-information producing device (500, S9, S10) which is connected to the input device and which compares, in response to the detection of the connection portion by the connection-portion detecting device, the identification information input by the input device, with reference identification information and, when the input identification information is not identical with the reference identification information, producing, as the second information, inappropriate-tape-connection information indicating that the input identification information is not identical with the reference identification information.

12. The apparatus according to claim 11, wherein the tape-connection-relating-information producing device further comprises an inappropriate-tape-connection informing device (532, 534) which informs, based the inappropriate-tape-connection information, an operator of at least a fact that the second electric-component tape is not appropriate.

13. The apparatus according to claim 9, wherein the connection-relating-input judging device comprises a connection-detection-responding-input judging device (500, S1–S4) which is connected to the input device and which judges, in response to the detection of the connection portion by the connection-portion detecting device, whether the identification information has been input by the input device.

14. The apparatus according to claim 9, further comprising a non-input informing device (532, 534) which informs, when the connection-relating-input judging device judges that the identification information has not been input by the input device, an operator of a fact that the identification information has not been input by the input device.

15. The apparatus according to claim 9, wherein the input device comprises a bar-code reader (538) which reads in a bar code as the identification information identifying the second electric-component tape.

16. The apparatus according to claim 9, wherein the connection-relating-input judging device (500, S1–S8) comprises:

a timer (500, S2, S6) which measures a first time when the identification information is input by the input device (538); and a judger (500, S1, S3, S4, S7) which judges, based on the first time measured by the timer, whether the identification information has been input by the input device in relation with the connection of the first and second electric-component tapes to each other.

17. The apparatus according to claim 16, wherein the timer (500, S6) additionally measures a second time when the connection-portion detecting device (150) detects the connection portion, and wherein the judger (500, S7) determines a time difference between the first time and the second time, and judges, if the determined time difference is smaller than a reference time difference, that the identification information has been input by the input device (538) in relation with the connection of the first and second electric-component tapes to each other.

18. The apparatus according to claim 16, wherein the judger judges, if a number of electric components supplied after the first time when the identification information is input and before a second time when the connection portion is detected is smaller than a reference number, that the identification information has been input by the input device (538) in relation with the connection of the first and second electric-component tapes to each other.

19. An apparatus (32, 600) for feeding a plurality of electric-component tapes (62) each of which includes a carrier tape (64) and holds a plurality of electric components (60) in a lengthwise direction of the carrier tape, and supplying, from said each electric-component tape, the electric components, one by one, to an object device (22), the apparatus comprising:

a feeding device (90) which feeds a first electric-component tape (62) in a lengthwise direction thereof;

a connection-portion detecting device (150, 170, 174/604/ 644/660/680) which detects a connection portion where a terminal end portion (96) of the first electric-component tape being fed by the feeding device is connected to an initial end portion (98) of a second electric-component tape (62); and an electric-component counter (512) which counts a number of electric components supplied by the apparatus after the connection-portion detecting device detects the connection portion.

20. The apparatus according to claim 19, further comprising:

an initial-amount obtaining device (500, S12) which obtains, as an initial amount, an initial number of the electric components which are initially present on the second electric-component tape connected to the first electric-component tape; and a remaining-amount obtaining device (500, S13, S14) which cooperates with the electric-component counter and the initial-amount obtaining device to obtain, as a remaining amount, a current number of the electric components which are currently present on the second electric-component tape.

21. The apparatus according to claim 20, wherein the initial-amount obtaining device comprises an initial-amount input device (538) for inputting the initial amount.

22. An electric-component supplying system comprising:

a plurality of electric-component supplying units (32/600) each of which comprises an electric-component supplying apparatus (32/600) including a feeding device (90) which feeds a first electric-component tape (62) in a lengthwise direction thereof, and a connection-member detector (150/604/644/660/680) which detects a connection member (100/640/670) which connects a terminal end portion (96) of the first electric-component tape being fed by the feeding device to an initial end portion (98) of a second electric-component tape (62), and a frame (40) including a guide (140) which guides the movement of each of the first and second electric-component tapes in the lengthwise direction thereof, wherein the connection-member detector is supported by the frame in vicinity of a path of movement of said each electric-component tape; and a table (30) which supports the respective frames of the electric-component supplying units, such that each of the respective frames supporting the respective connection-member detectors and attached to the table is detachable from the table, and such that respective electric-component-supply positions of the supplying units are arranged along a reference line on the table.

23. An apparatus (32, 600) for feeding a plurality of electric-component tapes (62) each of which includes a carrier tape (64) and holds a plurality of electric components (60) in a lengthwise direction of the carrier tape, and supplying, from said each electric-component tape, the electric components, one by one, to an object device (22), the apparatus comprising:

a feeding device (90) which feeds a first electric-component tape (62) in a lengthwise direction thereof; and a connection-member detector (150/604/644/660/680) which detects a connection member (100/640/670) which connects a terminal end portion (96) of the first electric-component tape being fed by the feeding device to an initial end portion (98) of a second electric-component tape (62).

24. The apparatus according to claim 23, wherein the connection-member detector comprises an optical detector (644/660/680) which detects the connection member (640/ 670), based on a difference between an optical characteristic of the connection member and an optical characteristic of the terminal and initial end portions of the first and second electric-component tapes.

25. The apparatus according to claim 24, wherein the optical detector (644/660) comprises:

a light emitter (646/662) which emits a light toward a portion of the connected electric-component tapes connected by the connection member;

a light receiver (648/664) which receives the light which has been emitted by the light emitter and optically affected by said portion of the connected electric-component tapes; and a judging device (500) which judges, based on a change of the light received by the light receiver from the light emitted by the light emitter, whether said portion of the connected electric-component tapes is the connection member.

26. An apparatus (32, 600) for feeding a plurality of electric-component tapes (62) each of which includes a carrier tape (64) and holds a plurality of electric components (60) in a lengthwise direction of the carrier tape, and supplying, from said each electric-component tape, the electric components, one by one, to an object device (22), the carrier tape having a plurality of feed holes (74) at a predetermined pitch in a lengthwise direction thereof, the apparatus comprising:

a feeding device (90) which has an engaging portion (272, 274) that engages the feed holes of the carrier tape of each of a first electric-component tape and a second electric-component tape of said plurality of electric-component tapes (62) and feeds said each of the first electric-component tape and the second electric-component tape in the lengthwise direction thereof; and a connection-member detector (150, 170, 174) which detects a connection member (100) which connects a terminal end portion (96) of the first electric-component tape and an initial end portion (98) of the second electric-component tape to each other, the connection member having at least two feed holes (106) corresponding to at least one of the feed holes of the carrier tape of the first electric-component tape and at least one of the feed holes of the carrier tape of the second electric-component tape, so that the connection member does not interfere with the engaging portion of the feeding device.

* * * * *